US012716913B2

(12) United States Patent
Adams et al.

(10) Patent No.: US 12,716,913 B2
(45) Date of Patent: Aug. 25, 2026

(54) LOW PROFILE ELECTRONIC TESTING SYSTEM WITH FLEXIBLE TEST PCB FORMAT

(71) Applicant: Modus Test, LLC, Richardson, TX (US)

(72) Inventors: Lynwood Adams, Rockwall, TX (US); Jack Lewis, Richardson, TX (US); Reagan Oliver, Rowlett, TX (US)

(73) Assignee: Modus Test, LLC, Richardson, TX (US)

( * ) Notice: Subject to any disclaimer, the term of this patent is extended or adjusted under 35 U.S.C. 154(b) by 213 days.

(21) Appl. No.: 18/451,962

(22) Filed: Aug. 18, 2023

(65) Prior Publication Data

US 2024/0061015 A1 Feb. 22, 2024

Related U.S. Application Data

(60) Provisional application No. 63/399,866, filed on Aug. 22, 2022.

(51) Int. Cl.
*G01R 1/04* (2006.01)

(52) U.S. Cl.
CPC .................................. *G01R 1/0466* (2013.01)

(58) Field of Classification Search
CPC .................................................... G01R 1/0466
See application file for complete search history.

(56) References Cited

U.S. PATENT DOCUMENTS

| | | | | |
|---|---|---|---|---|
| 5,436,567 | A * | 7/1995 | Wexler | G01R 1/07335 324/755.05 |
| 6,040,691 | A * | 3/2000 | Hanners | G01R 31/31905 324/756.07 |
| 6,350,138 | B1 * | 2/2002 | Atobe | H01R 13/193 439/266 |
| 6,396,291 | B1 * | 5/2002 | Akram | G01R 1/0466 324/750.25 |
| 9,680,471 | B2 | 6/2017 | Stark | |
| 9,885,737 | B2 | 2/2018 | Adams | |
| 10,156,586 | B2 | 12/2018 | Adams | |
| 10,534,017 | B2 | 1/2020 | Adams | |
| 10,705,120 | B2 | 7/2020 | Adams | |
| 11,313,880 | B2 | 4/2022 | Adams | |
| 11,385,277 | B2 | 7/2022 | Adams | |

(Continued)

*Primary Examiner* — Paresh Patel
(74) *Attorney, Agent, or Firm* — Christopher A. Proskey; BrownWinick Law Firm

(57) ABSTRACT

A compact testing system for sockets is presented having a removable and easily replaceable DUT PCB electrically connected with the electrical testing components of the system. The DUT PCB includes a socket to receive a DUT having electrical contacts. In one or more arrangements, the system includes a housing forming a hollow interior and a motherboard. The motherboard has electrical contacts connected to the test circuitry. In one or more arrangements, the system includes a receiver in a top surface of the housing to receive and hold the DUT PCB. When the DUT is held within the socket the DUT is electrically connected to the electrical contacts of the DUT PCB. When the second circuit board is held within the receiver assembly, the DUT PCB is electrically connected with the DUT, thereby electrically connecting the test circuitry with the DUT for testing.

36 Claims, 52 Drawing Sheets

(56) References Cited

U.S. PATENT DOCUMENTS

| | | | | |
|---|---|---|---|---|
| 11,668,731 | B2 | 6/2023 | Adams | |
| 11,674,996 | B2 | 6/2023 | Adams | |
| 2001/0050427 | A1 * | 12/2001 | Inomata | G01R 1/0483 257/697 |
| 2002/0195265 | A1 * | 12/2002 | Miller | G01R 1/0466 174/251 |
| 2005/0026491 | A1 | 2/2005 | Gattuso | |
| 2005/0035754 | A1 | 2/2005 | Ho | |
| 2005/0099763 | A1 | 5/2005 | Rathburn | |
| 2005/0218429 | A1 | 10/2005 | Mazza | |
| 2007/0075726 | A1 | 4/2007 | Chan | |
| 2007/0152694 | A1 * | 7/2007 | Yin | G01R 31/2806 324/763.01 |
| 2007/0229102 | A1 | 10/2007 | Eldridge | |
| 2007/0287304 | A1 | 12/2007 | Eldridge | |
| 2008/0126863 | A1 * | 5/2008 | Co | G11C 29/56 714/E11.169 |
| 2008/0305670 | A1 | 12/2008 | Gattuso | |
| 2009/0102457 | A1 | 4/2009 | Vayner | |
| 2010/0134134 | A1 | 6/2010 | Grover | |
| 2012/0092034 | A1 | 4/2012 | Erdman | |
| 2012/0199985 | A1 | 8/2012 | Rathburn | |
| 2013/0135002 | A1 | 5/2013 | Grover | |
| 2014/0103949 | A1 | 4/2014 | Erdman | |
| 2016/0209443 | A1 | 7/2016 | Adams | |
| 2017/0192046 | A1 | 7/2017 | Adams | |
| 2019/0072585 | A1 | 3/2019 | Adams | |
| 2020/0088787 | A1 | 3/2020 | Ochotorena, Jr. | |
| 2020/0319231 | A1 | 10/2020 | Adams | |
| 2020/0379013 | A1 | 12/2020 | Wang | |
| 2021/0368803 | A1 | 12/2021 | Swamy | |
| 2021/0368806 | A1 | 12/2021 | Rifa | |
| 2021/0368907 | A1 | 12/2021 | Wardlaw | |
| 2023/0296663 | A1 | 9/2023 | Adams | |
| 2023/0341457 | A1 | 10/2023 | Adams | |

* cited by examiner

LOW PROFILE ELECTRONIC TESTING SYSTEM WITH FLEXIBLE TEST PCB FORMAT

CROSS REFERENCE TO RELATED APPLICATIONS

The present application claims priority to U.S. Provisional Patent Application Ser. No. 63/399,866 filed Aug. 22, 2022, and entitled "LOW PROFILE ELECTRONIC TESTING SYSTEM WITH FLEXIBLE TEST PCB FORMAT," and is related to U.S. patent application Ser. No. 16/983,309 filed on Aug. 3, 2020 and entitled "MODULAR ELECTRONIC TESTING SYSTEM WITH FLEXIBLE TEST PCB FORMAT", each which are hereby fully incorporated by reference herein in their entireties.

FIELD OF THE DISCLOSURE

This disclosure relates to a testing system. More specifically and without limitation, this disclosure relates to a testing system for testing devices under test, electrical interconnects, also known as sockets, as well as testing boards, and related methods of use.

OVERVIEW OF THE DISCLOSURE

Semiconductor chips have been developed for a wide variety of purposes. Along with the development of these semiconductor chips, a need developed to test these semiconductor chips to ensure that they are manufactured within specified tolerances and function properly. Many manufacturers of semiconductor chips such as Intel®, AMD®, Xilinx®, Texas Instruments®, NVIDIA®, Qualcomm®, among countless others, manufacture semiconductor chips which are then tested by a chip testing system having a device under test printed circuit board (DUT PCB) with an electrical interconnect, also known as a socket, which is attached thereto. The DUT PCB and electrical interconnects are generally custom made to fit each specific semiconductor chip, making them quite expensive.

Manufacturers tend to simultaneously manufacture a variety of semiconductor chips within their facilities to maximize their overhead and equipment utilization rates. Due to these multiple product lines, manufacturers have a need to test a variety of semiconductor chips at the same time, each type of chip requiring a special electrical interconnect and DUT PCB. Since cleanroom space is extremely limited it is undesirable to have a dedicated testing machine for each type of electrical interconnects and DUT PCB. Conventional semiconductor testing systems are not easily converted between configurations for testing different electrical interconnects. Moreover, conventional semiconductor testing systems are either very large or require manual hand wiring of a DUT PCB with testing electronics.

Therefore, manufacturers of semiconductor chips have a need for a system for testing electrical interconnects, and DUT PCBs, which is capable of testing a variety of electrical interconnects and DUT PCBs. Manufacturers of semiconductor chips also have a need for such a system for devices under test (DUTs), testing electrical interconnects, and DUT PCBs, that quickly and easily converts between testing various electrical interconnects, which are problems not solved by the prior art. Manufacturers of semiconductor chips further have a need for this testing system to be as small as possible to maximize valuable cleanroom space.

Thus, it is a primary object of the disclosure to provide an electronic testing system and method of use that improves upon the state of the art.

Another object of the disclosure is to provide an electronic testing system and method of use that quickly converts between configurations for testing different electrical interconnects and/or DUTs.

Yet another object of the disclosure is to provide an electronic testing system and method of use that easily converts between configurations for testing different electrical interconnects and/or DUTs.

Another object of the disclosure is to provide an electronic testing system and method of use that is easy to use.

Yet another object of the disclosure is to provide an electronic testing system and method of use that provides accurate testing for electrical interconnects and/or DUTs.

Another object of the disclosure is to provide an electronic testing system and method of use that can be used with a wide variety of electrical interconnects and/or DUTs.

Yet another object of the disclosure is to provide an electronic testing system and method of use that is relatively inexpensive.

Another object of the disclosure is to provide an electronic testing system and method of use that has a long useful life.

Yet another object of the disclosure is to provide an electronic testing system and method of use that has a small footprint.

Another object of the disclosure is to provide an electronic testing system and method of use that minimizes the amount of space required to test a variety of electrical interconnects and/or DUTs.

Yet another object of the disclosure is to provide an electronic testing system and method of use that minimizes the capital cost for testing equipment for testing a variety of electrical interconnects and/or DUTs.

Another object of the disclosure is to provide an electronic testing system and method of use that provides for quick removal of and replacement of DUT PCBs having electrical interconnects thereon.

Yet another object of the disclosure is to provide an electronic testing system and method of use that is high quality.

Another object of the disclosure is to provide an electronic testing system and method of use that is durable.

Yet another object of the disclosure is to provide an electronic testing system and method of use that can be used with a wide variety of other testing equipment.

Another object of the disclosure is to provide an electronic testing system and method of use that can be used with any socket and/or DUTs.

These and other objects, features, or advantages of the present disclosure will become apparent from the specification and claims.

SUMMARY OF THE DISCLOSURE

A compact testing system for sockets is presented having a DUT PCB that electrically connects with the electrical testing components of the system. The DUT PCB includes a socket configured to receive and hold a DUT. In one or more arrangements, the system includes a housing forming a hollow interior and a motherboard. The motherboard has test circuitry for testing electrical connections of the DUT and/or the socket. The motherboard has a first set of electrical contacts electrically connected to the test circuitry. In one or more arrangements, the system includes a receiver assembly formed in a top surface of the housing. The receiver assembly is configured to receive and hold the DUT PCB therein. The DUT PCB has a second set of electrical contacts. When the DUT is held within the socket the DUT is electrically connected to the second set of electrical contacts. When the second circuit board is held within the receiver assembly, the second set of electrical contacts are electrically connected with the first set of electrical contacts, thereby electrically connecting the test circuitry with the DUT for testing. In one or more arrangements, the system includes one or more fastener assemblies configured to clamp the DUT PCB within the receiver assembly. In one or more arrangements, the fastener assembly is laterally movable between an inward position and an outward position. In the inward position, the fastener assemblies are positioned over the receiver assembly and DUT PCB, thereby permitting the fastener assemblies to secure the DUT PCB in place. In the outward position, the fastener assemblies are positioned to the side of the receiver assembly thereby permitting DUT PCB to be inserted into or removed from the receiver assembly.

DETAILED DESCRIPTION OF THE DISCLOSURE

Figure 1:
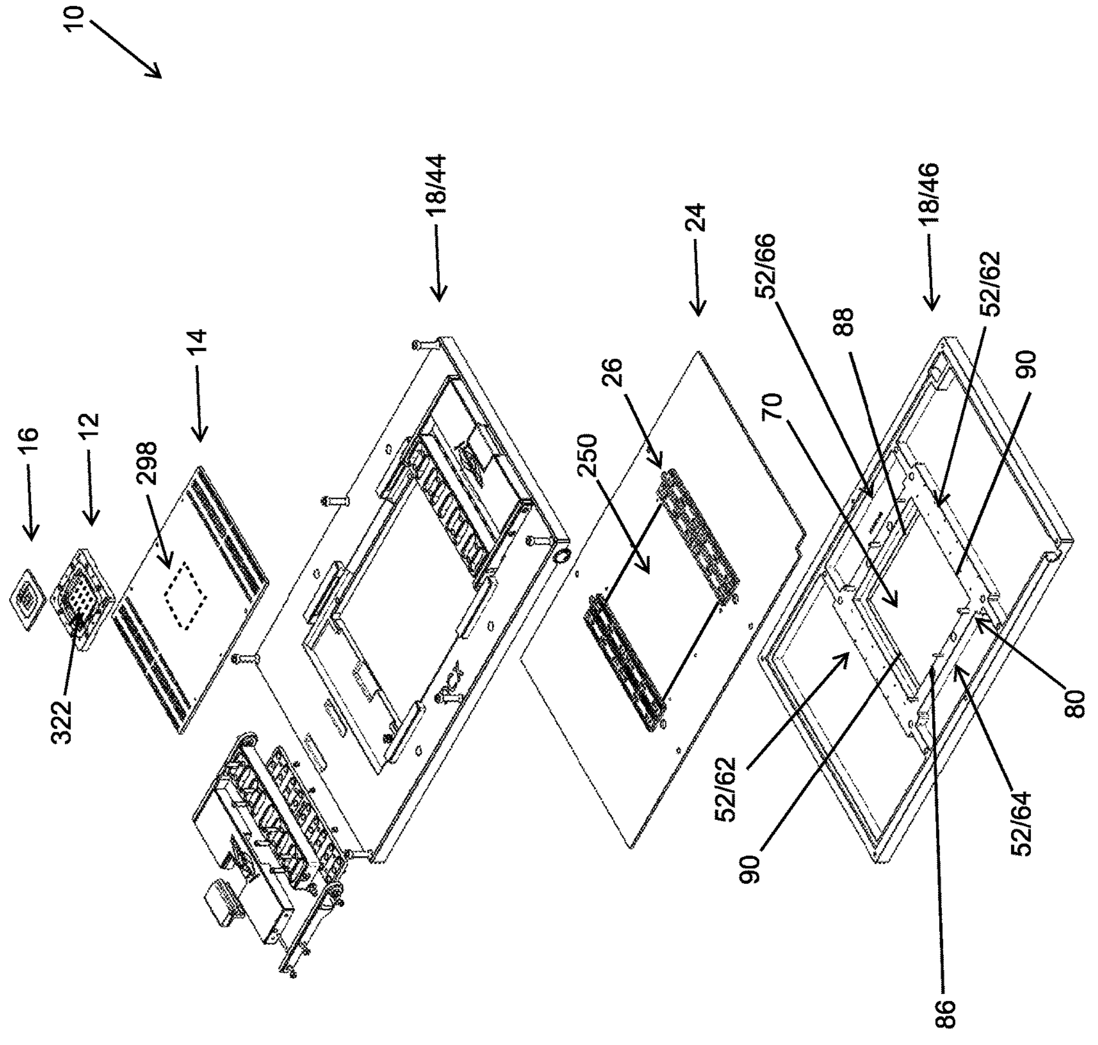
FIG. 1 shows an upper front left side exploded perspective view of a testing system, in accordance with one or more arrangements.
Figure 2:
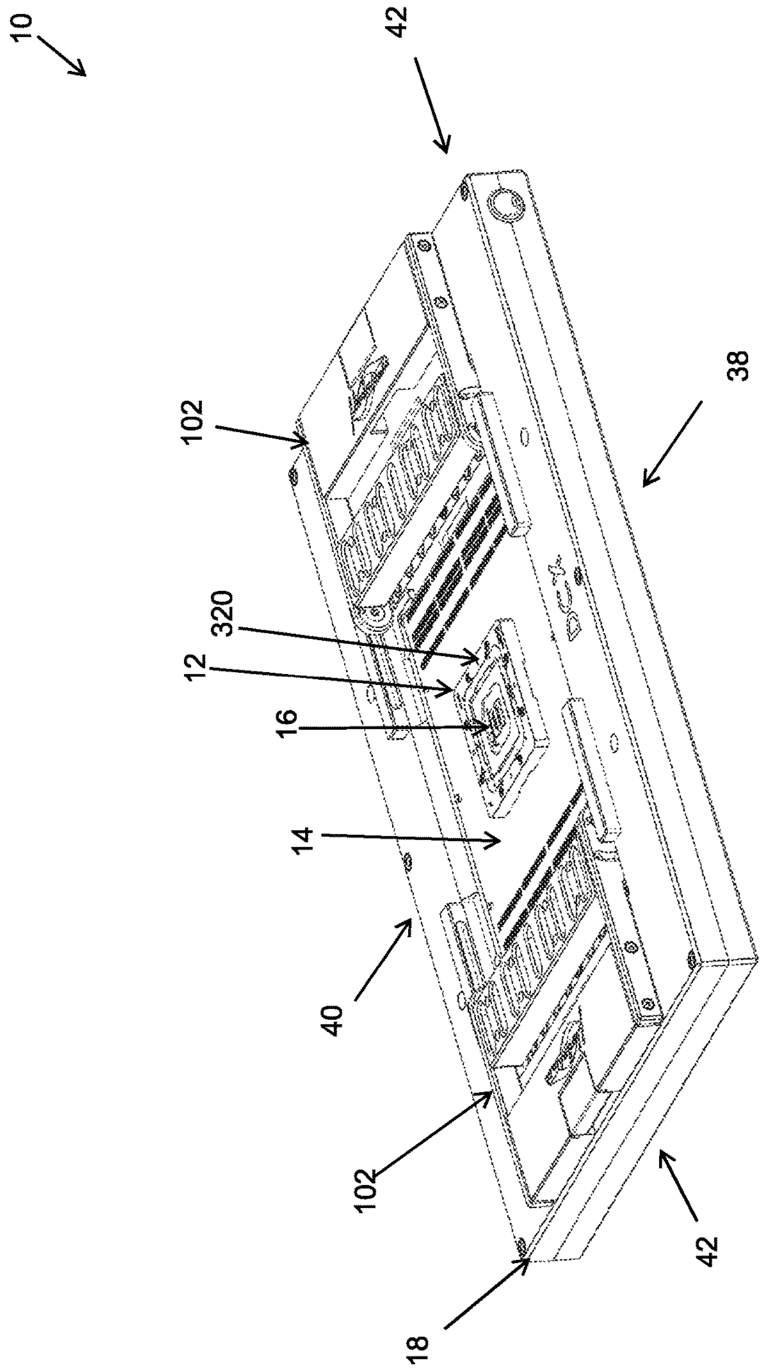
FIG. 2 shows an upper front right side perspective view of a testing system, in accordance with one or more arrangements; the view showing a design under test printed circuit board (DUT PCB) installed in a window of the system; the view showing a design under test (DUT) inserted in a socket of the DUT PCB; the view showing clamps of fastener assemblies in an outward position and handles of the fastener assemblies lowered to a clamped position.
Figure 3:
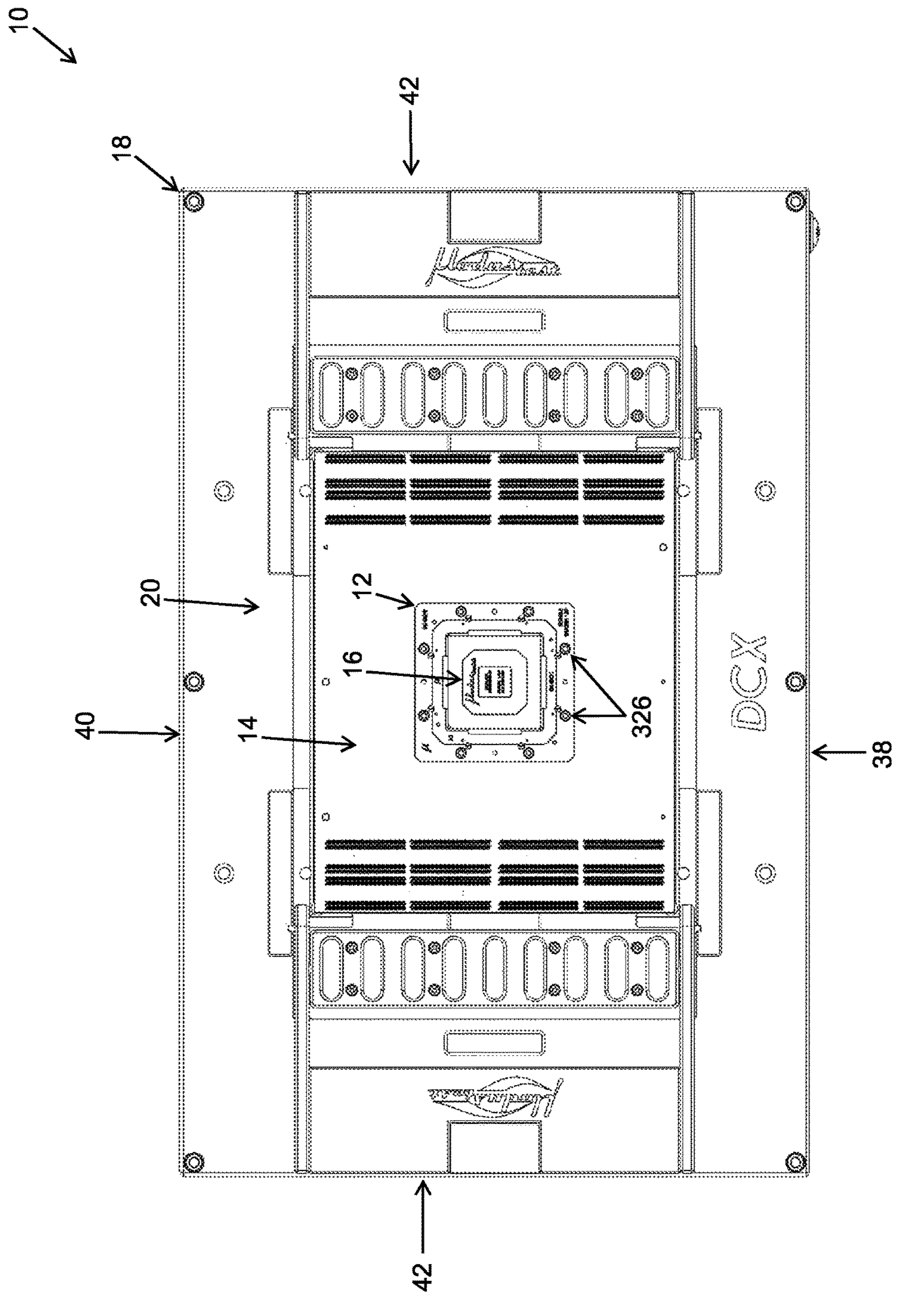
FIG. 3 shows a top view of a testing system, in accordance with one or more arrangements; the view showing a DUT PCB installed in a window of the system and a DUT inserted in a socket of the DUT PCB; the view showing clamps of fastener assemblies in an outward position and handles of the fastener assemblies lowered to a clamped position.
Figure 4:
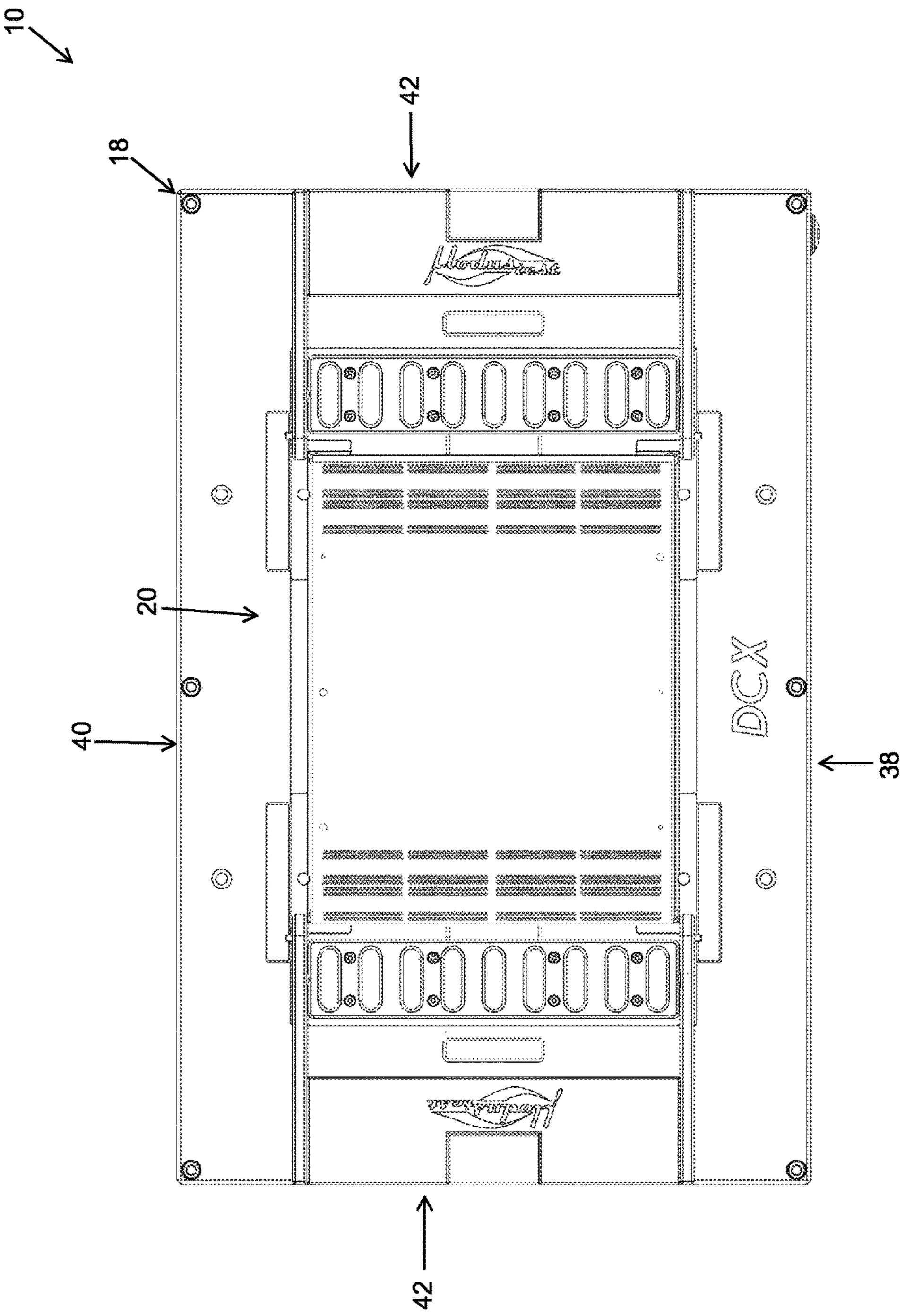
FIG. 4 shows a top view of a testing system, in accordance with one or more arrangements; the view showing the DUT PCB and DUT omitted; the view showing clamps of fastener assemblies in an outward position and handles of the fastener assemblies lowered to a clamped position.
Figure 5:
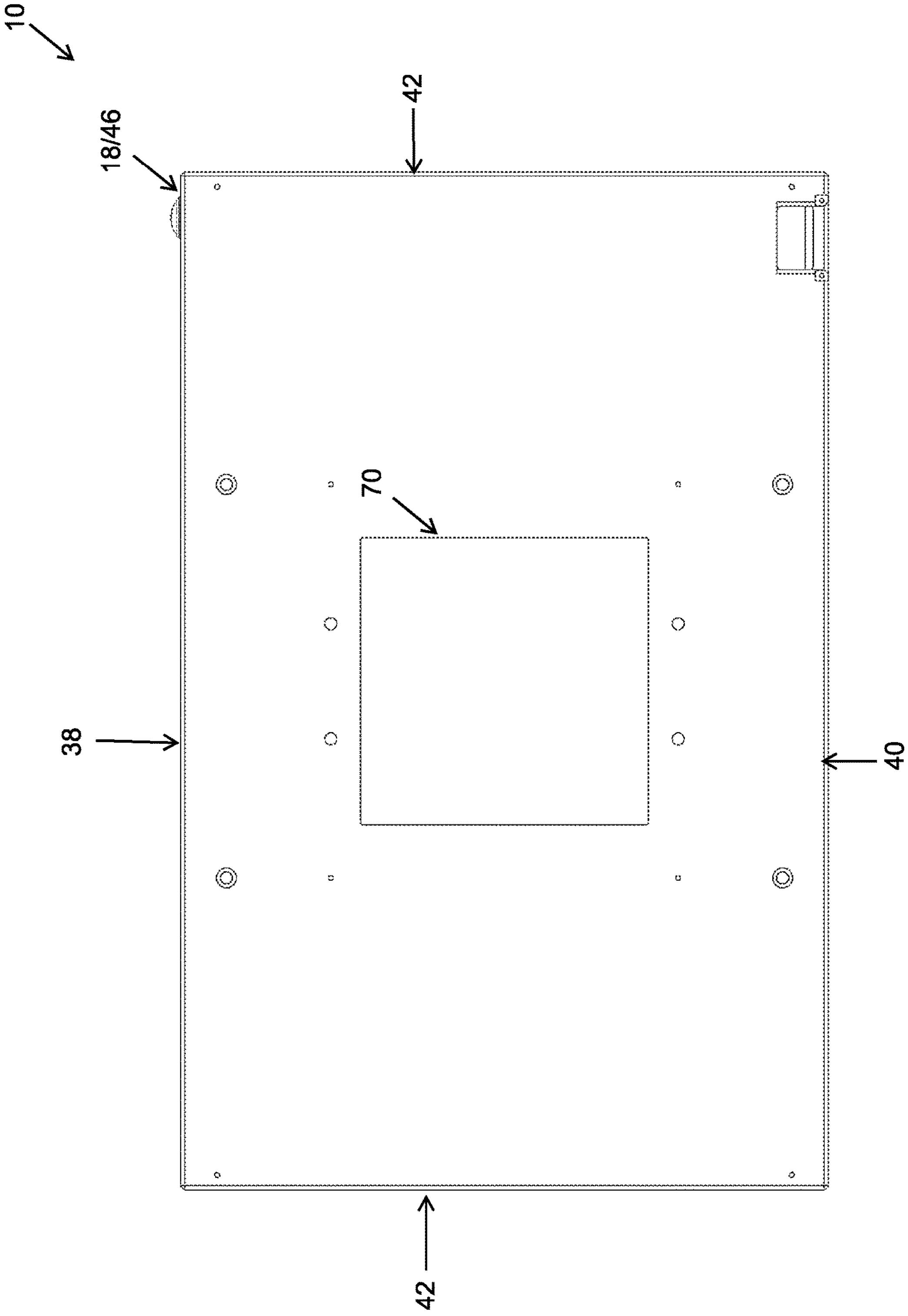
FIG. 5 shows a bottom view of a testing system, in accordance with one or more arrangements.
Figure 6:
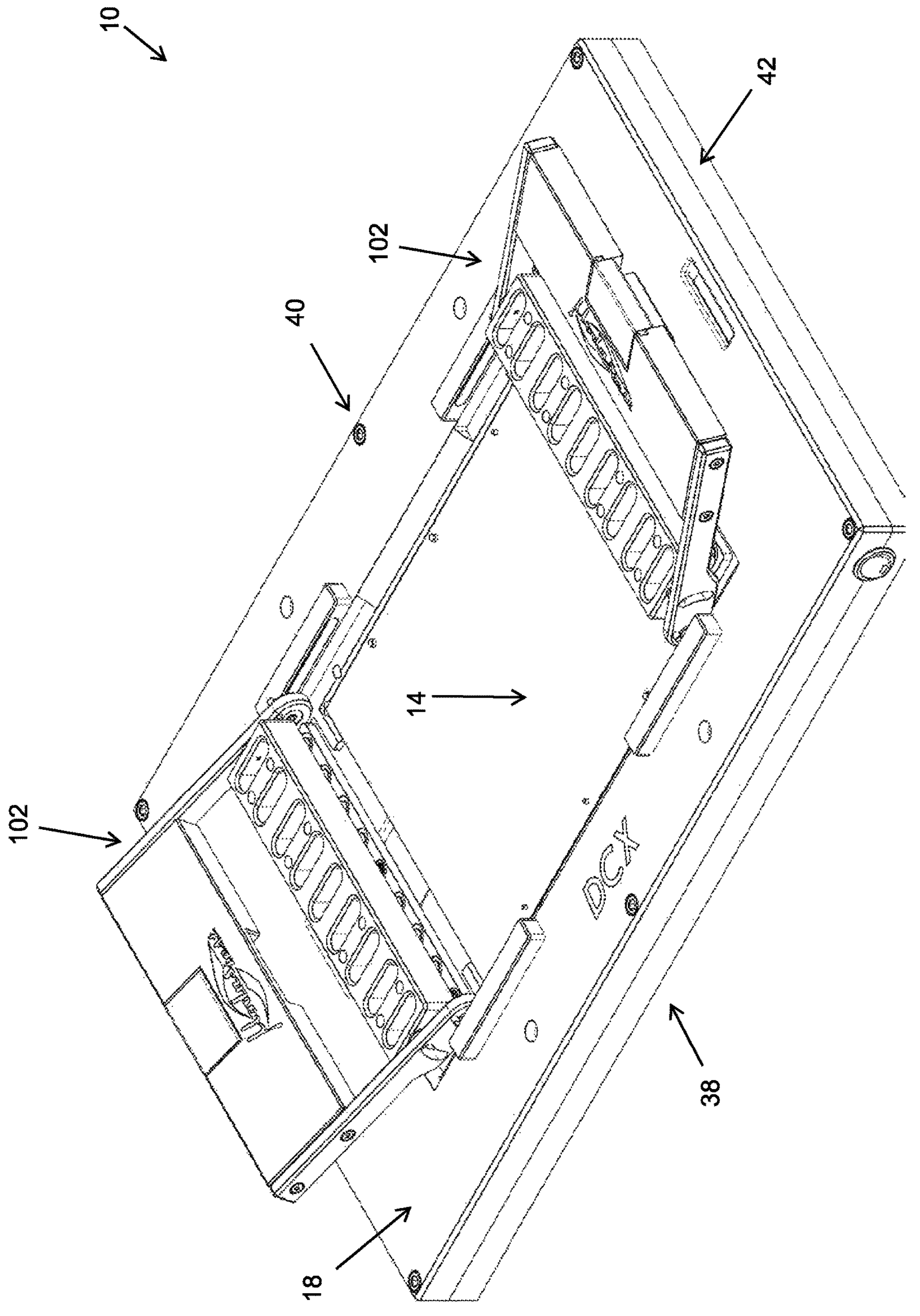
FIG. 6 shows an upper front left side perspective view of a testing system, in accordance with one or more arrangements; the view showing clamps of fastener assemblies in an outward position and handles of the fastener assemblies raised to an unclamped position.
Figure 7:
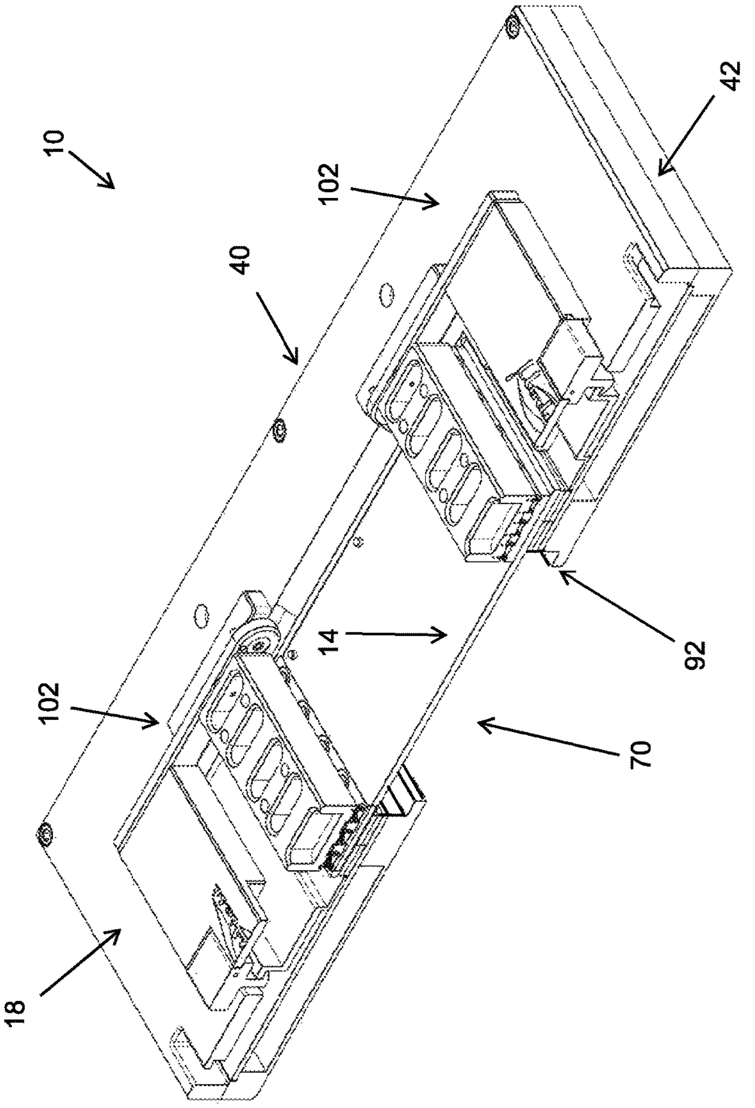
FIG. 7 shows a cross section of an upper front left side perspective view of a testing system, in accordance with one or more arrangements; the view showing clamps of fastener assemblies moved to an inward position; the view showing handles of the fastener assemblies lowered to a clamped position.
Figure 8:
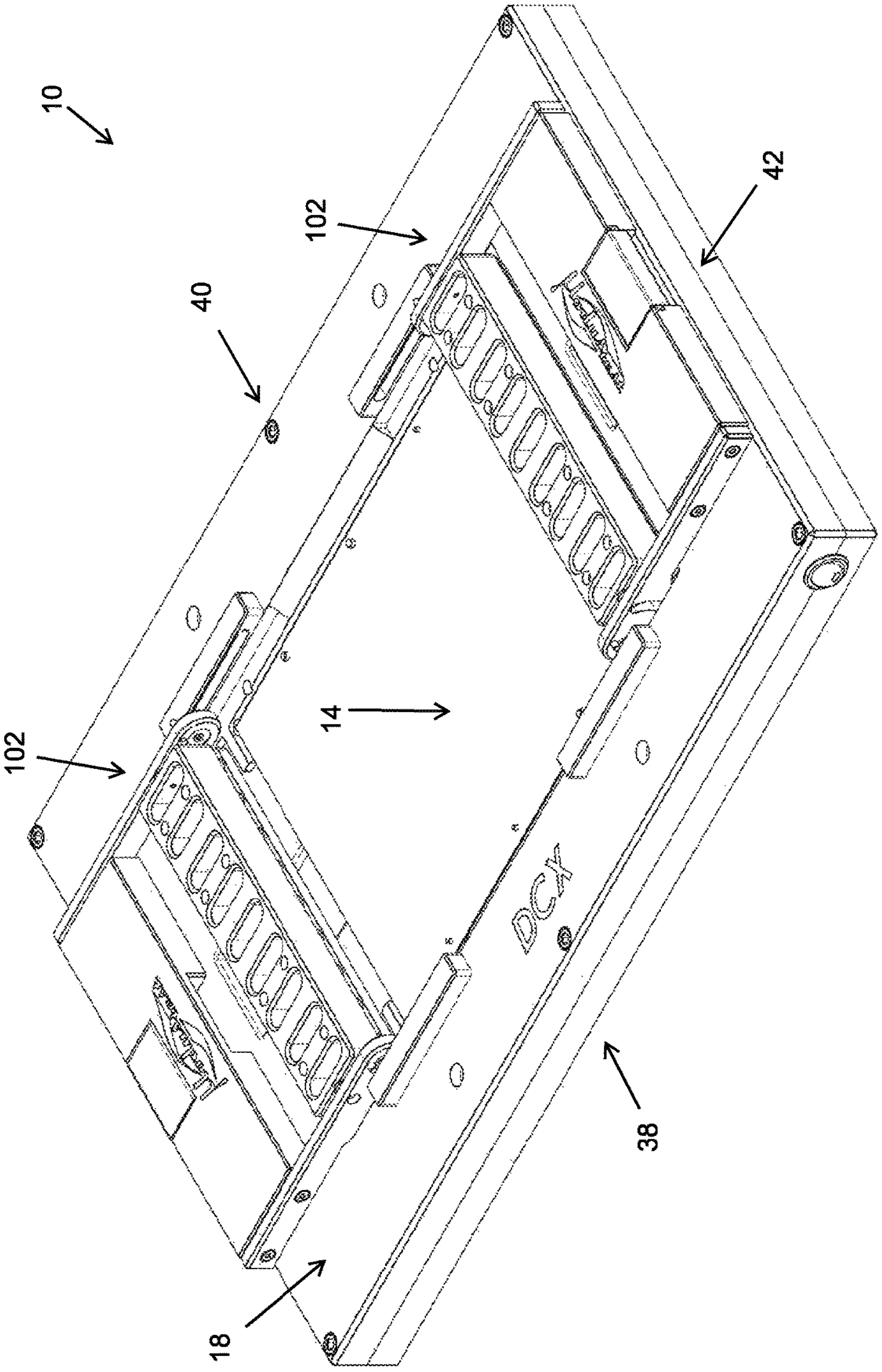
FIG. 8 shows an upper front left side perspective view of a testing system, in accordance with one or more arrangements; the view showing clamps of fastener assemblies in an outward position and handles of the fastener assemblies lowered to a clamped position.
Figure 9:
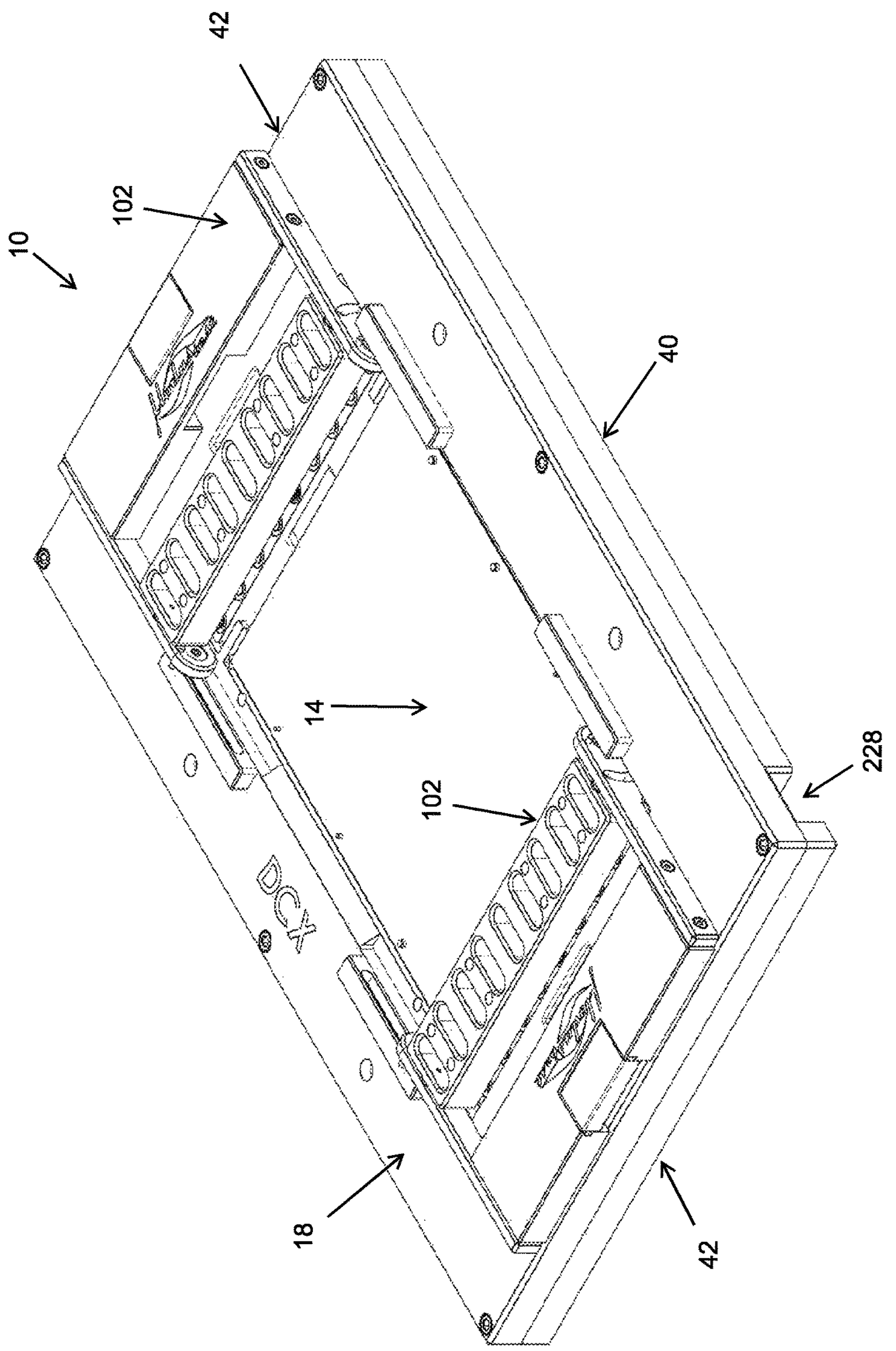
FIG. 9 shows an upper front right side perspective view of a testing system, in accordance with one or more arrangements; the view showing clamps of fastener assemblies in an outward position and handles of the fastener assemblies lowered to a clamped position.
Figure 10:
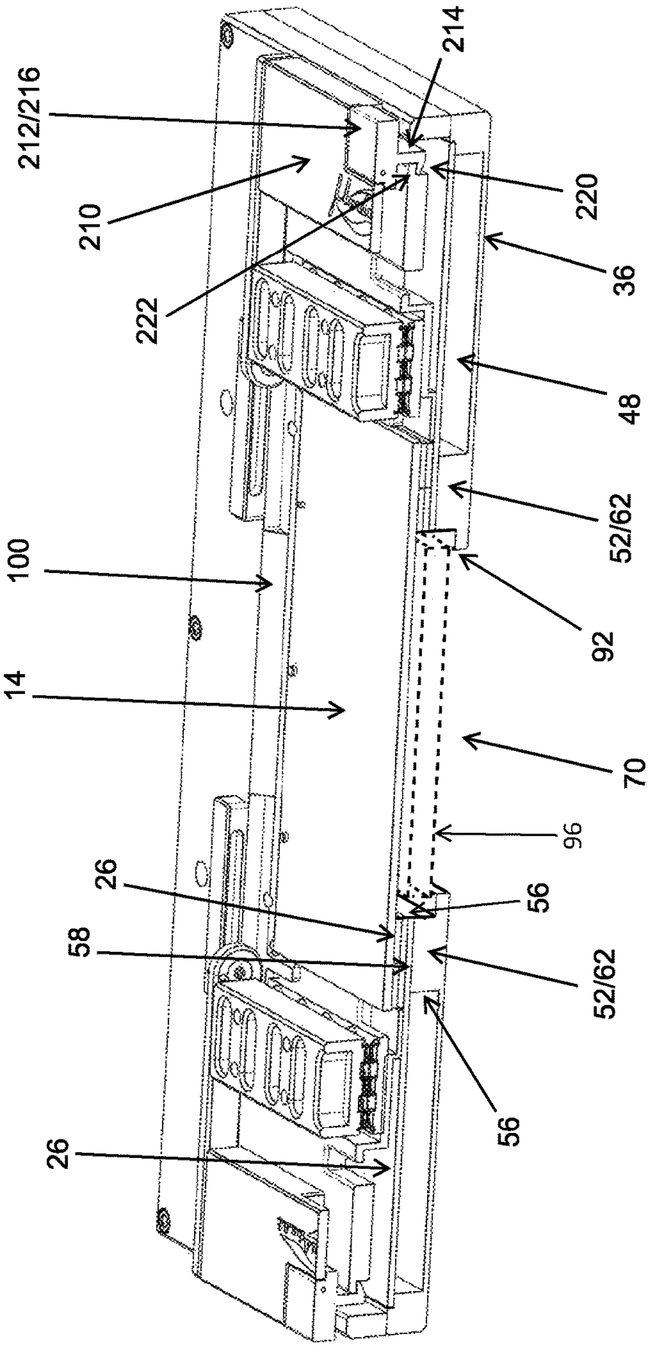
FIG. 10 shows a cross section of a front perspective view of a testing system, in accordance with one or more arrangements; the view showing clamps of fastener assemblies moved to an outward position; the view showing handles of the fastener assemblies lowered to a clamped position.
Figure 11:
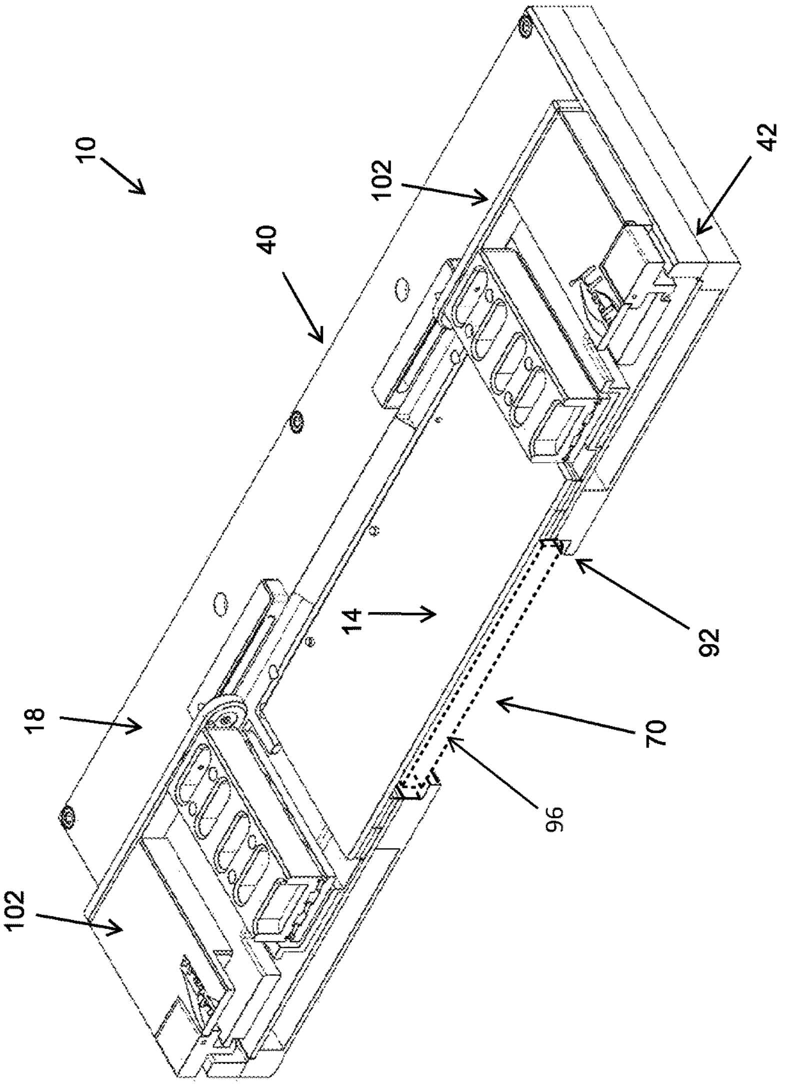
FIG. 11 shows a cross section of an upper front left side perspective view of a testing system, in accordance with one or more arrangements; the view showing clamps of fastener assemblies moved to an outward position; the view showing handles of the fastener assemblies lowered to a clamped position.
Figure 12:
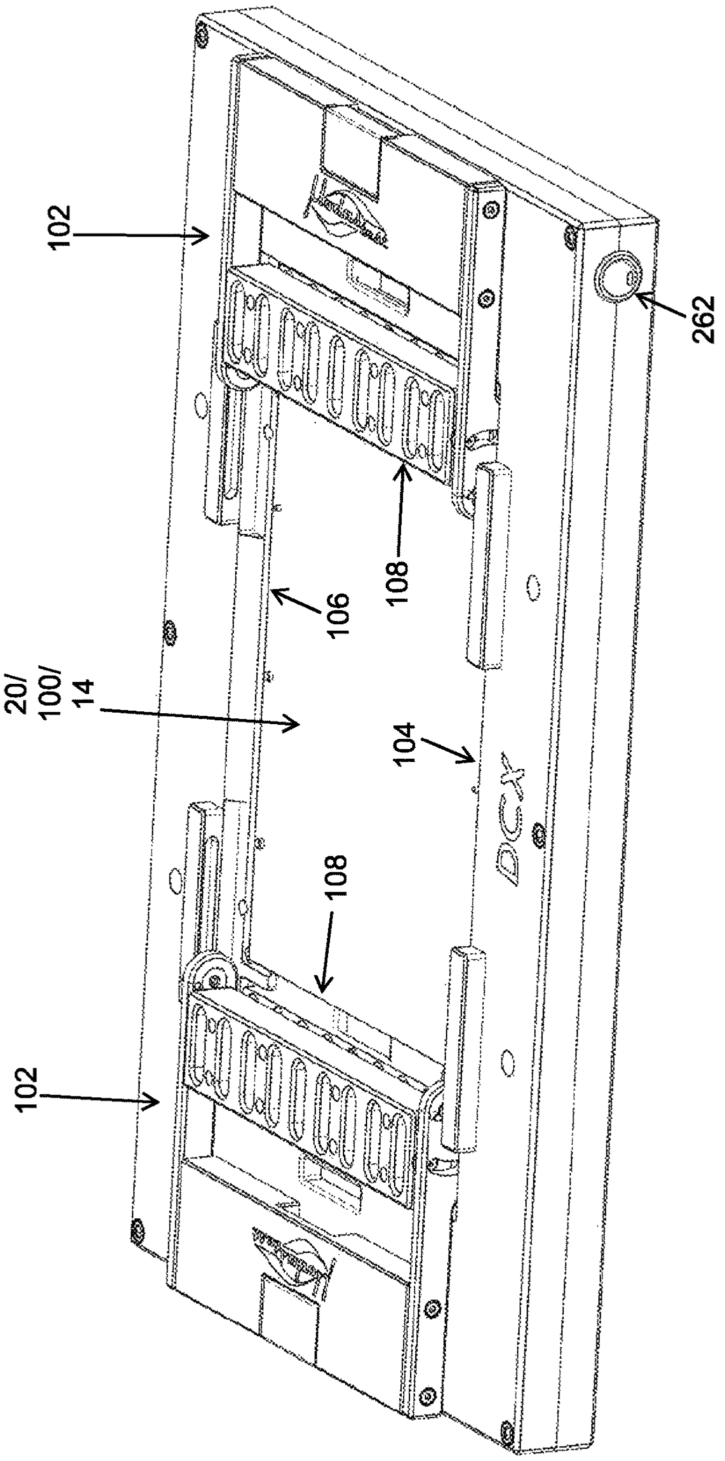
FIG. 12 shows an upper front perspective view of a testing system, in accordance with one or more arrangements; the view showing clamps of fastener assemblies moved to an outward position; the view showing handles of the fastener assemblies lowered to a clamped position.
Figure 13:
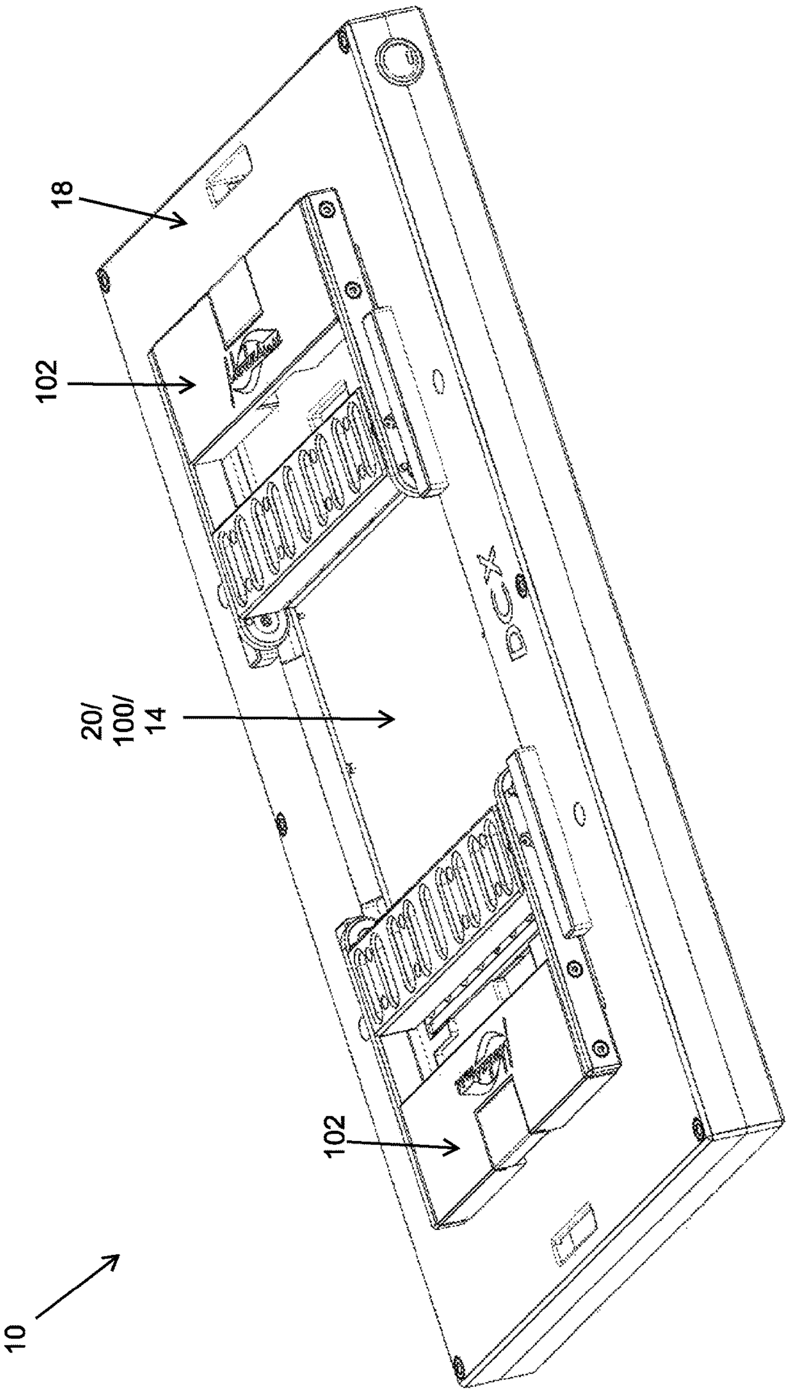
FIG. 13 shows an upper front right side perspective view of a testing system, in accordance with one or more arrangements; the view showing clamps of fastener assemblies moved to an inward position; the view showing handles of the fastener assemblies lowered to a clamped position.
Figure 14:
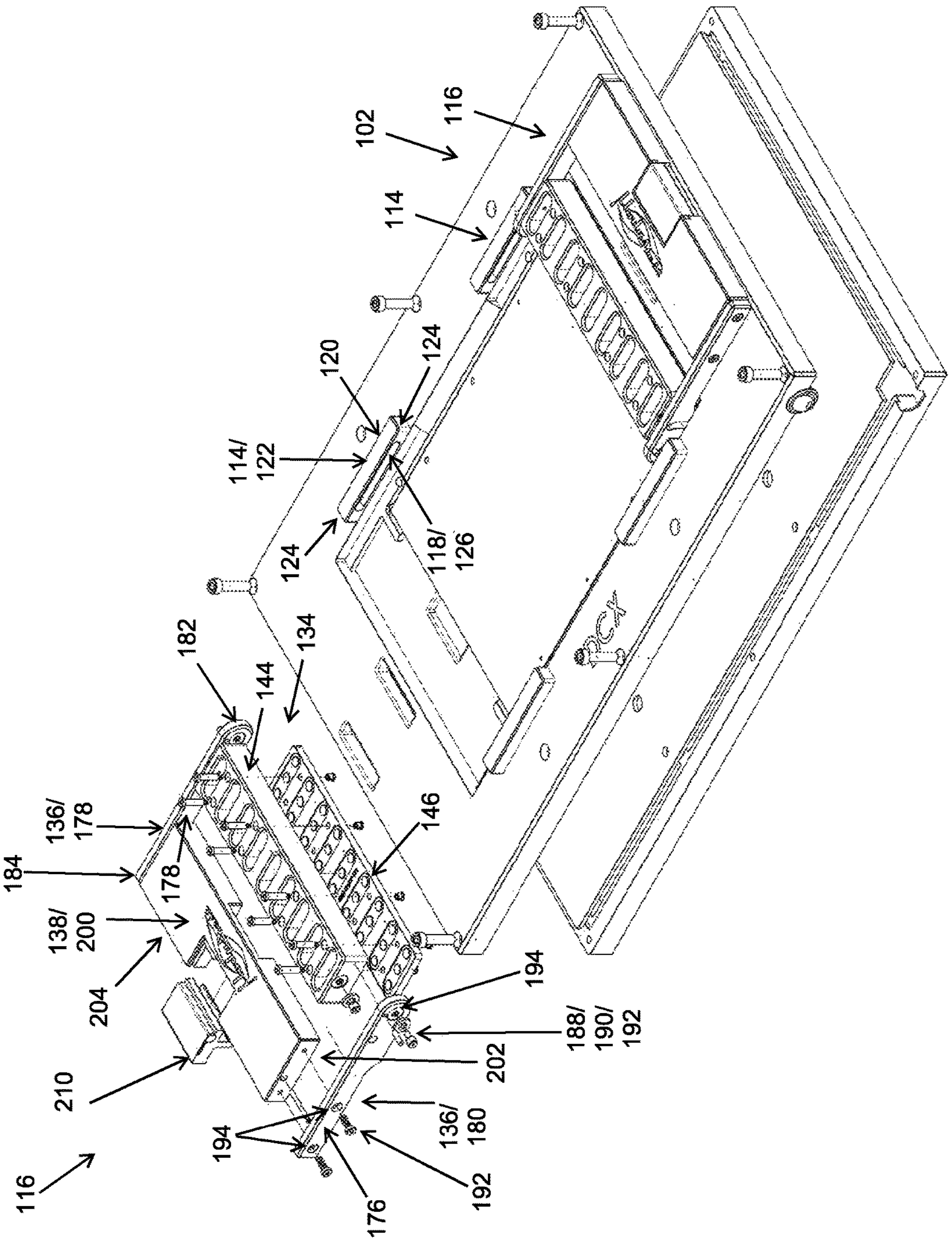
FIG. 14 shows an upper front left side exploded perspective view of a testing system, in accordance with one or more arrangements; the view showing an exploded view of a fastener assembly on a right side of system.
Figure 15:
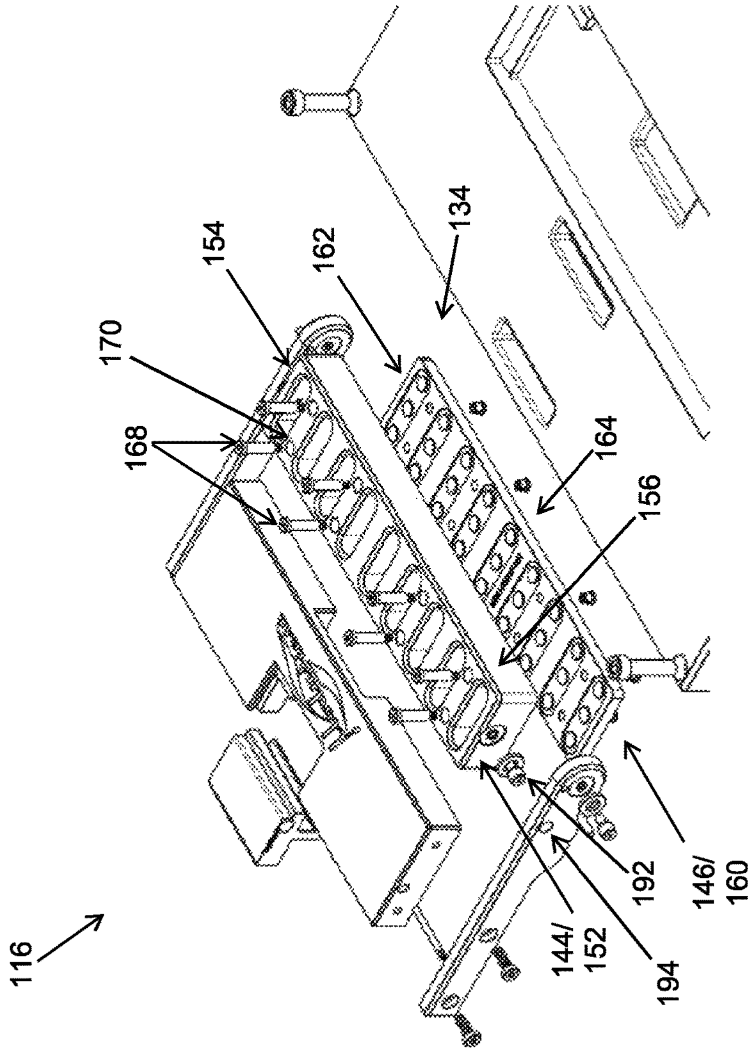
FIG. 15 shows a partial close up upper front left side exploded perspective view of a fastener assembly of a testing system, in accordance with one or more arrangements.
Figure 16:
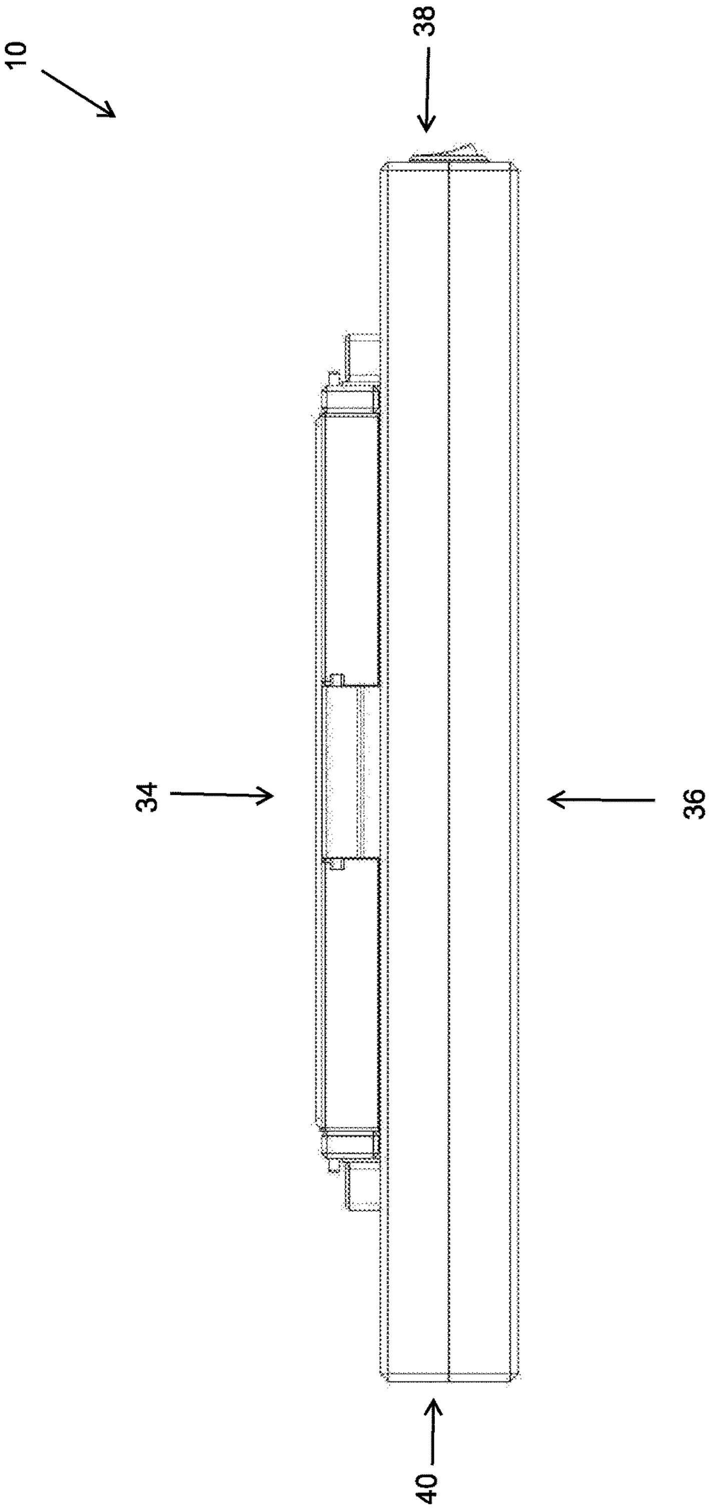
FIG. 16 shows a right side view of a testing system, in accordance with one or more arrangements.
Figure 17:
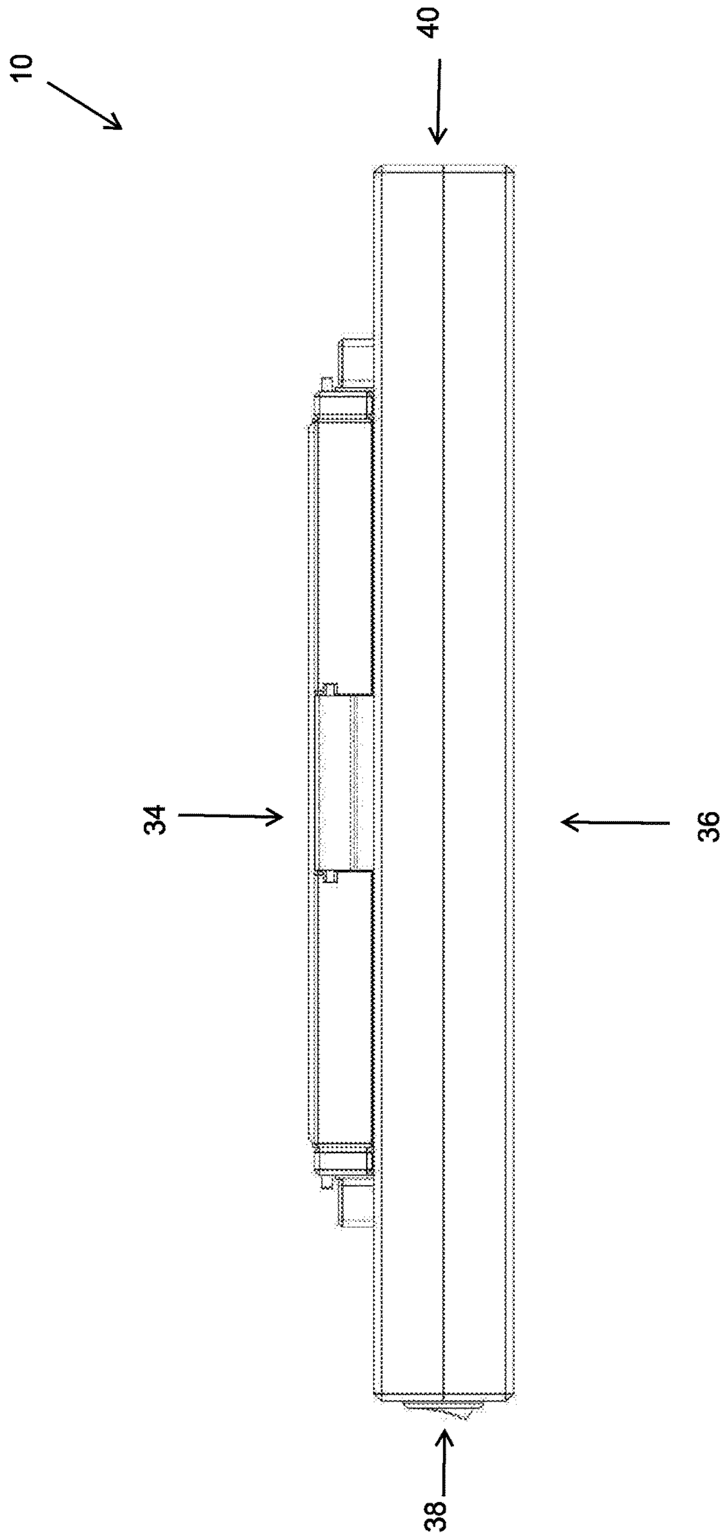
FIG. 17 shows a left side view of a testing system, in accordance with one or more arrangements.
Figure 18:
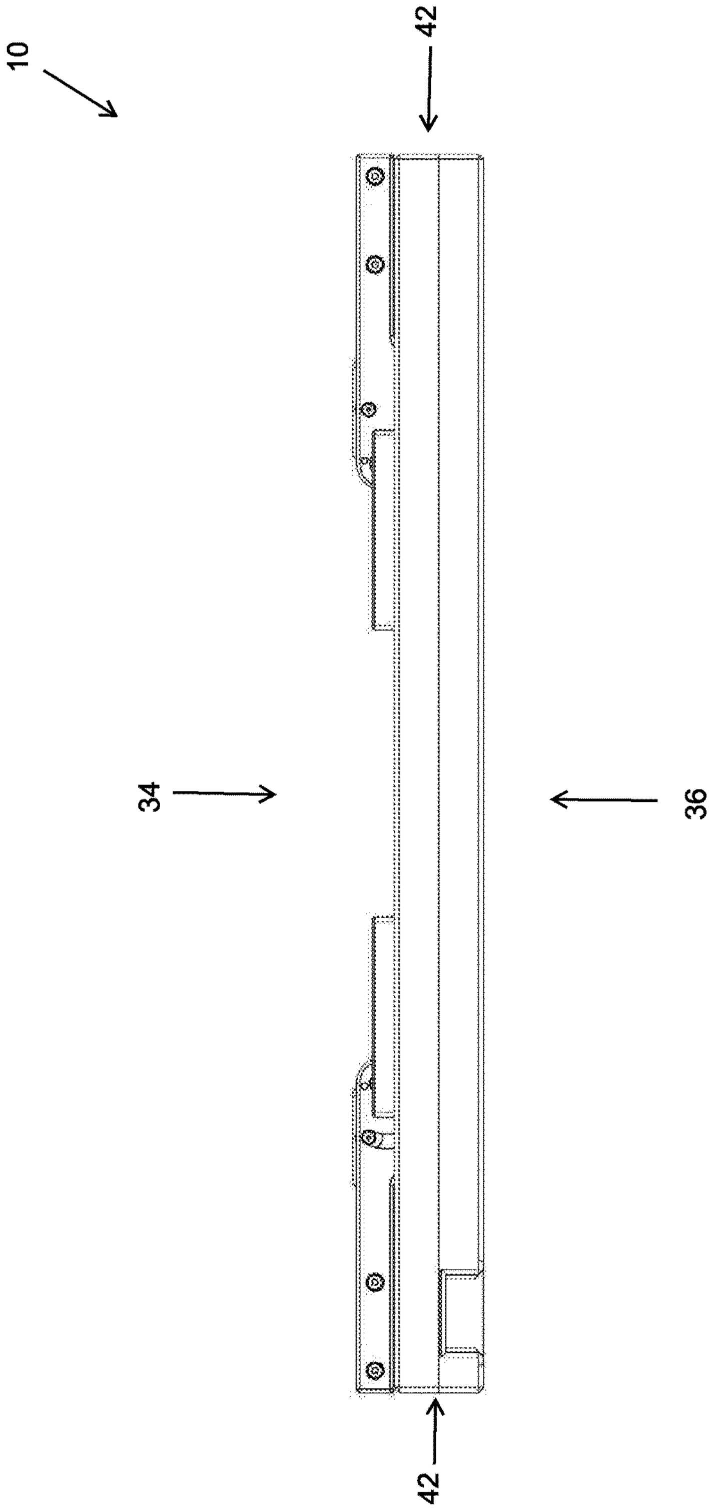
FIG. 18 shows a rear view of a testing system, in accordance with one or more arrangements; the view showing clamps of fastener assemblies moved to an outward position; the view showing handles of the fastener assemblies lowered to a clamped position.
Figure 19:
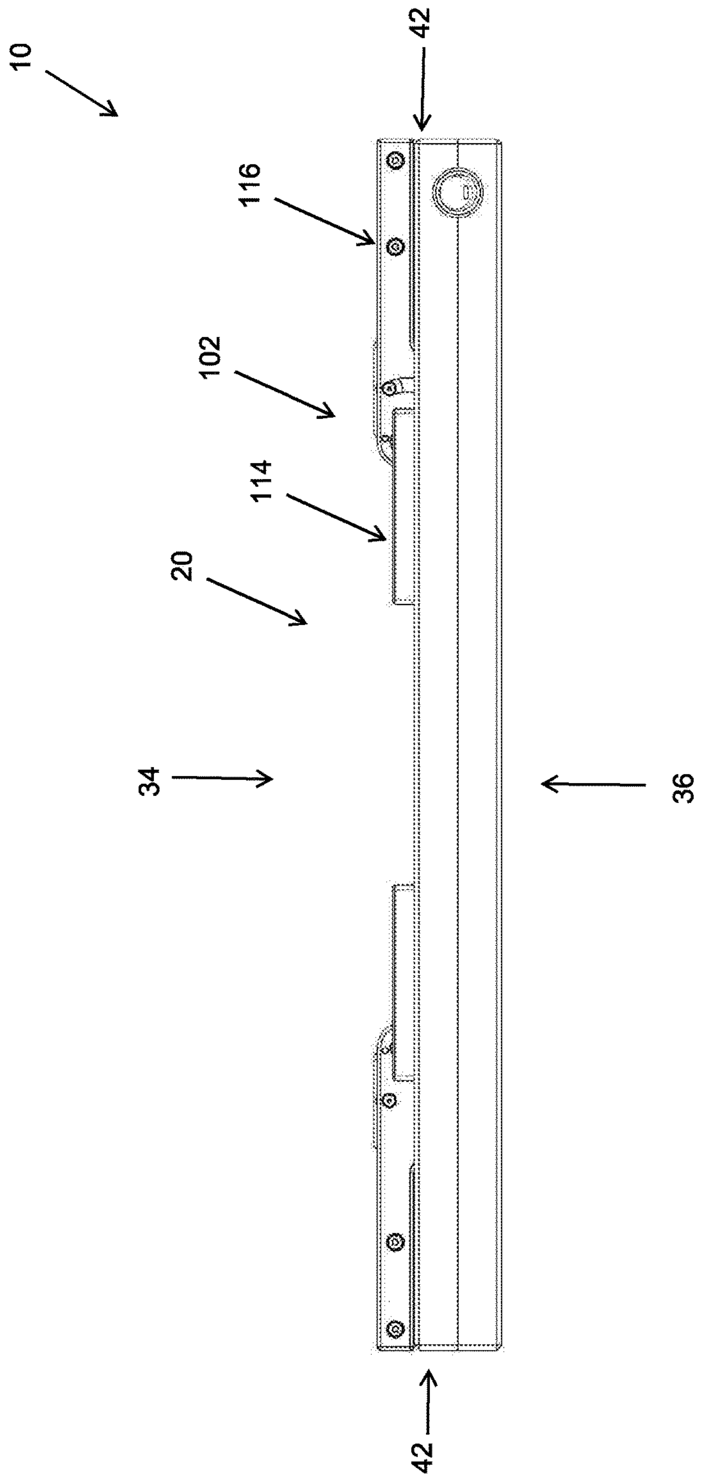
FIG. 19 shows a front view of a testing system, in accordance with one or more arrangements; the view showing clamps of fastener assemblies moved to an outward position; the view showing handles of the fastener assemblies lowered to a clamped position.
Figure 20:
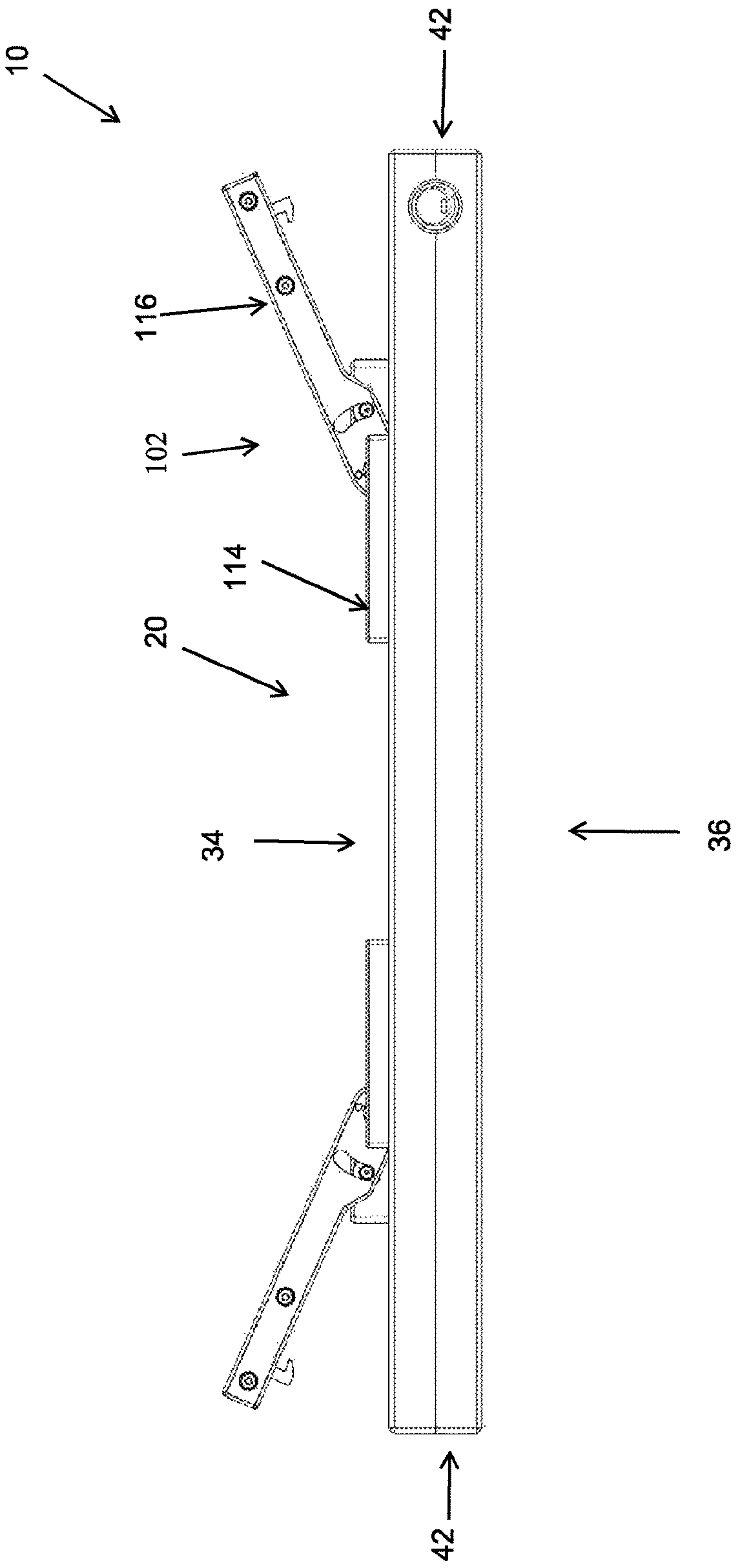
FIG. 20 shows a front view of a testing system, in accordance with one or more arrangements; the view showing clamps of fastener assemblies moved to an outward position; the view showing handles of the fastener assemblies raised to an unclamped position.
Figure 21:
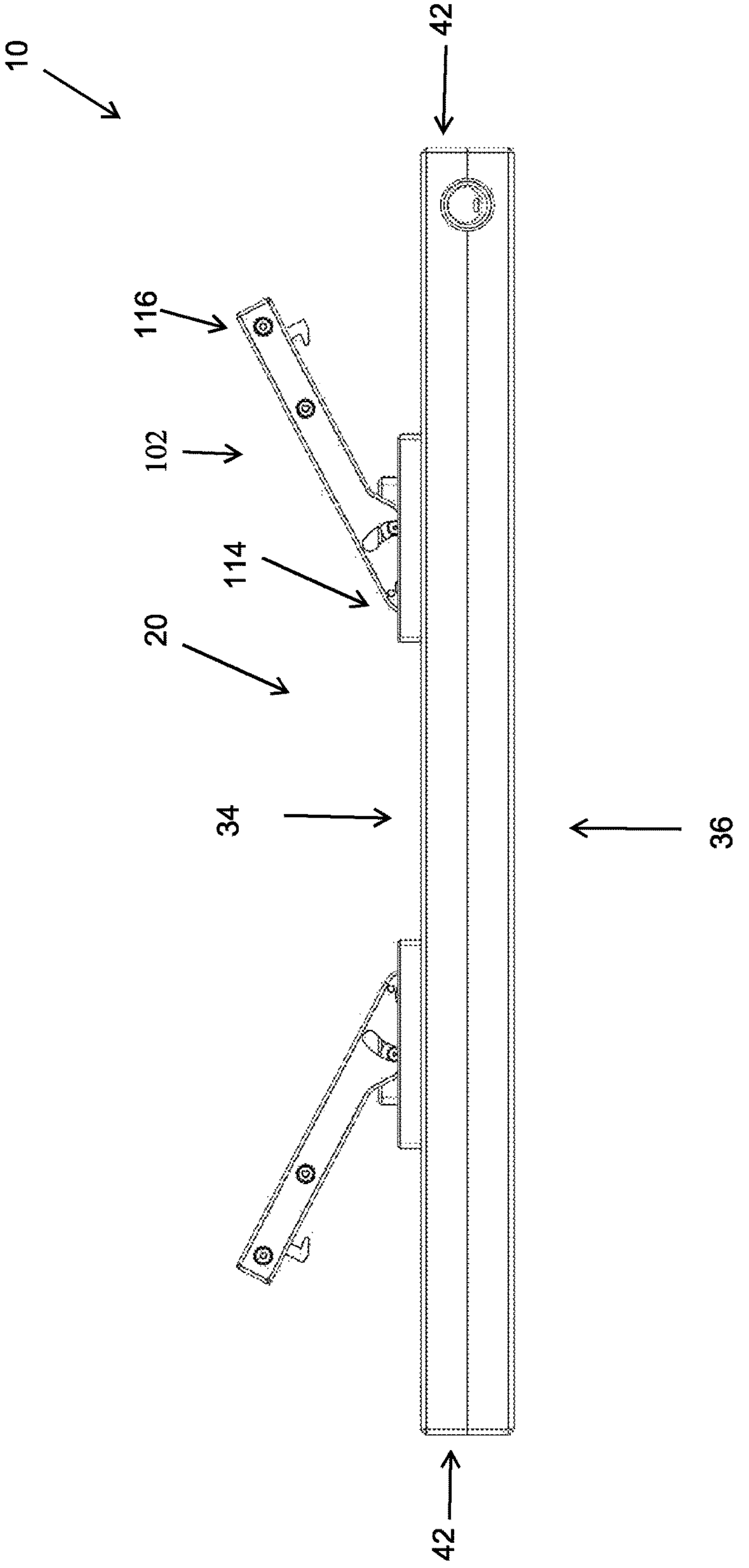
FIG. 21 shows a front view of a testing system, in accordance with one or more arrangements; the view showing clamps of fastener assemblies moved to an inward position; the view showing handles of the fastener assemblies raised to an unclamped position.
Figure 22:
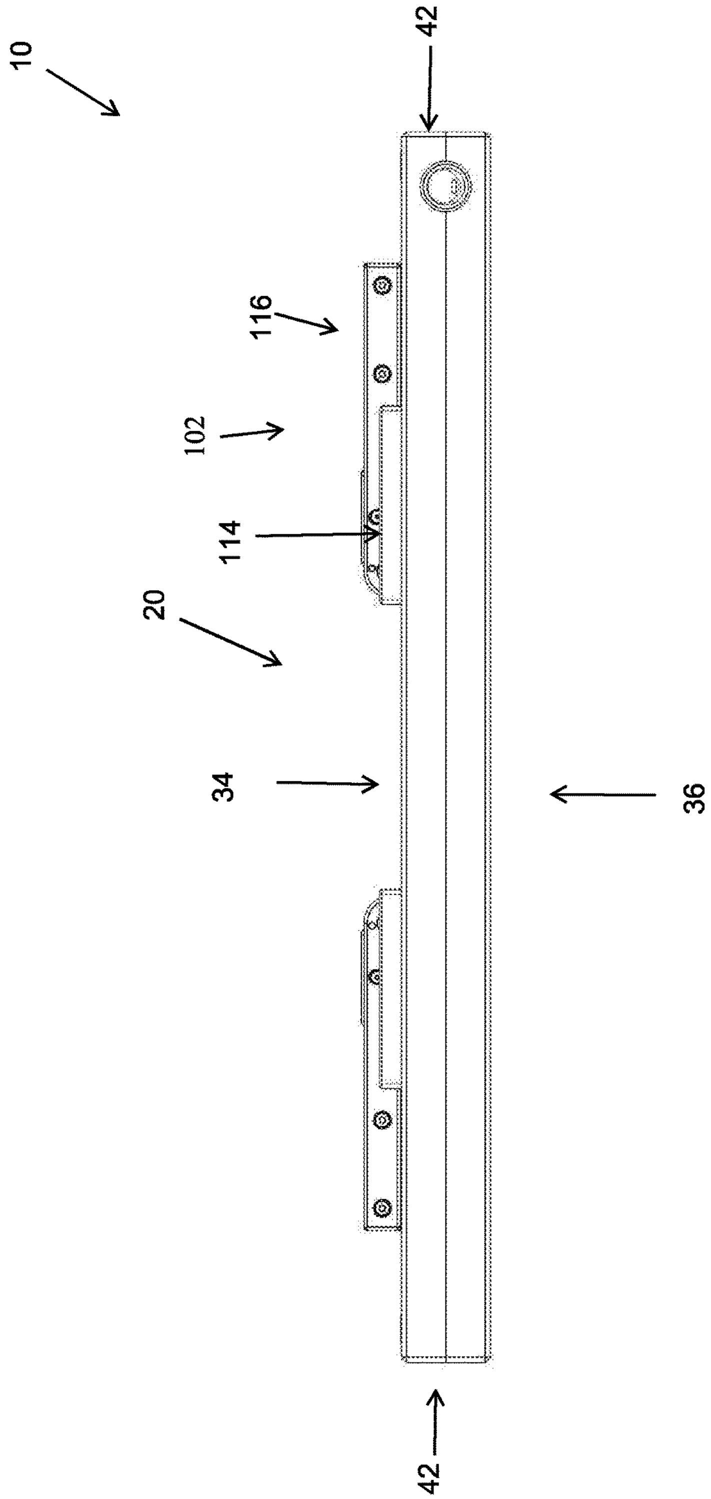
FIG. 22 shows a front view of a testing system, in accordance with one or more arrangements; the view showing clamps of fastener assemblies moved to an inward position; the view showing handles of the fastener assemblies lower to a clamped position.
Figure 23:
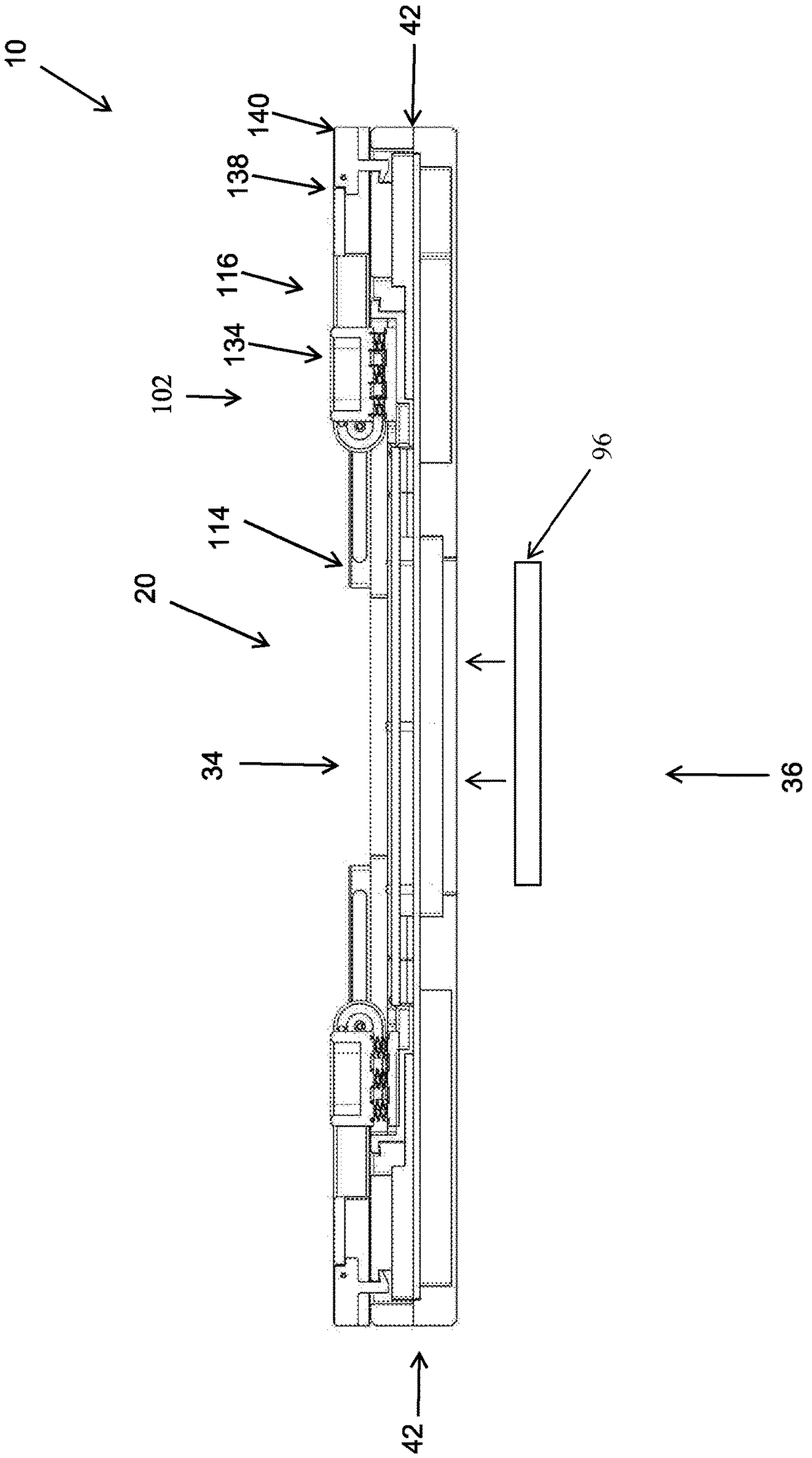
FIG. 23 shows a cross section of a front view of a testing system, in accordance with one or more arrangements; the view showing clamps of fastener assemblies moved to an outward position; the view showing handles of the fastener assemblies lower to a clamped position.
Figure 24:
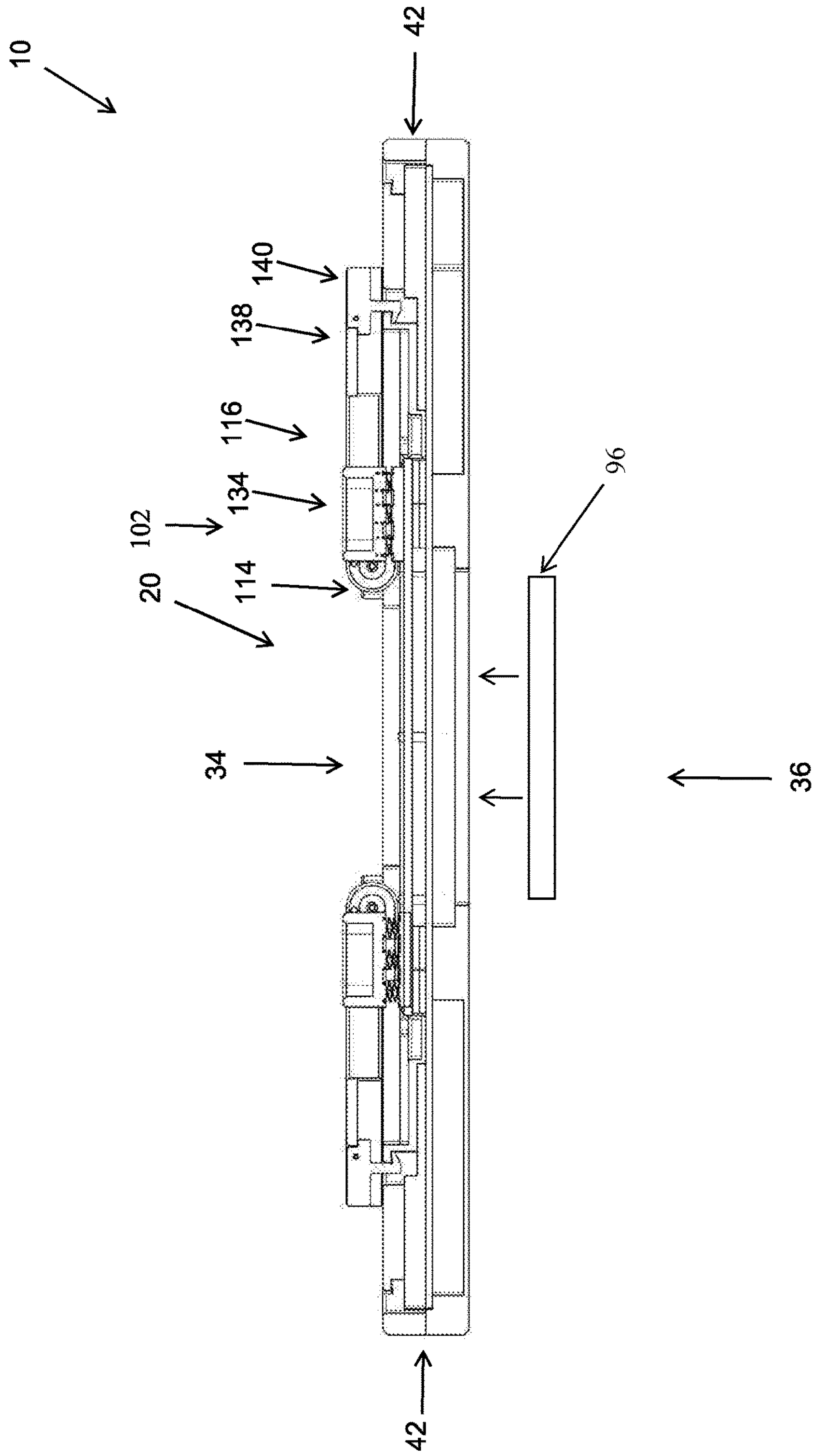
FIG. 24 shows a cross section of a front view of a testing system, in accordance with one or more arrangements; the view showing clamps of fastener assemblies moved to an inward position; the view showing handles of the fastener assemblies lower to a clamped position.
Figure 25:
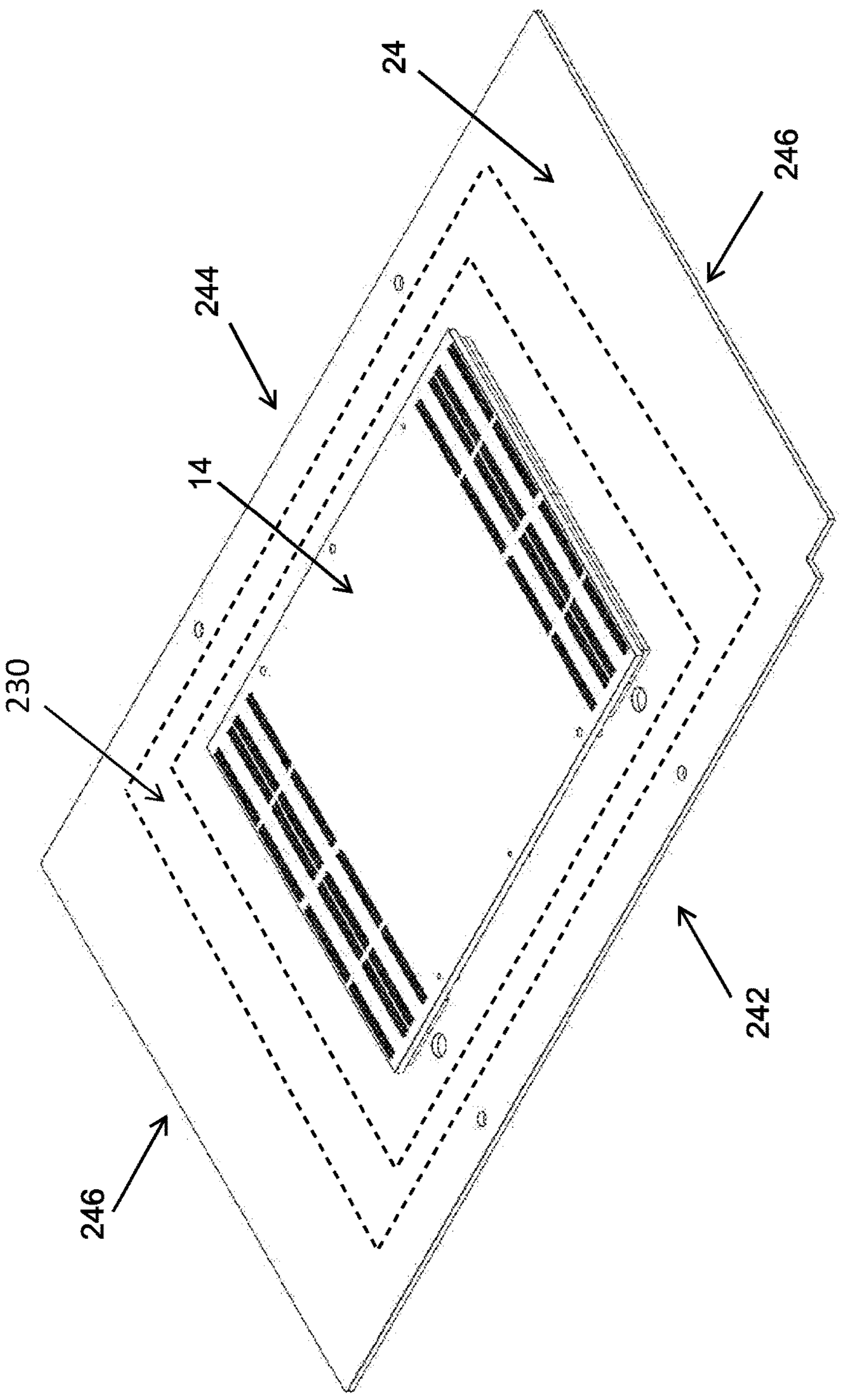
FIG. 25 shows an upper front left side perspective view of motherboard and DUT PCB for a testing system, in accordance with one or more arrangements.
Figure 26:
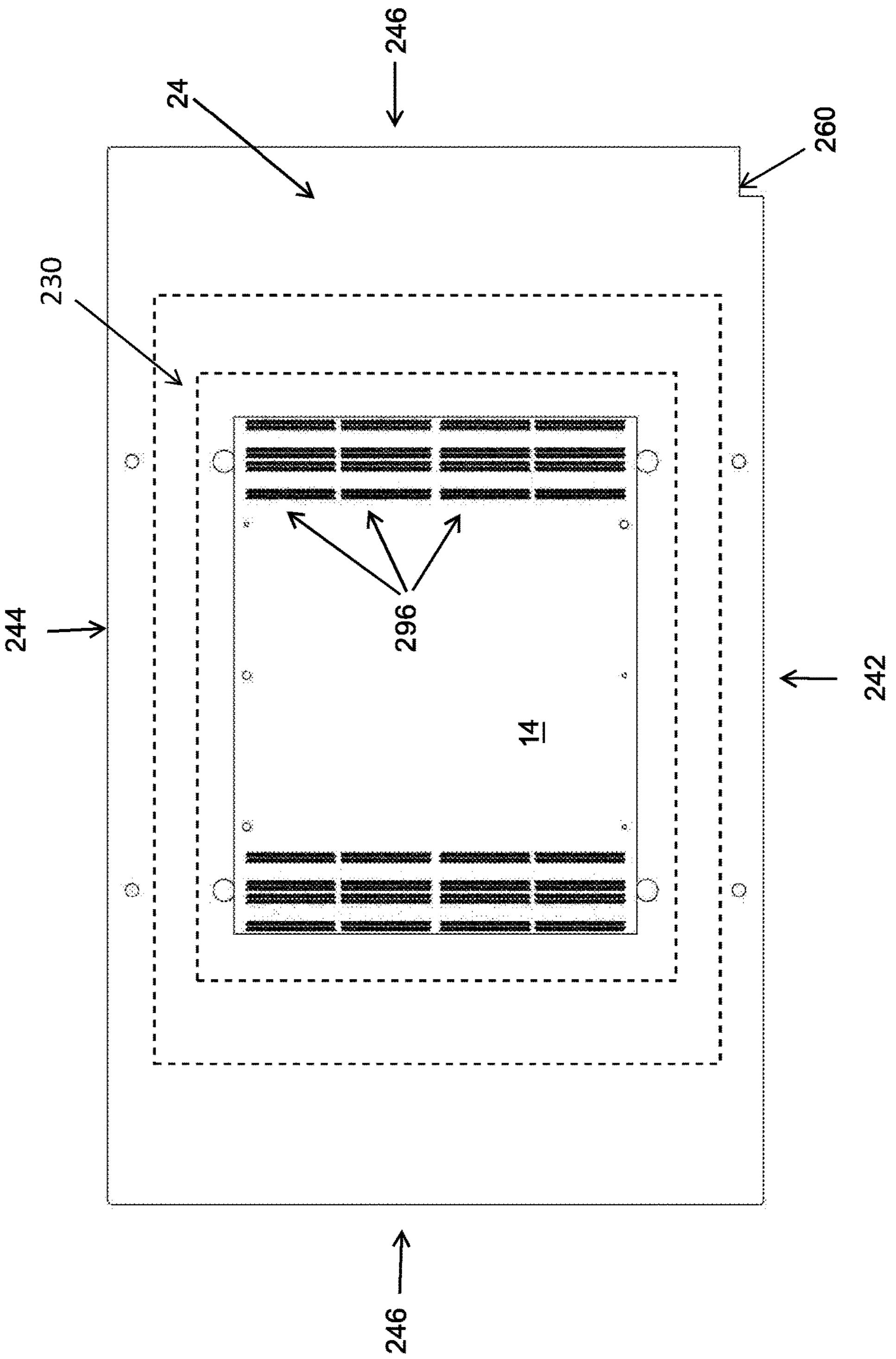
FIG. 26 shows a top view of motherboard and DUT PCB for a testing system, in accordance with one or more arrangements.
Figure 27:
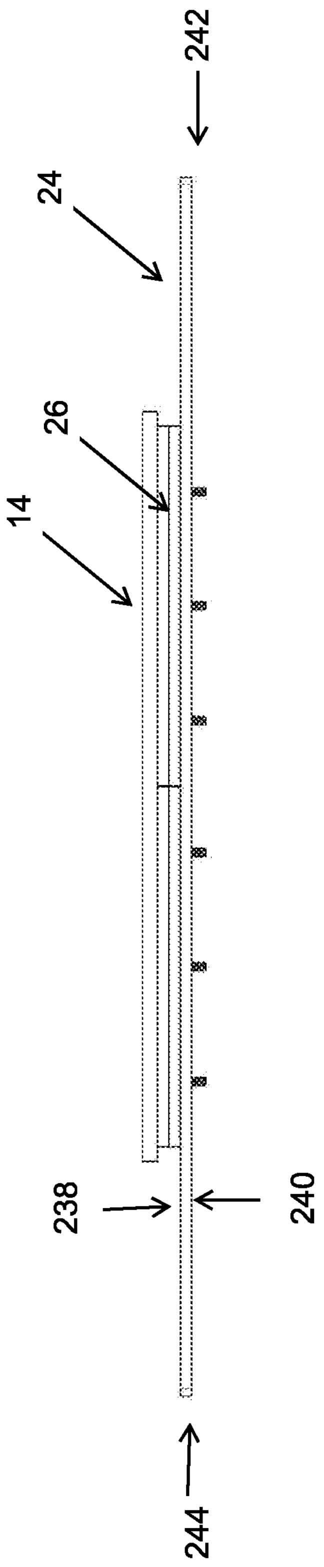
FIG. 27 shows a left side view of motherboard and DUT PCB for a testing system, in accordance with one or more arrangements.
Figure 28:
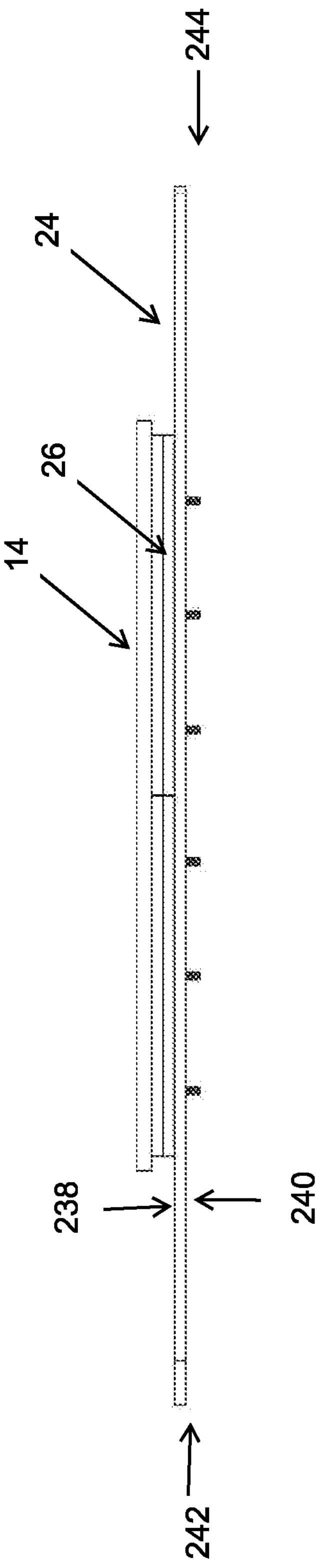
FIG. 28 shows a right side view of motherboard and DUT PCB for a testing system, in accordance with one or more arrangements.
Figure 29:
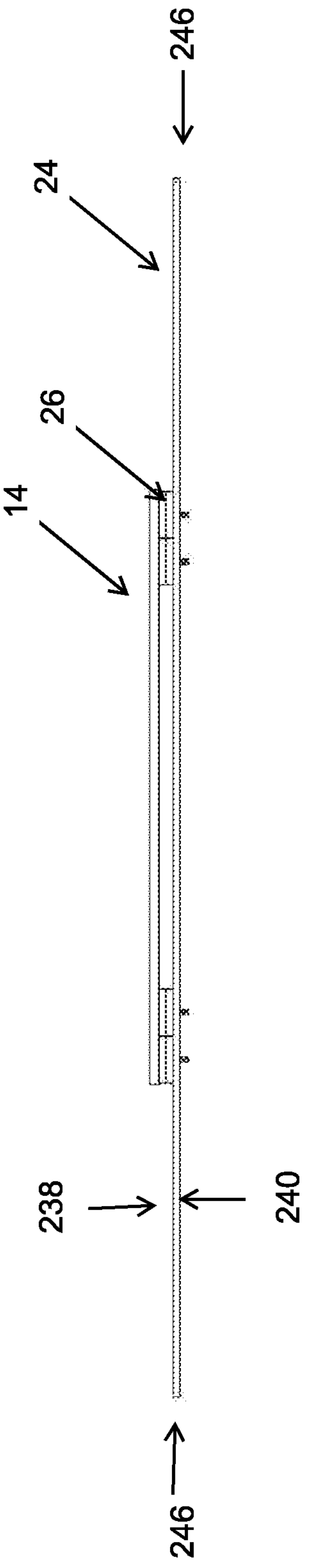
FIG. 29 shows a front view of motherboard and DUT PCB for a testing system, in accordance with one or more arrangements.
Figure 30:
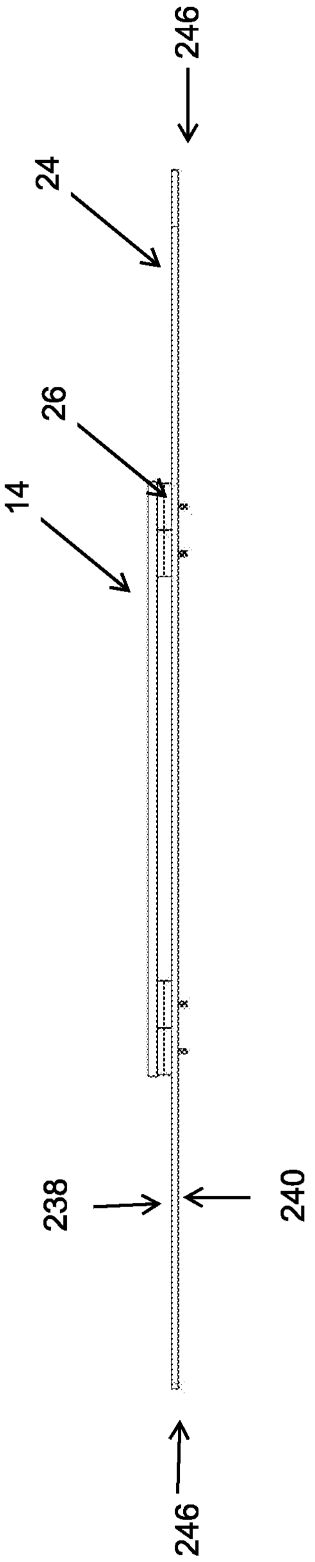
FIG. 30 shows a rear view of motherboard and DUT PCB for a testing system, in accordance with one or more arrangements.
Figure 31:
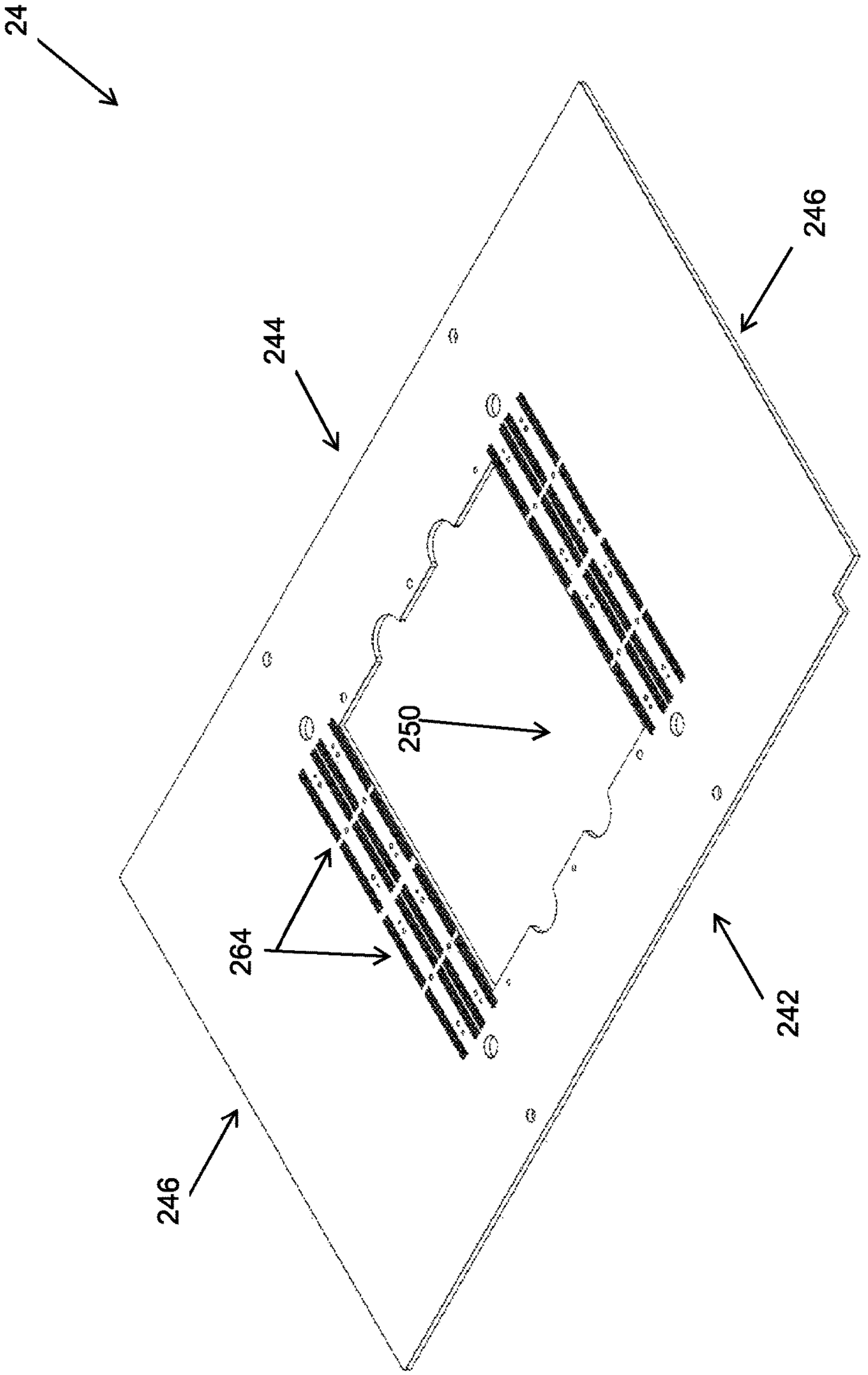
FIG. 31 shows an upper front left side perspective view of motherboard for a testing system, in accordance with one or more arrangements.
Figure 32:
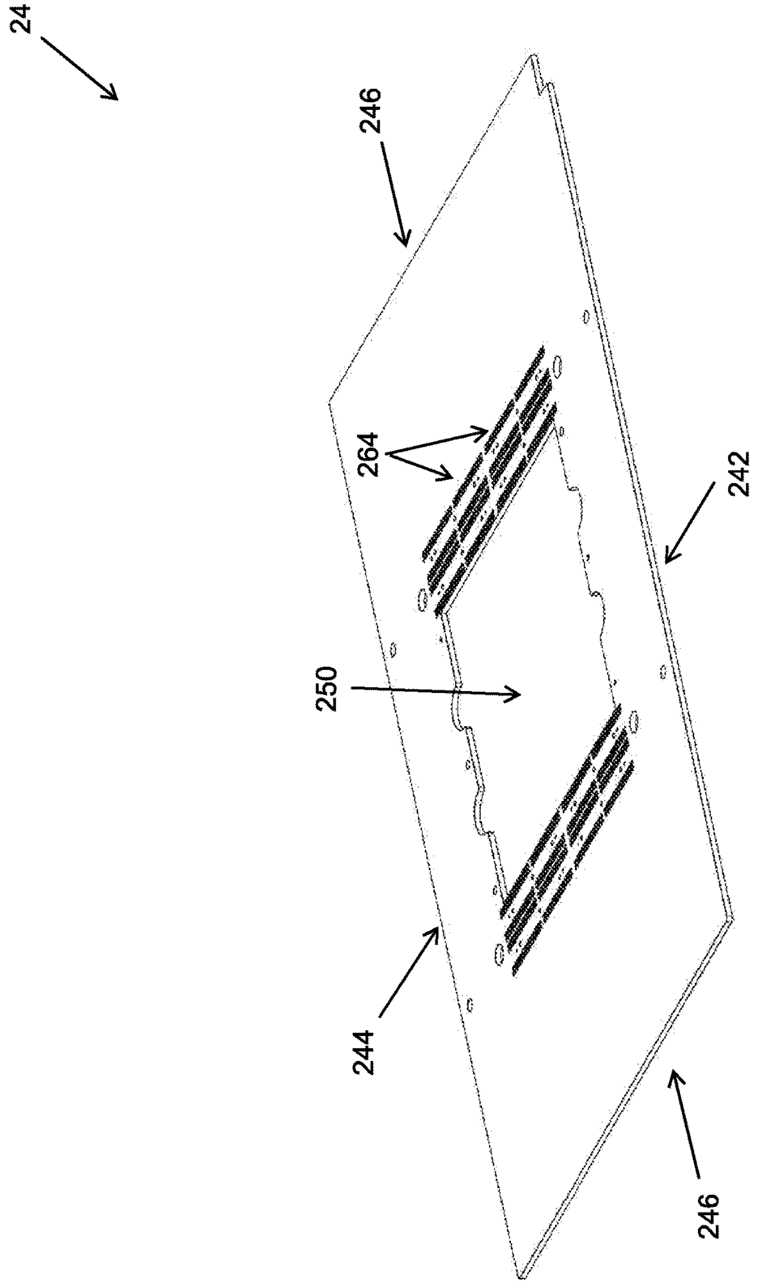
FIG. 32 shows an upper front right side perspective view of motherboard for a testing system, in accordance with one or more arrangements.
Figure 33:
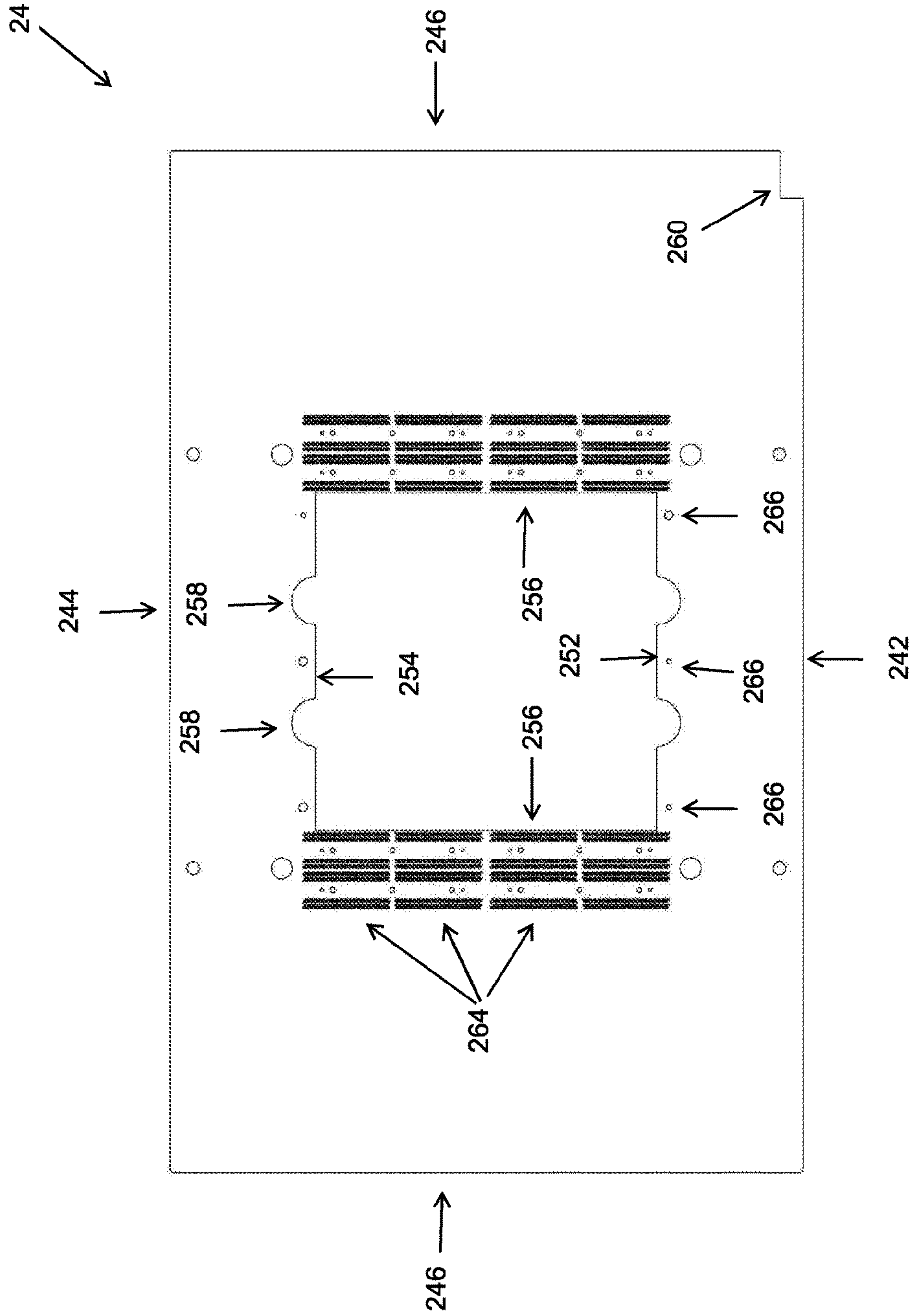
FIG. 33 shows a top view of motherboard for a testing system, in accordance with one or more arrangements.
Figure 34:
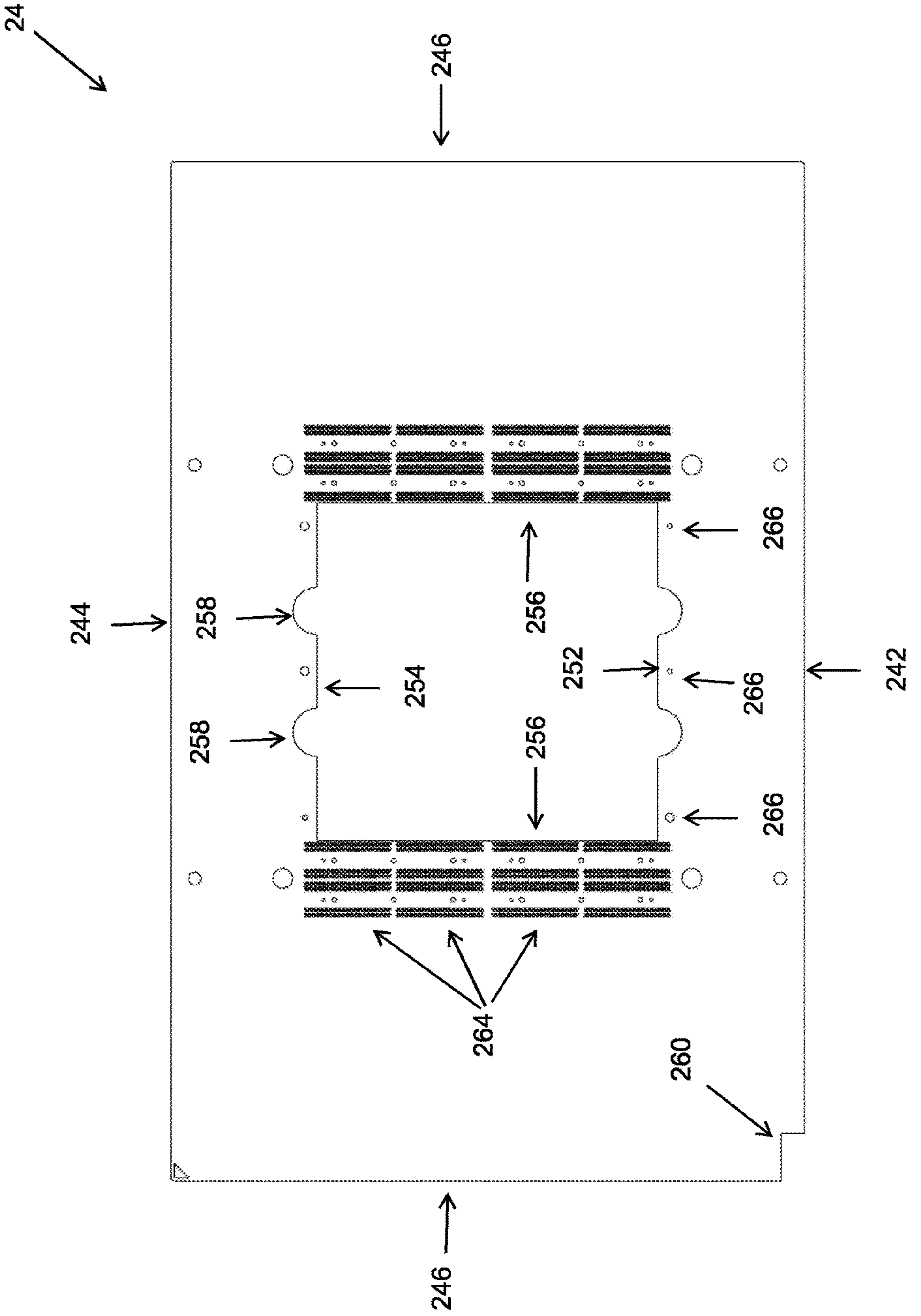
FIG. 34 shows a bottom view of motherboard for a testing system, in accordance with one or more arrangements.
Figure 35:
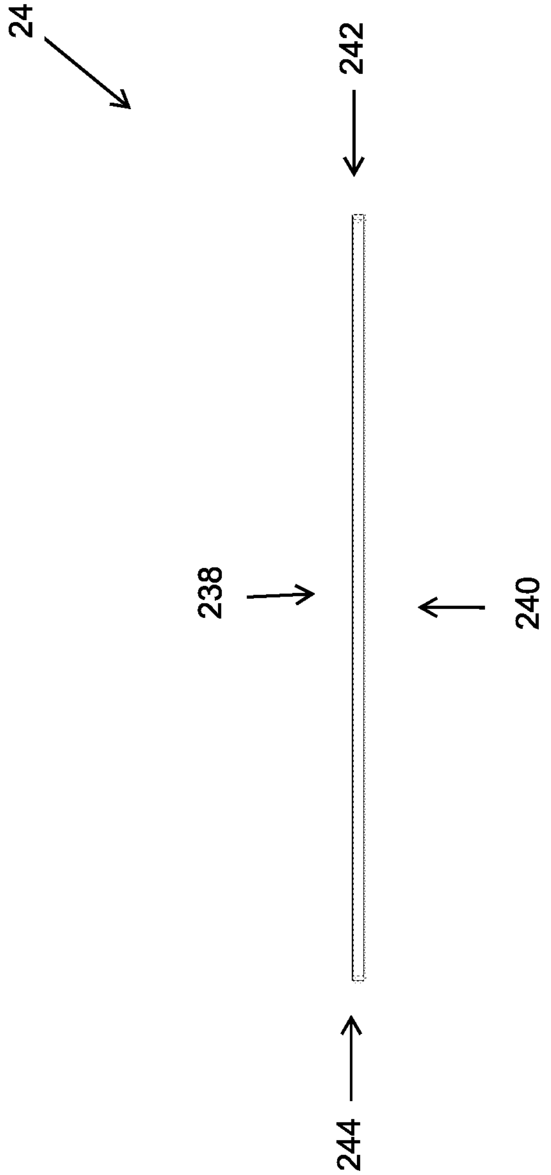
FIG. 35 shows a left side view of motherboard for a testing system, in accordance with one or more arrangements.
Figure 36:
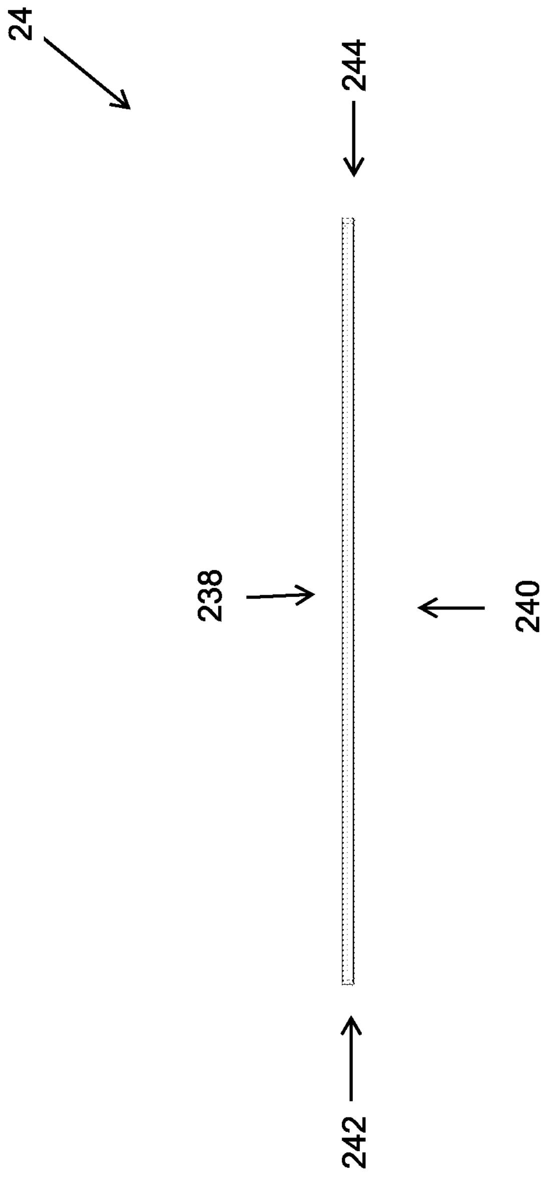
FIG. 36 shows a right side view of motherboard for a testing system, in accordance with one or more arrangements.
Figure 37:
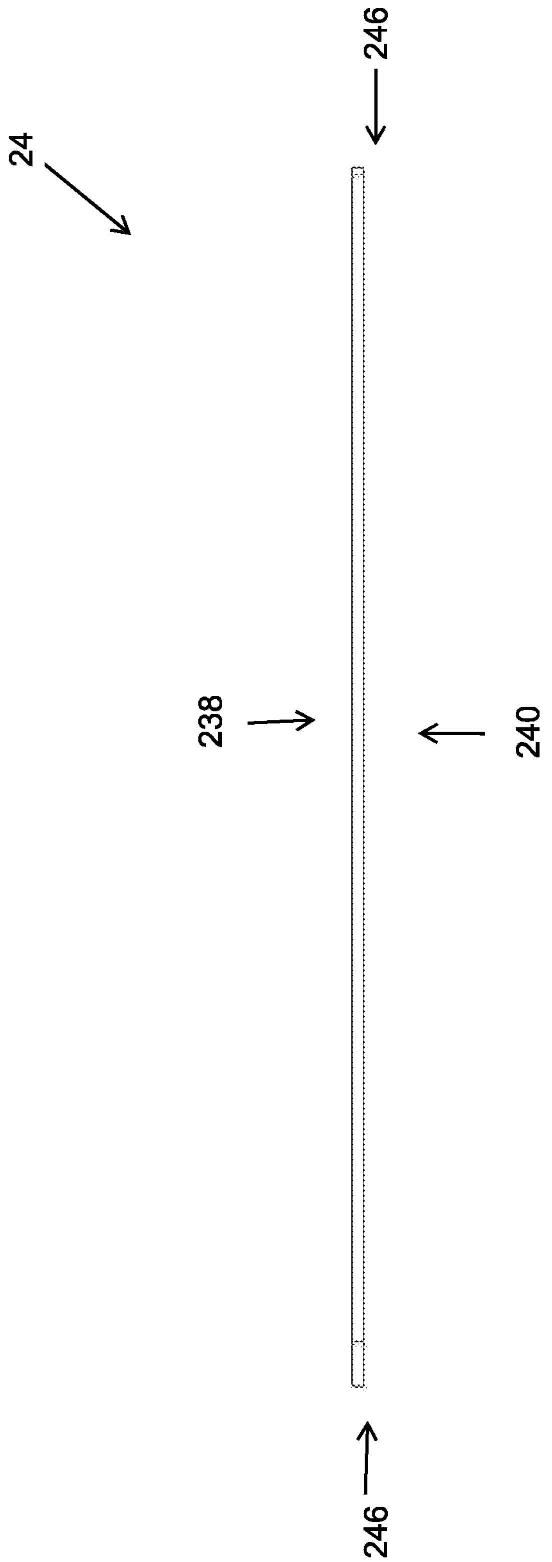
FIG. 37 shows a front view of motherboard for a testing system, in accordance with one or more arrangements.
Figure 38:
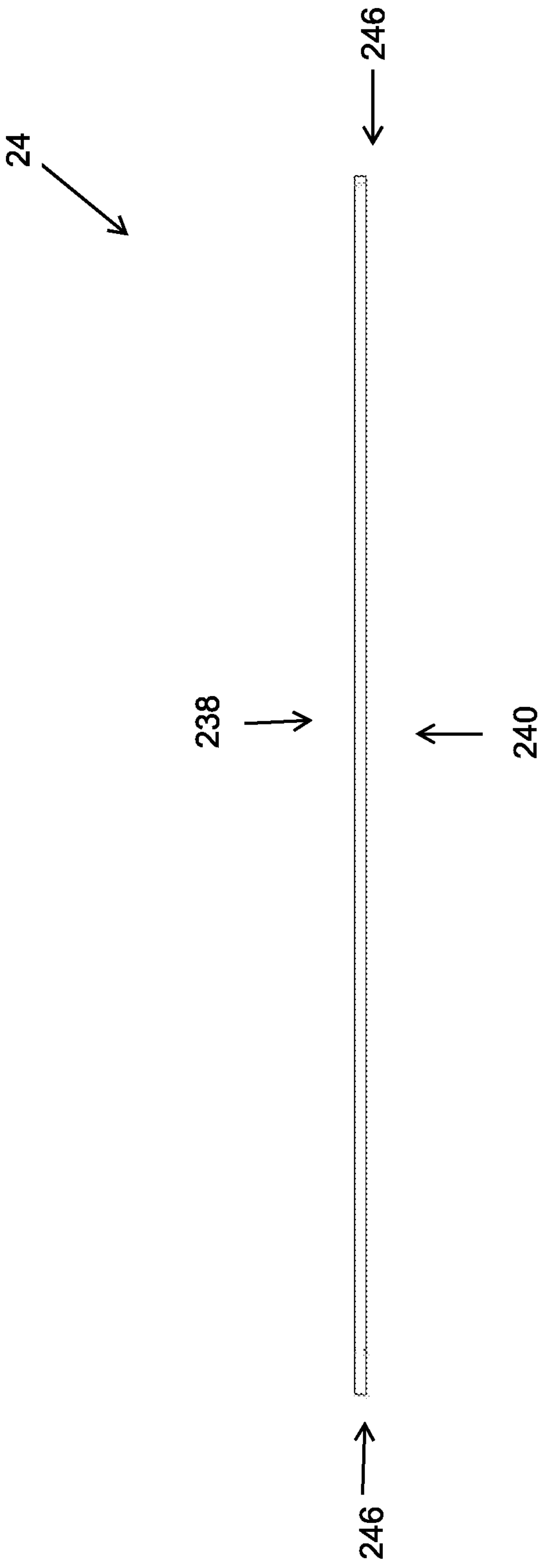
FIG. 38 shows a rear view of motherboard for a testing system, in accordance with one or more arrangements.
Figure 39:
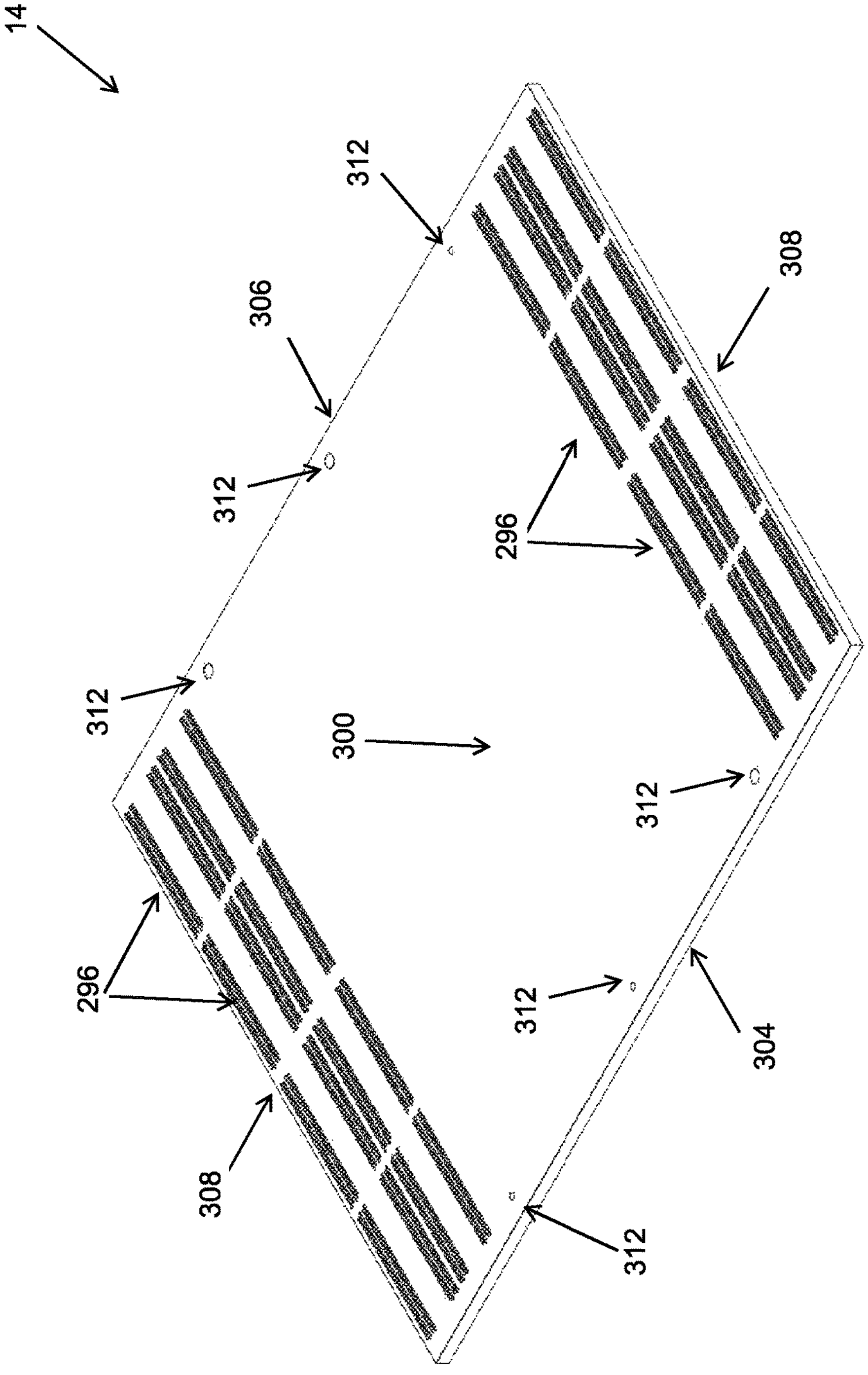
FIG. 39 shows an upper front left side perspective view of DUT PCB for a testing system, in accordance with one or more arrangements.
Figure 40:
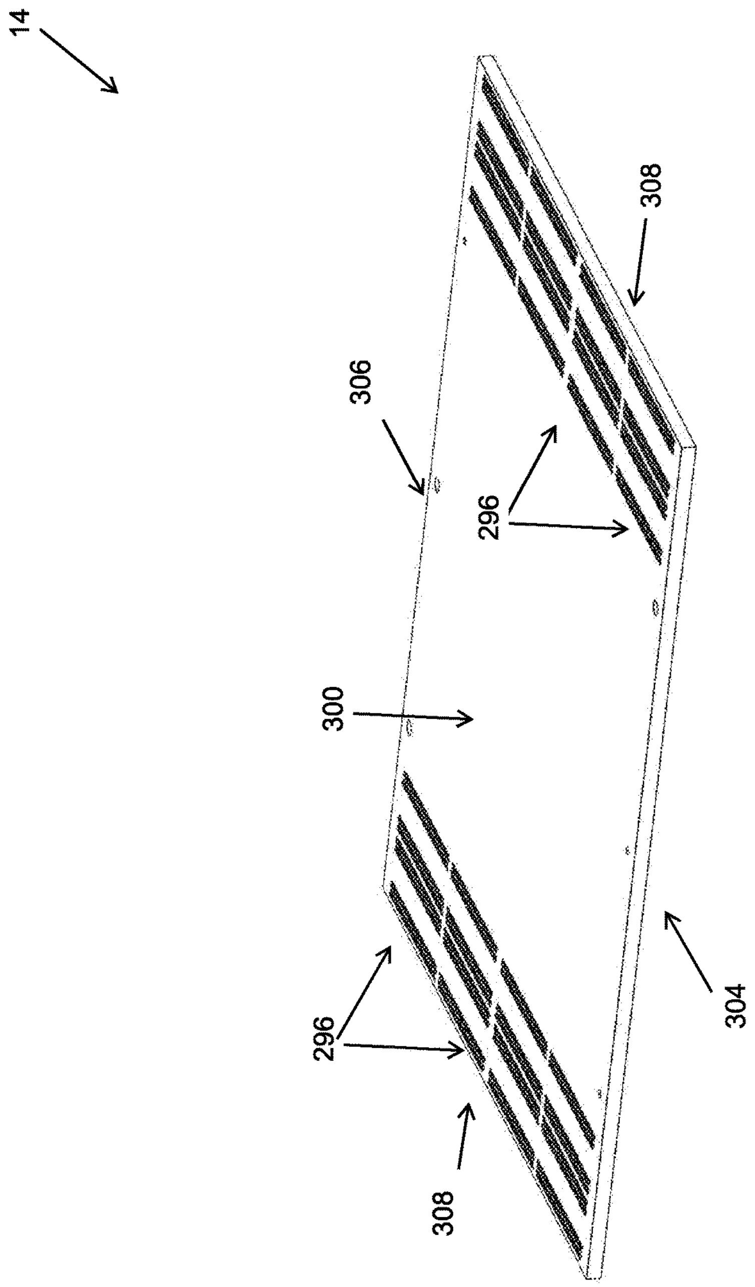
FIG. 40 shows an upper front left side perspective view of DUT PCB for a testing system, in accordance with one or more arrangements.
Figure 41:
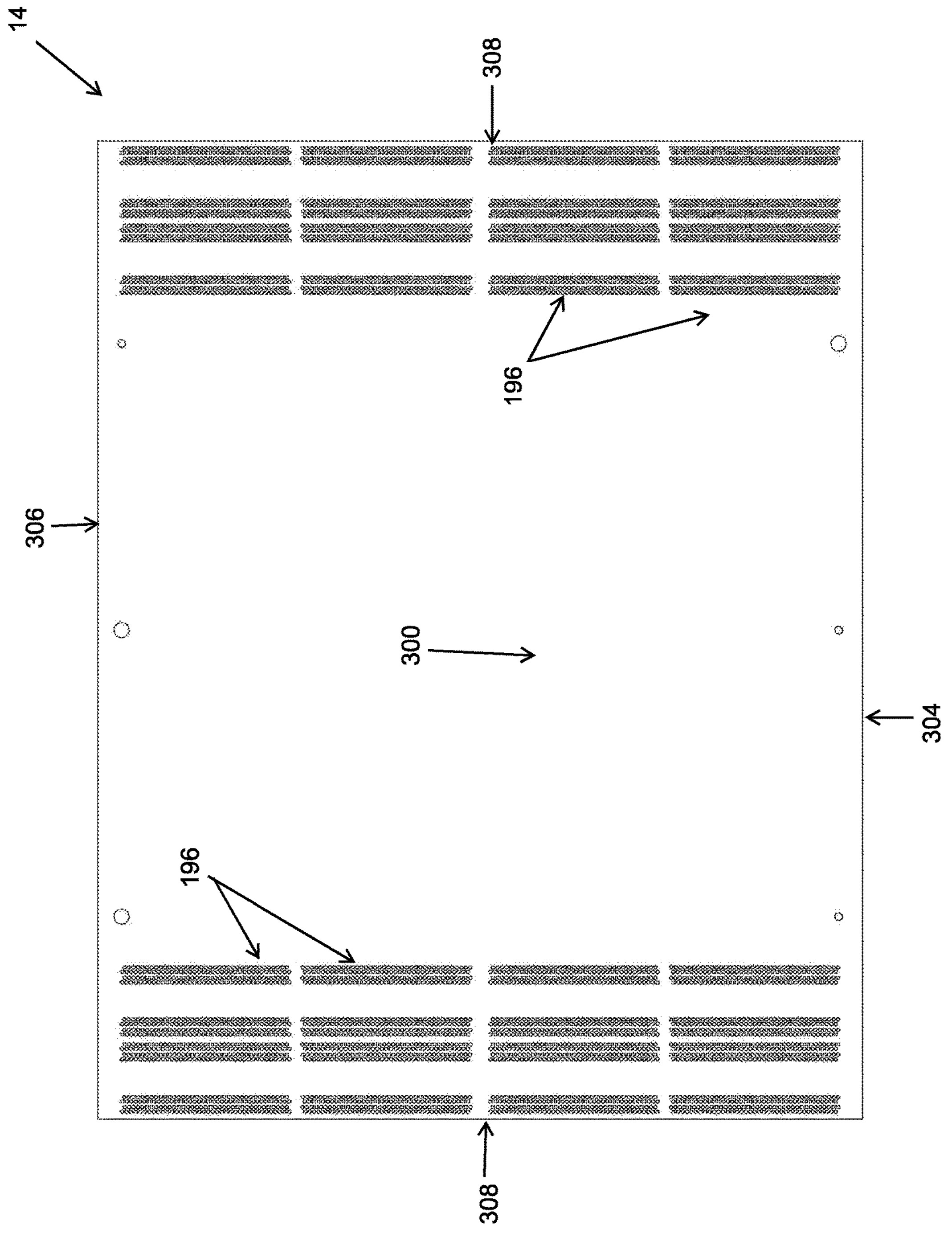
FIG. 41 shows a top view of DUT PCB for a testing system, in accordance with one or more arrangements.
Figure 42:
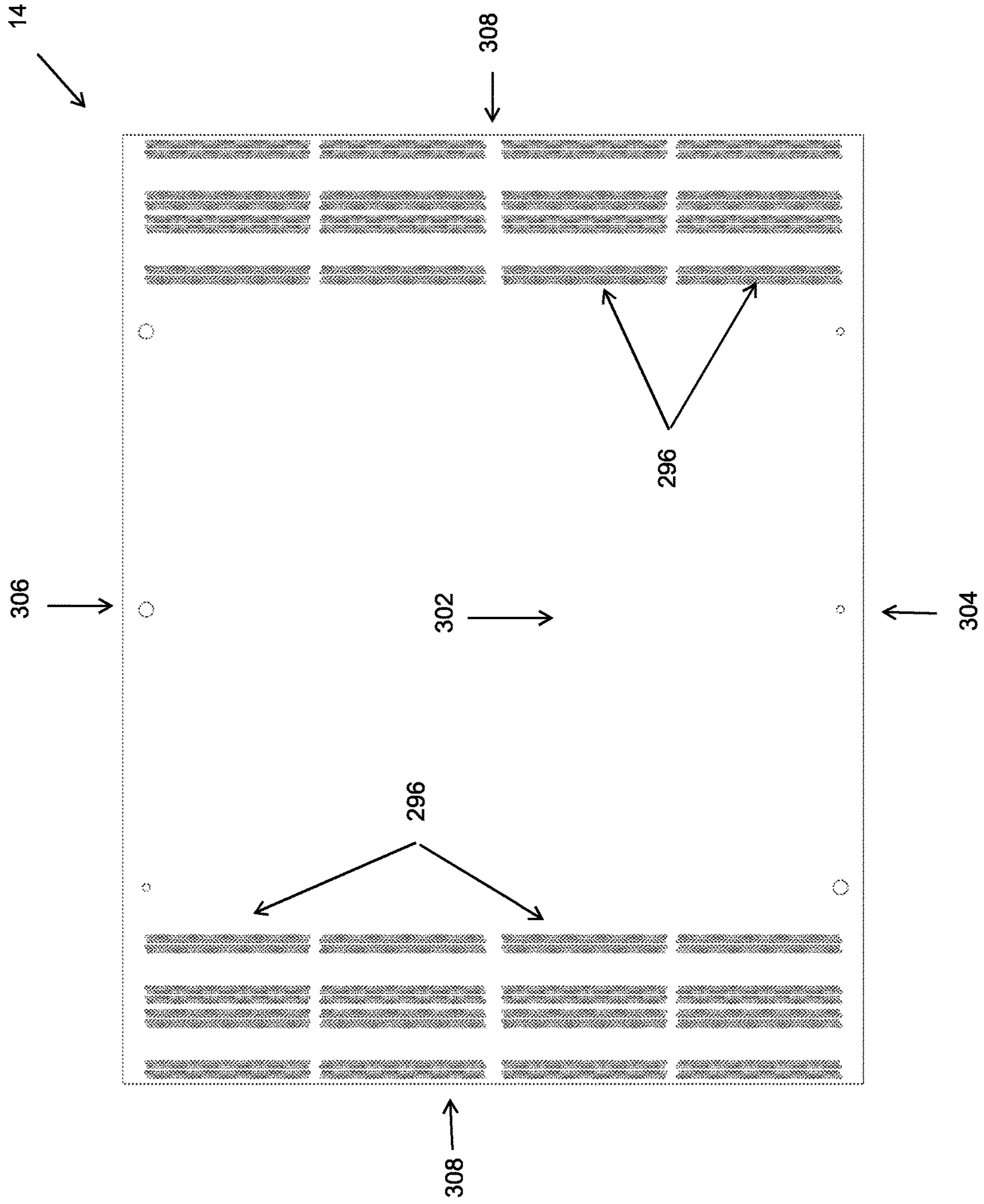
FIG. 42 shows a bottom view of DUT PCB for a testing system, in accordance with one or more arrangements.
Figure 43:
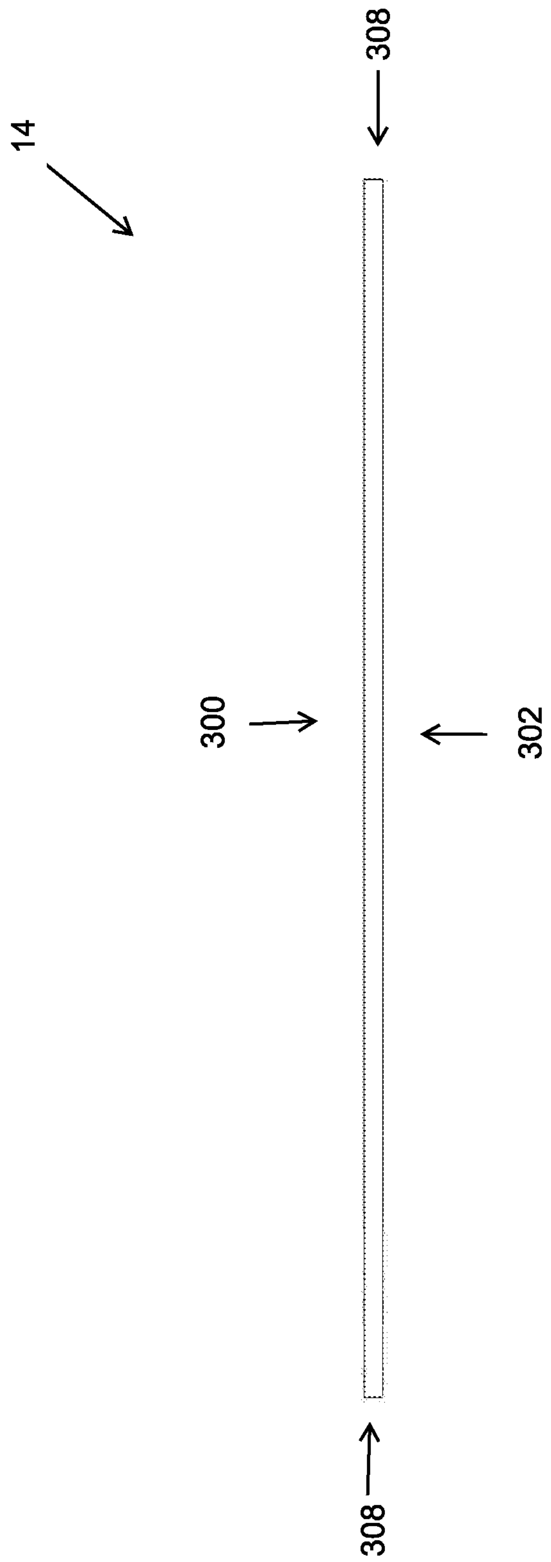
FIG. 43 shows a front view of DUT PCB for a testing system, in accordance with one or more arrangements.
Figure 44:
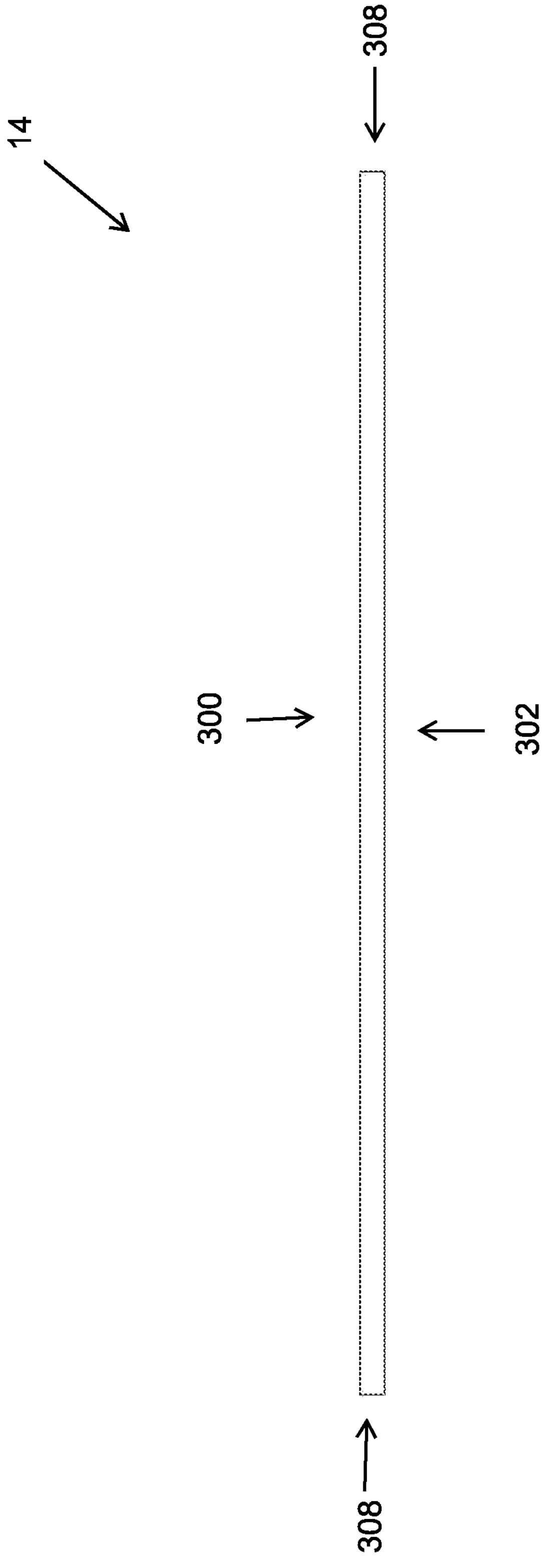
FIG. 44 shows a rear view of DUT PCB for a testing system, in accordance with one or more arrangements.
Figure 45:
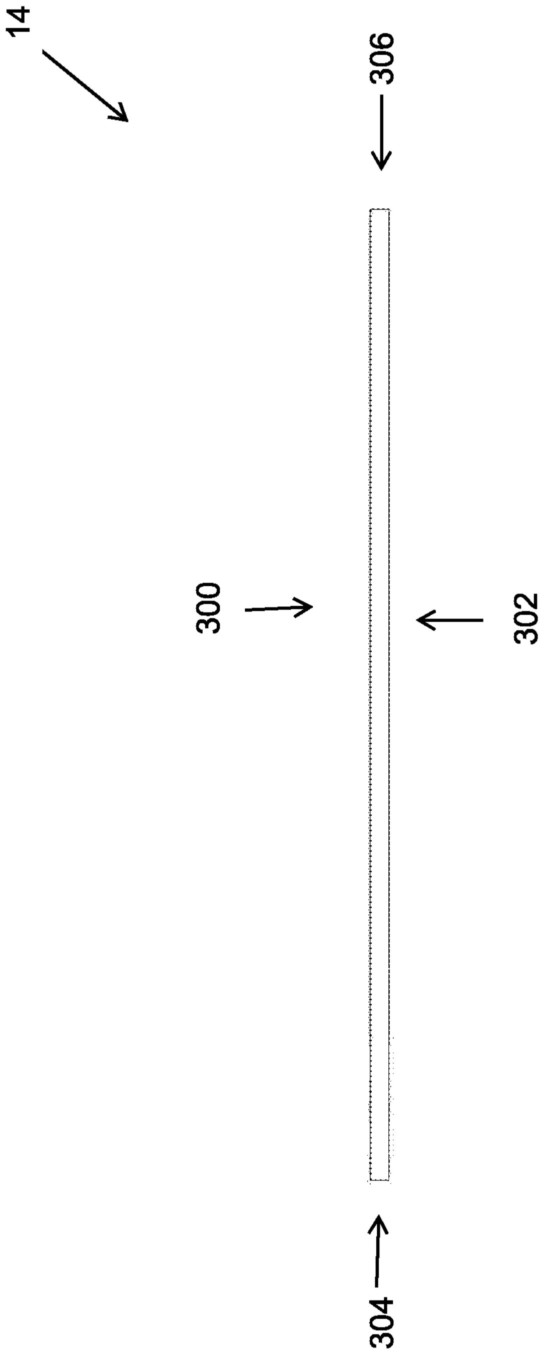
FIG. 45 shows a left side view of DUT PCB for a testing system, in accordance with one or more arrangements.
Figure 46:
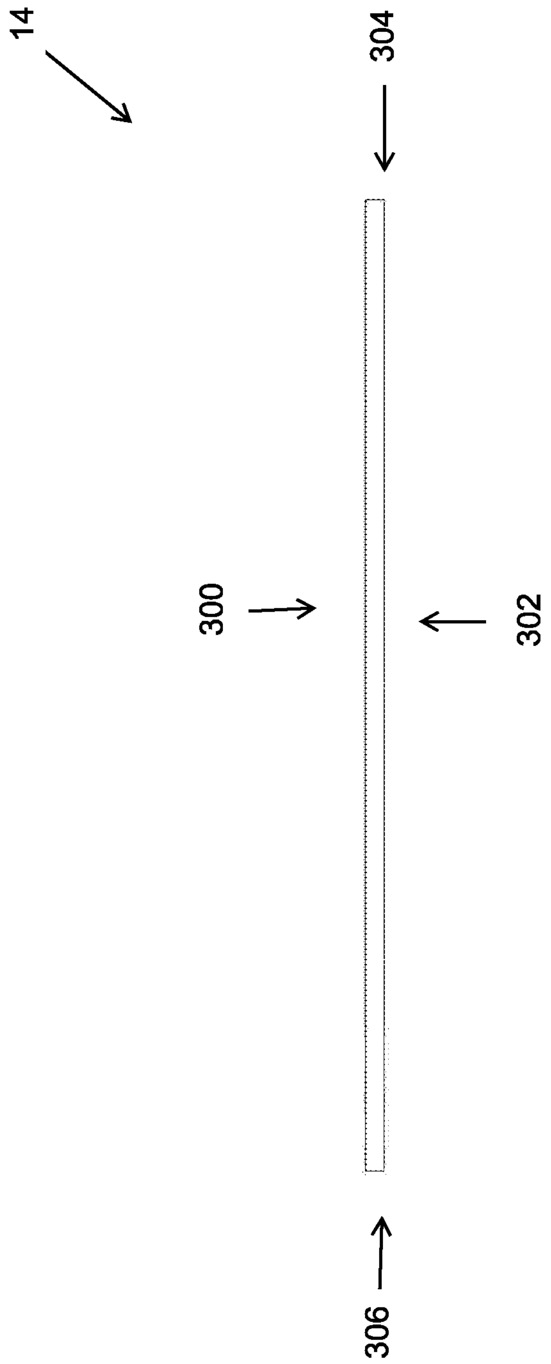
FIG. 46 shows a right side view of DUT PCB for a testing system, in accordance with one or more arrangements.
Figure 47:
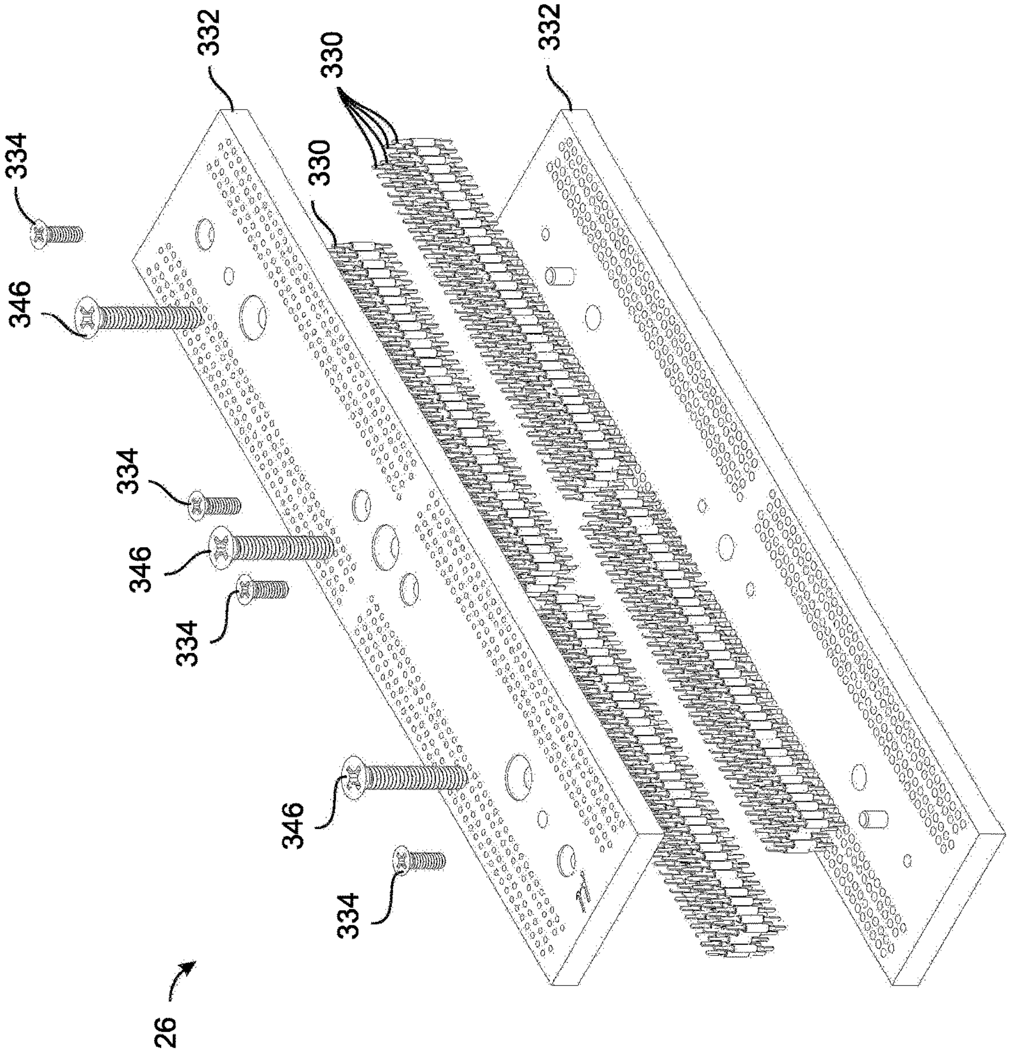
FIG. 47 shows an exploded upper front side perspective view of a capsule for facilitating electrical connection between electrical contacts of a motherboard and electrical contacts of DUT PCB in a testing system, in accordance with one or more arrangements.
Figure 48:
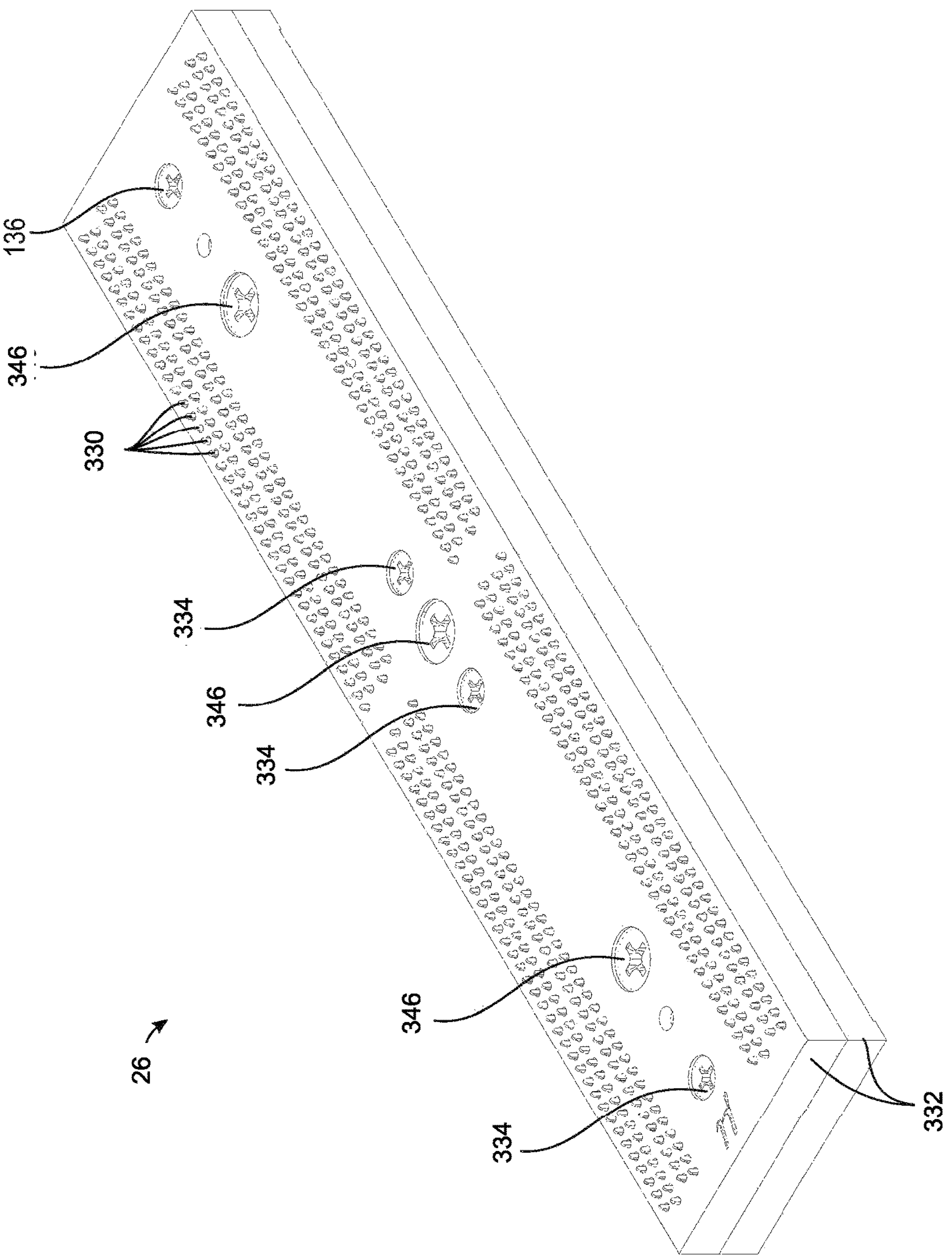
FIG. 48 shows an assembled upper front side perspective view of a capsule for use in a testing system, in accordance with one or more arrangements.
Figure 49:
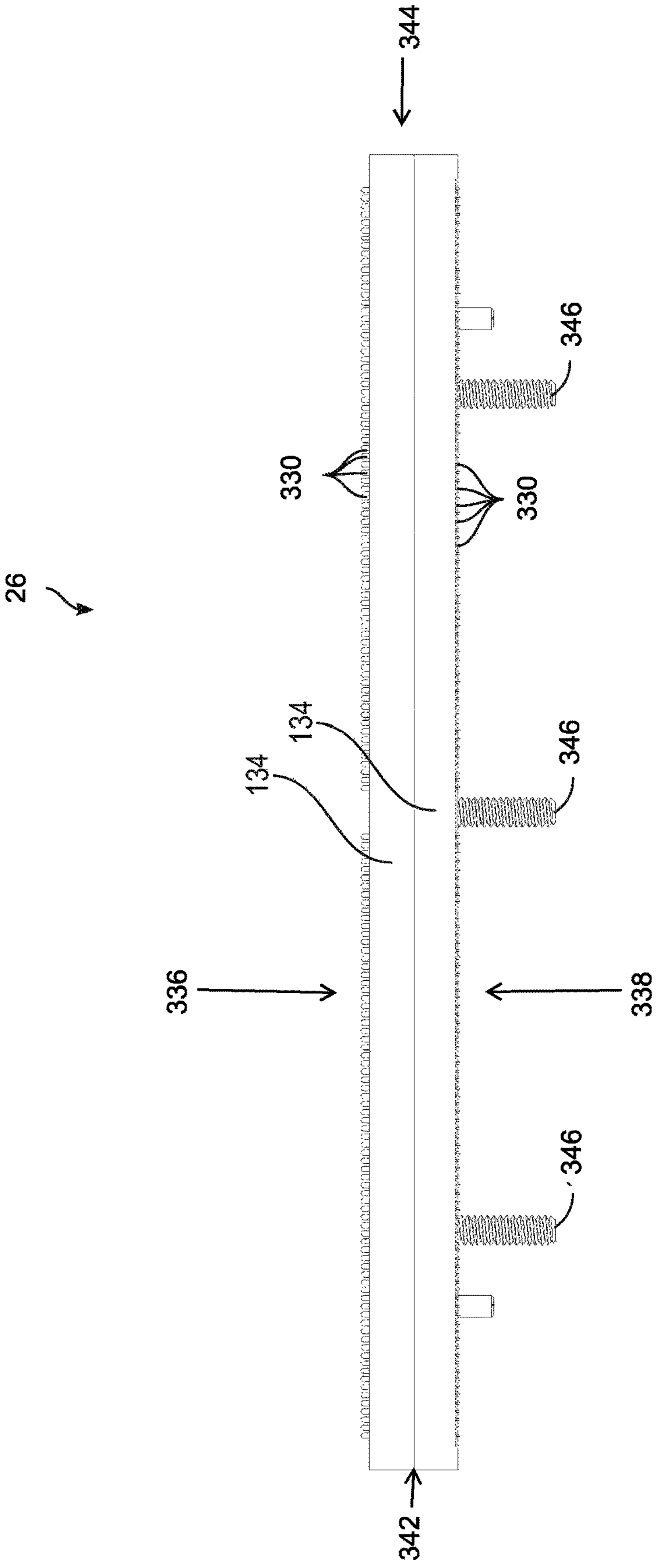
FIG. 49 shows a side view of a capsule for use in a testing system, in accordance with one or more arrangements.
Figure 50:
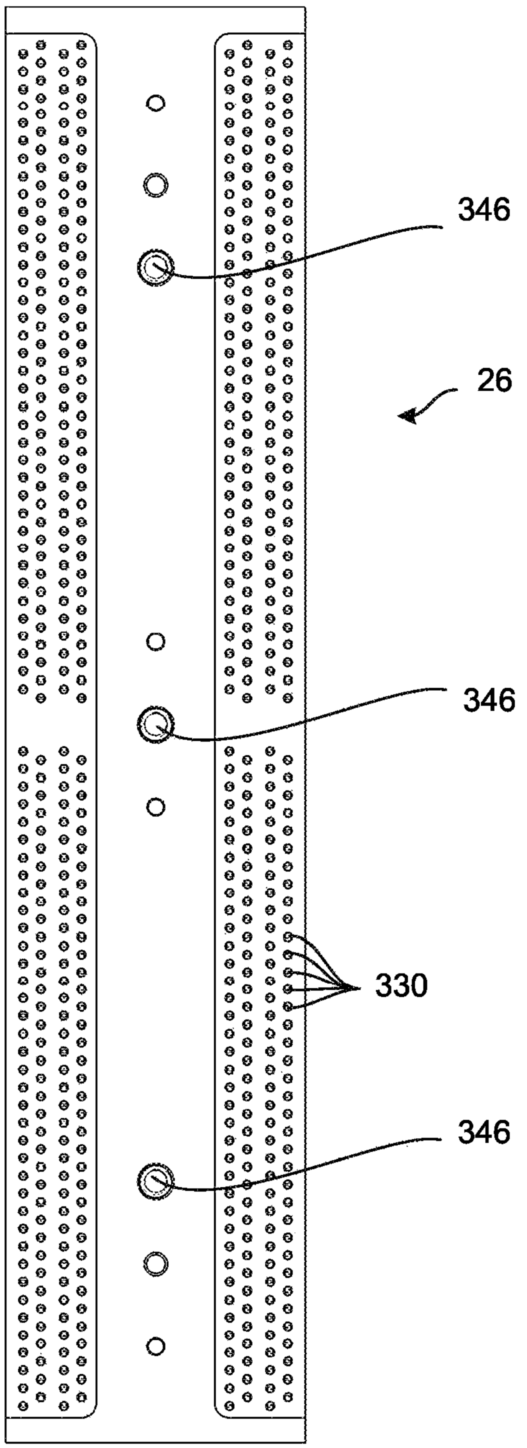
FIG. 50 shows a bottom view of a capsule for use in a testing system, in accordance with one or more arrangements.
Figure 51:
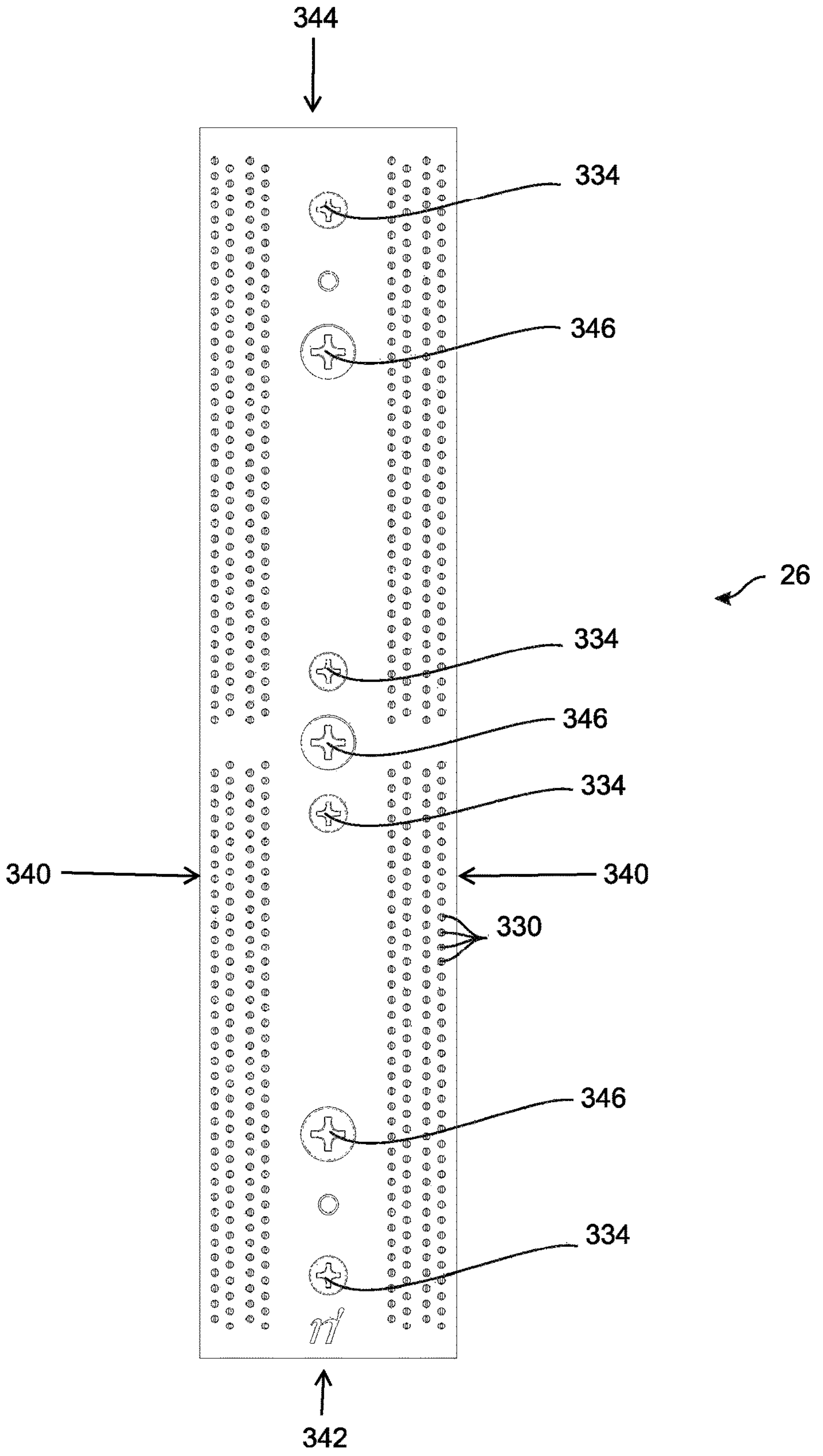
FIG. 51 shows a top view of a capsule for use in a testing system, in accordance with one or more arrangements.
Figure 52:
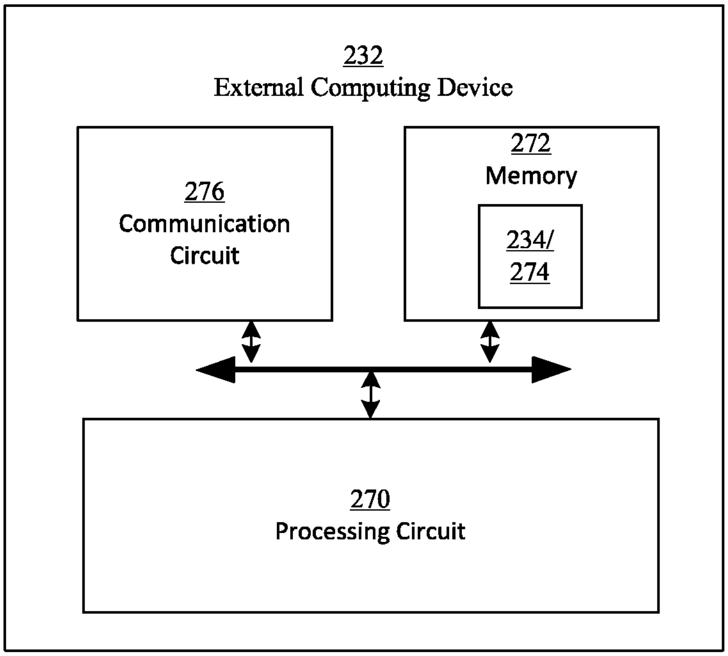
FIG. 52 shows a system level diagram of an external computing device for use in connection with a testing system, in accordance with one or more arrangements.

In the following detailed description of the embodiments, reference is made to the accompanying drawings, which form a part hereof, and in which is shown by way of illustration specific embodiments in which the disclosure may be practiced. The embodiments of the present disclosure described below are not intended to be exhaustive or to limit the disclosure to the precise forms in the following detailed description. Rather, the embodiments are chosen and described so that others skilled in the art may appreciate and understand the principles and practices of the present disclosure. It will be understood by those skilled in the art that various changes in form and details may be made without departing from the principles and scope of the invention. It is intended to cover various modifications and similar arrangements and procedures, and the scope of the appended claims therefore should be accorded the broadest interpretation so as to encompass all such modifications and similar arrangements and procedures. For instance, although aspects and features may be illustrated in or described with reference to certain figures or embodiments, it will be appreciated that features from one figure or embodiment may be combined with features of another figure or embodiment even though the combination is not explicitly shown or explicitly described as a combination. In the depicted embodiments, like reference numbers refer to like elements throughout the various drawings.

It should be understood that any advantages and/or improvements discussed herein may not be provided by various disclosed embodiments, or implementations thereof. The contemplated embodiments are not so limited and should not be interpreted as being restricted to embodiments, which provide such advantages or improvements. Similarly, it should be understood that various embodiments may not address all or any objects of the disclosure or objects of the invention that may be described herein. The contemplated embodiments are not so limited and should not be interpreted as being restricted to embodiments which address such objects of the disclosure or invention. Furthermore, although some disclosed embodiments may be described relative to specific materials, embodiments are not limited to the specific materials or apparatuses but only to their specific characteristics and capabilities and other materials and apparatuses can be substituted as is well understood by those skilled in the art in view of the present disclosure.

It is to be understood that the terms such as "left, right, top, bottom, front, back, side, height, length, width, upper, lower, interior, exterior, inner, outer, and the like as may be used herein, merely describe points of reference and do not limit the present invention to any particular orientation or configuration.

As used herein, "and/or" includes all combinations of one or more of the associated listed items, such that "A and/or B" includes "A but not B," "B but not A," and "A as well as B,"

unless it is clearly indicated that only a single item, subgroup of items, or all items are present. The use of "etc." is defined as "et cetera" and indicates the inclusion of all other elements belonging to the same group of the preceding items, in any "and/or" combination(s).

As used herein, the singular forms "a," "an," and "the" are intended to include both the singular and plural forms, unless the language explicitly indicates otherwise. Indefinite articles like "a" and "an" introduce or refer to any modified term, both previously-introduced and not, while definite articles like "the" refer to a same previously-introduced term; as such, it is understood that "a" or "an" modify items that are permitted to be previously-introduced or new, while definite articles modify an item that is the same as immediately previously presented. It will be further understood that the terms "comprises," "comprising," "includes," and/or "including," when used herein, specify the presence of stated features, characteristics, steps, operations, elements, and/or components, but do not themselves preclude the presence or addition of one or more other features, characteristics, steps, operations, elements, components, and/or groups thereof, unless expressly indicated otherwise. For example, if an embodiment of a system is described as comprising an article, it is understood the system is not limited to a single instance of the article unless expressly indicated otherwise, even if elsewhere another embodiment of the system is described as comprising a plurality of articles.

It will be understood that when an element is referred to as being "connected," "coupled," "mated," "attached," "fixed," etc. to another element, it can be directly connected to the other element, and/or intervening elements may be present. In contrast, when an element is referred to as being "directly connected," "directly coupled," "directly engaged" etc. to another element, there are no intervening elements present. Other words used to describe the relationship between elements should be interpreted in a like fashion (e.g., "between" versus "directly between," "adjacent" versus "directly adjacent," "engaged" versus "directly engaged," etc.). Similarly, a term such as "operatively", such as when used as "operatively connected" or "operatively engaged" is to be interpreted as connected or engaged, respectively, in any manner that facilitates operation, which may include being directly connected, indirectly connected, electronically connected, wirelessly connected or connected by any other manner, method or means that facilitates desired operation. Similarly, a term such as "communicatively connected" includes all variations of information exchange and routing between two electronic devices, including intermediary devices, networks, etc., connected wirelessly or not. Similarly, "connected" or other similar language particularly for electronic components is intended to mean connected by any means, either directly or indirectly, wired and/or wirelessly, such that electricity and/or information may be transmitted between the components.

It will be understood that, although the ordinal terms "first," "second," etc. may be used herein to describe various elements, these elements should not be limited to any order by these terms unless specifically stated as such. These terms are used only to distinguish one element from another; where there are "second" or higher ordinals, there merely must be a number of elements, without necessarily any difference or other relationship. For example, a first element could be termed a second element, and, similarly, a second element could be termed a first element, without departing from the scope of example embodiments or methods.

Similarly, the structures and operations discussed herein may occur out of the order described and/or noted in the figures. For example, two operations and/or figures shown in succession may in fact be executed concurrently or may sometimes be executed in the reverse order, depending upon the functionality/acts involved. Similarly, individual operations within example methods described below may be executed repetitively, individually or sequentially, to provide looping or other series of operations aside from single operations described below. It should be presumed that any embodiment or method having features and functionality described below, in any workable combination, falls within the scope of example embodiments.

System 10:

With reference to the figures, a testing system 10 (or simply system 10) is presented. Testing system 10 is formed of any suitable size, shape, and design and is configured to facilitate testing various different types of sockets 12 and/or devices under test (or DUTs) 16. In the arrangement shown, as one example, testing system 10 includes a housing 18, a receiver assembly 20 formed in housing 18, a test control system 22 having a motherboard 24 positioned within housing 18, and a plurality of capsules 26 to facilitate connection of motherboard 24 with a device under test printed circuit board (or DUT PCB) 14 held within receiver assembly 20, among other components as is further described herein.

Housing 18:

Housing 18 is formed of any suitable size, shape, and design and is configured to house, hold, shelter, secure, and support various components of the system 10, as is further described herein. In the arrangement shown, as one example, housing 18 has a generally planar square or rectangular shape having a top 34, a bottom 36, a front 38, a back 40, and opposing sides 42. In the arrangement shown, housing 18 is formed from a top half 44 and a bottom half 46 that form a hollow interior 48 when joined together that houses other components of the system 10, as is further described herein. However, the arrangements are not so limited, rather it is contemplated that housing may be formed by any number of different shaped components.

Bottom Half 46 of Housing 18:

Bottom half 46 of housing 18 is formed of any suitable size, shape, and design and is configured to hold and support motherboard 24 positioned within hollow interior 48. In the arrangement shown, as one example, bottom half 46 of housing 18 has a generally rectangular shaped bottom 36 and lower portions of front 38, back 40, and sides 42 extending upward from outward edges of bottom 36. In this example arrangement, bottom half 46 includes a number of supports 52 extending upward from bottom 36 of housing 18.

Supports 52:

Supports 52 are formed of any suitable size, shape, and design and are configured to support a bottom surface of motherboard 24 and transfer downward forces from motherboard 24 to bottom 36 of housing 18. In the arrangement shown, as one example, supports 52 are elongated generally rectangular protrusions extending upward from bottom 36 with opposing sidewalls 56 and an upper surface 58. In this example arrangement, supports 52 includes two side supports 62, a front support 64, and a rear support 66 extending around an opening 70 in bottom half 46 of housing 18.

In one or more arrangements, upper surfaces 58 of side supports 62 are configured to operate as lower clamp surfaces to facilitate clamping of a DUT PCB 14 positioned in receiver assembly 20 with motherboard 24. In the arrangement shown, as one example, upper surfaces 58 of side supports 62 have a generally rectangular shape positioned below electrical contacts 264 of the motherboard 24.

In one or more arrangements, one or more supports 52 have a layer of insulating material 74 (not shown) formed on upper surface 58 to avoid making electrical connection with contacts, traces, or other electrical components on lower surface of motherboard 24. In some various different arrangements, such layer of insulating material 74 may be formed using various non-conductive materials including but not limited to, for example, rubber, polymers, glass, ceramics, oxides, natural or synthetic textiles, or any other non-conductive materials. Additionally or alternatively, in some arrangements, upper surface 58 of supports 52 may themselves be formed of non-conductive materials.

Alignment Pins 80:

In one or more arrangements, housing 18 includes a set of alignment pins 80. Alignment pins 80 are formed of any suitable size, shape, and design and are configured to extend through holes 266 in motherboard 24 and DUT PCB 14 to facilitate alignment of electrical contacts 264 of motherboard 24 with electrical contacts 296 of DUT PCB 14 when DUT PCB 14 is held within receiver assembly 20. In the arrangement shown, as one example, alignment pins 80 are elongated generally cylindrical shaped members extending upward from one or more supports 52 of housing 18. In this example arrangement, housing 18 includes six alignment pins 80 configured to be inserted into respective alignment holes 266 in motherboard 24 as well as into holes 312 in DUT PCB 14. However, the arrangements are not so limited. Rather, it is contemplated that in some various different arrangements, housing 18 may include any number of pins 80 to facilitate alignment. In one or more arrangements, as is shown, pins 80 include a subset of larger pins and a subset of smaller pins to ensure that motherboard 24 and DUT PCB 14 are properly oriented relative to each other and housing 18. However, the arrangements are not so limited. Rather, it is contemplated that in some various different arrangements, system 10 may utilize various means or methods to ensure proper orientation and/or alignment of housing 18, motherboard 24, and DUT PCB 14.

Opening 70:

In one or more arrangements, as is shown, bottom half 46 of housing 18 includes an opening 70. Opening 70 is formed of any suitable size, shape, and design and is configured to provide access to a bottom side of DUT PCB 14, for example, to facilitate use of a pedestal 96 beneath the DUT PCB 14. In the arrangement shown, as one example, opening 70 is a generally rectangular shaped opening extending between a front edge 86, a rear edge 88, and opposing side edges 90, which are respectively positioned proximate to front support 64, rear support 66, and side supports 62. In this example arrangement, opening 70 has a lower lip 92 extending inward from a front edge 86, a rear edge 88, and opposing side edges 90. Lip 92 is configured to engage and hold a pedestal 96 within opening 70 to facilitate transfer of force from a bottom side of DUT PCB 14 to a work surface.

However, the arrangements are not so limited. Rather, it is contemplated that in one or more arrangements, opening 70 may be omitted. For instance, in such arrangements, a pedestal 96 may rest on a bottom 36 of bottom half 46 of housing 18.

Top Half 44 of Housing 18:

Top half 44 is formed of any suitable size, shape, and design and is configured to connect with bottom half 46 to form hollow interior 48 and house motherboard 24 and/or other components of test control system 22 therein. In the arrangement shown, as one example, top half 44 of housing 18 has a generally rectangular shaped top 34 and upper portions of front 38, back 40, and sides 42 extending downward from outward edges of top 34. In the arrangement shown, top half 44 of housing 18 includes a receiver assembly 20 formed in top 34.

Receiver Assembly 20:

Receiver assembly 20 is formed of any suitable size, shape, and design and is configured to receive and hold DUT PCB 14 and facilitate electrical connection of DUT PCB 14 with motherboard 24. In the arrangement shown, as one example, receiver assembly 20 includes a window 100 in top 34 and a pair of fastener assemblies 102 positioned proximate to window 100, among other components.

Window 100 is formed of any suitable size, shape, and design and is configured to provide an opening through which DUT PCB 14 may be inserted to facilitate connection of DUT PCB 14 with motherboard 24. In the arrangement shown, as one example, window 100 is a generally rectangular shaped opening extending between an inner forward edge 104, an inner rearward edge 106, and opposing inner side edges 108. In this example arrangement, window 100 is approximately the same size as DUT PCB 14 so as to receive DUT PCB 14 within window 100 with close and tight tolerances. However, the embodiments are not so limited. Rather, it is contemplated that in some various arrangements window 100 may be implemented with different sizes or shapes that are capable of receiving DUT PCB 14 therein.

Fastener assemblies 102 are formed of any suitable size, shape, and design and are configured to secure and hold a DUT PCB 14 positioned in window 100 within receiver assembly 20. In the arrangement shown, as one example, fastener assembles 102 each include a pair of rails 114 connected to top half 44 of housing 18 and a pair of clamps 116 connected thereto, among other components.

Rails 114 are formed of any suitable size, shape, and design and are configured to operably connect clamps 116 with top half 44 of housing 18 and permit clamps 116 to be moved inward to and outward from window 100 when unclamped. In the arrangement shown, as one example, rails 114 are generally rectangular shaped protrusions formed on top 34 of housing 18. In this example arrangement, rails 114 have an inner side 118, an outer side 120, and a top 122 extending along either inner forward edge 104 or inner rearward edge 106 edge between opposing ends 124. In this example arrangement, rails 114 have a recessed channel 126 extending along inner side 118. Recessed channel 126 is configured to receive and guide a connector 188 of clamps 116 within recessed channel 126 to facilitate movement of clamps 116 between an inward position and an outward position.

Clamps 116:

Clamps 116 are formed of any suitable size, shape, and design and are configured to apply force against DUT PCB 14 to facilitate secure connection between DUT PCB 14 and motherboard 24. In the arrangement shown, as one example, clamps 116 include clamp plate assemblies 134, levers 136, handles 138, and lock mechanism 140, among other components.

Clamp Plate Assembles 134:

Clamp plate assembles 134 are formed of any suitable size, shape, and design and are configured to engage and apply a downward force against an upper surface 300 of DUT PCB 14 when clamps 116 are moved to a clamped position and disengage from the DUT PCB 14 when clamps 116 are moved to an unclamped position. In the arrangement shown, clamp plate assemblies 134 each include a top clamp plate 144, a floating clamp plate 146, and bias members 148

(not shown) positioned therebetween. In this example arrangement, top clamp plate 144 has a generally planar rectangular shape extending between a front edge 152, a rear edge 154, and opposing side edges 156. In this example arrangement, floating clamp plate 146 similarly has a generally planar rectangular shape extending between a front edge 160, a rear edge 162, and opposing side edges 164. In this example arrangement, floating clamp plate 146 is connected to top clamp plate 144 by a set of fasteners 168 that extend through holes 170 in floating clamp plate 146 and/or top clamp plate 144. In this example arrangement, fasteners 168 permit floating clamp plate 146 to move upward and downward relative to top clamp plate 144. In one or more arrangements, bias members 148 are positioned between floating clamp plate 146 and top clamp plate 144 and are configured to urge floating clamp plate 146 downwardly away from top clamp plate 144 in absence of an opposing force.

Levers 136:

Levers 136 are formed of any suitable size, shape, and design and are configured to operably connect with rails 114 and with top clamp plate 144 of clamp plate assembly 134 to facilitate movement of clamps 116 between the clamped position and unclamped position. In the arrangement shown, as one example, levers 136 have an elongated generally rectangular shape having an inward side 174, an outward side 176, a top 178 and a bottom 180 extending between an inward end 182 and an outward end 184.

In this example arrangement, levers 136 have connectors 188 positioned at the outward ends 184. Connectors 188 are formed of any suitable size, shape, or design and are configured to facilitate connection of clamps 116 with rails 114. In the arrangement shown, as one example, connectors 188 and posts 190 are positioned on an outward side 176 of each lever 136 at the outward end 184 and are configured to be inserted within recessed channels 126 of rails 114. In this example arrangement, posts 190 are connected to levers 136 by fasteners 192 (e.g., bolts) that extend through holes 194 in levers 136. In this example arrangement, posts 190 allow levers 136 to pivot and move clamps 116 between the clamped and unclamped positions and also permit clamps 116 to be moved laterally between the inward position and the outward position. However, the arrangements are not so limited. Rather, it is contemplated that in some various arrangements, clamps 116 may be connected with rails 114 using various types of connectors which may be connected to levers 136 using various methods and/or means including but not limited to, for example, adhesive bonding, chemical bonding, welding, and/or mechanical attachment means such as frictional fitting, screws, bolts, threading, interlocks, clips, pins, and/or other coupling devices.

In this example arrangement, front edge 152 and a rear edge 154 of top clamp plate 144 of clamp plate assembly 134 are each connected to an inward side 174 of a lever 136 at inward end 182. In this example arrangement, front edge 152 and a rear edge 154 of top clamp plate 144 are pivotally connected with lever 136 proximate to inward end 182 by fasteners 192 that extend through holes 194 in levers 136. The pivoted connection of top clamp plate 144 with lever 136 helps to evenly lower and/or lift clamp late assembly 134 when clamps 116 are moved between clamped and unclamped positions.

Handles 138:

In this example arrangement, each clamp 116 includes a handle 138 connected to and extending between outward ends 184 of levers 136. Handles 138 are formed of any suitable size, shape, and design and are configured to facilitate movement of clamps 116 between clamped and unclamped positions and between inward and outward positions. In the arrangement shown, as one example, handles have an elongated generally rectangular shape having a top 200, a bottom 202, and opposing sides 204, extending between inward side 174 of a lever 136 at outward end 184. However, the arrangements are not so limited. Rather, it is contemplated that handles 138 may be any type of handle including but not limited to cross bars, bows, cups, t-shaped, knobs, and/or any other handle shape.

In this example arrangement, handles 138 are attached to levers 136 by fasteners 192 (e.g., bolts) that extend through holes 194 in levers 136. However, the arrangements are not so limited. Rather, it is contemplated that handles 138 may be connected to levers 136 using various methods and/or means including but not limited to, for example, for example, adhesive bonding, chemical bonding, welding, and/or mechanical attachment means such as frictional fitting, screws, bolts, threading, interlocks, clips, pins, and/or other coupling devices. Alternatively, in some arrangements, handles 138 and levers 136 may be formed together as a single unitary component.

Lock Mechanism 140:

In one or more arrangements, clamps 116 have one or more lock mechanisms 140. Lock mechanisms 140 are formed of any suitable size, shape, and design and are configured to hold clamps 116 in the clamped position (at the inward positions and/or outward position) to facilitate secure clamping of a DUT PCB 14 within window 100 of receiver assembly 20 by clamps 116. In this example arrangement, locks 140 are positioned on handles 138. However, the arrangements are not so limited. Rather, it is contemplated that lock mechanisms 140 may additionally or alternatively be positioned on various other components (e.g., levers 136) to secure clamps 116 in the locked position.

In the arrangement shown, as one example, lock mechanism 140 is a spring loaded latch configured to latch against a recess 222 or strike plate of top half 44 of housing 18 when clamps 116 are moved to the clamped position. In this example arrangement, lock mechanism 140 includes an L-shape member 212 having an upper actuator portion 216 and a lower latch portion 214 and includes a bias member 218 (not shown).

In this example arrangement, L-shaped member 212 is pivotally connected to top half 44 of housing 18 at a corner between an upper actuator portion 216 and lower latch portion 214. In this example arrangement, lower latch portion 214 has a wedge shaped tooth 220 positioned as a lower end of lower latch portion 214. In this example arrangement, tooth 220 is configured to engage recess 222 and prevent outward side 176 of levers 136 from moving upward, thereby maintaining clamps 116 in the clamped position. In this example arrangement, bias member 218 is configured to pivot L-shaped member 212 and move tooth 220 of lower latch portion 214 into recess 222 when clamps 116 are moved to the clamped position. In this example arrangement, downward pressure on the upper actuator portion 216 of a clamp 116 by a user causes L-shaped member 212 to pivot in the opposite direction, thereby moving tooth 220 of lower latch portion 214 out from recess 222 and releasing clamp 116 so clamp 116 may be moved to the unclamped position.

Test Control System 22:

In one or more arrangements, test control system 22 is formed of any suitable size, shape, and design and is configured to facilitate testing of socket 12, DUT PCB 14, and/or DUT 16. In the arrangement shown, as one example, system 10 includes a set of electrical testing components 230 arranged on motherboard 24 within hollow interior 48 of housing 18. In one or more arrangements, electrical testing components 230 on motherboard 24 are configured to operate as a hardware interface to facilitate communication of test signals and/or data with DUT PCB 14 and a testing application 234 (e.g. operating on an external computing device 232 communicatively connected to motherboard 24). In the arrangement shown, as one example, housing 18 includes an opening 228 to facilitate passing of a communication channel (e.g., a data cable) between motherboard 24 and an external computing device 232.

While test control system 22 may be primarily shown and/or described as including electrical testing components 230 arranged on motherboard 24 and a testing application 234 implemented on an external computing device 232, the embodiments are not so limited. Rather, it is contemplated that in some various arrangements, test control system 22 may include multiple external computing devices 232 communicatively connected to motherboard 24 or, alternatively, may be a self-contained system housed completely within housing 18 or even entirely on motherboard 24.

In some various arrangements, test control system 22 may be configured to perform various different tests to evaluate electrical and/or performance properties of a DUT 16, test socket 12, and/or DUT PCB 14. In some various arrangements, such test may include but are not limited to, for example: contact resistance (CRES) testing, curve testing, failure analysis, logical evaluation, performance gradings (e.g., clock speed ratings), and/or any other means or method for testing or evaluating circuits and/or semiconductors.

Motherboard 24:

Motherboard 24 is formed of any suitable size, shape, and design and is configured to electrically connect and hold together components, circuits, and electrical contacts that form the electrical testing components 230. In the arrangement shown, as one example, motherboard 24 is what is known as a printed circuit board. In the arrangement shown, as one example, motherboard 24 is a generally flat and planar member that is generally square or rectangular in shape when viewed from above or below, having an upper surface 238 and a lower surface 240 extending between an outer front edge 242, an outer rear edge 244, and outer sided edges 246. However, any other shape is hereby contemplated for use. In this example, arrangement, motherboard 24 also includes a center opening 250 to facilitate access to DUT PCB 14 (e.g., to permit DUT PCB 14 to be supported by pedestal 96). In this example arrangement, opening 250 has a generally rectangular shape extending between an inner front edge 252, an inner rear edge 254, and inner side edges 256.

In the arrangement shown, motherboard 24 includes a rectangular cutaway 260 in a corner of the motherboard to provide room to accommodate a power switch 262 positioned in the front 38 of housing 18. In one or more arrangements, opening 250 of motherboard 24 has semi-circular cutaways 258 in one or more edges (e.g., inner front edge 252, an inner rear edge 254, and/or inner side edges 256) to provide finger holds to facilitate insertion and/or removal of motherboard 24 and/or DUT PCB 14. In one example arrangement shown, for instance, motherboard 24 has semi-circular cutaways 258 formed in the inner front edge 252 and inner rear edge 254. However, it is contemplated that in some various arrangements, semi-circular cutaways 258 may additionally or alternatively be formed at other positions on motherboard 24.

In the arrangement shown, as one example, motherboard 24 has electrical contacts 264 on its upper surface 238 to facilitate connection with DUT PCB 14. In this example arrangement, electrical contacts 264 are positioned between inner side edges 256 and outer side edges 246. However, the arrangements are not so limited. Rather, it is contemplated that in some various arrangements, electrical contacts 264 may be positioned in various additional or alternative locations on motherboard 24 to facilitate connection with DUT PCB 14. In one or more arrangements, electrical contacts 264 are vias that extend from the upper surface 238 through the layers of material that form motherboard 24 to lower surface 240 of the motherboard 24. These electrical contacts 264 are configured to facilitate electrical connection of electrical testing components 230 on the motherboard 24 with DUT PCB 14.

External Computing Device 232:

External computing device 232 is formed of any suitable size, shape, and design and is configured to provide a testing application 234 for control and performance of various operations related to testing of a DUT 16 and/or socket 12 using motherboard 24. In one or more arrangements, for example, such external computing device 232 includes a circuit specifically configured and arranged to carry out one or more of these or related operations/activities. For example, external computing device 232 may include discreet logic circuits or programmable logic circuits configured for implementing these operations/activities, as shown in the figures, and/or described in the specification. In certain embodiments, such a programmable circuit may include one or more programmable integrated circuits (e.g., field programmable gate arrays and/or programmable ICs). Additionally or alternatively, such a programmable circuit may include one or more processing circuits (e.g., a computer, microcontroller, system-on-chip, smart phone, server, and/or cloud computing resources). For instance, computer processing circuits may be programmed to execute a set (or sets) of instructions (and/or configuration data). The instructions (and/or configuration data) can be in the form of firmware or software stored in and accessible from a memory (circuit). Certain embodiments are directed to a computer program product (e.g., nonvolatile memory device), which includes a machine or computer-readable medium having stored thereon instructions, which may be executed by a computer (or other electronic device) to perform these operations/activities.

In one or more arrangements, external computing device 232 includes a processing circuit 270 and memory 272 having software code 274 or instructions that facilitates the processing and/or display of information, and a communication circuit 276, among other components. Processing circuit 270 may be any computing device that receives and processes information and outputs commands according to software code 274 or instructions stored in memory 272. Memory 272 may be any form of information storage such as flash memory, ram memory, dram memory, a hard drive, or any other form of memory. Processing circuit 270 and memory 272 may be formed of a single combined unit. Alternatively, processing circuit 270 and memory 272 may be formed of separate but electrically connected components. Alternatively, processing circuit 270 and memory 272 may each be formed of multiple separate but electrically connected components.

Software code 274 or instructions is any form of information or rules that direct processing circuit 270 how to receive, interpret, and respond to information to operate as described herein. Software code 274 or instructions is stored in memory 272 and accessible to processing circuit 270. As an illustrative example, in one or more arrangements, software code 274 or instructions may configure processing circuit 270 to interact with users and/or perform various processes in response to user input to provide the testing application 234.

Communication circuit 276 is formed of any suitable size, shape, or design and is configured to facilitate communication with motherboard 24. In one or more arrangements, as one example, communication circuit 276 includes a transceiver circuit and an antenna. A transceiver is any electronic device that facilitates two-way communication, that is, the delivery of information between external computing device 232 and other components of the system 10. An antenna is any device that is configured to receive wireless signals from over-the-air communication and/or transmit wireless signals in over-the-air communication. In an example arrangement, a transceiver of communication circuit 276 is connected with a respective antenna, which may be a monopole antenna, dipole antenna, a loop antenna, a fractal antenna, or any other form of an antenna, to facilitate transmission and/or reception of signals in the form of electromagnetic radio frequencies. Additionally or alternatively, the transceiver of communication circuit 276 may be configured to communicate over a wired communication channel.

In various arrangements, communication circuit 276 may be configured to communicate with motherboard 24 and/or various other components of system 10 using various wired and/or wireless communication technologies and protocols over various networks and/or mediums including but not limited to, for example, Serial Data Interface 12 (SDI-12), UART, Serial Peripheral Interface, PCI/PCIe, Serial ATA, ARM Advanced Microcontroller Bus Architecture (AMBA), USB, Firewire, RFID, Near Field Communication (NFC), infrared and optical communication, 802.3/Ethernet, 802.11/WIFI, Wi-Max, Bluetooth, Bluetooth low energy, UltraWideband (UWB), 802.15.4/ZigBee, ZWave, GSM/EDGE, UMTS/HSPA+/HSDPA, CDMA, LTE, 4G, 5G, FM/VHF/UHF networks, and/or any other communication protocol, technology or network.

DUT PCB 14:

In one or more arrangements, system 10 is configured for testing various DUTs 16 and/or sockets 12. Each DUT 16 requires a unique DUT PCB 14 to route signals from motherboard 24 to pins of the DUT 16 for testing. DUT PCB 14 is formed of any suitable size, shape, and design and is configured to be inserted into and held within receiver assembly 20 with electrical contacts 296 of DUT PCB 14 electrically connected with electrical contact 264 of motherboard 24.

In the arrangement shown, as one example, DUT PCB 14 has a rectangular shape when viewed from above and has a generally planar upper surface 300 and lower surface 302 extending between a front edge 304, a rear edge 306, and opposing side edges 308. In this example arrangement, DUT PCB 14 is sized and shaped to fit within window 100 of receiver assembly 20. In this example arrangement, DUT PCB 14 includes holes 312 for alignment with motherboard 24 by alignment pins 80.

In one or more arrangement, a set of electrical contacts 296 are positioned on a lower surface 302 of DUT PCB 14. In this example arrangement, the electrical contacts 296 are positioned to align with electrical contacts 264 of motherboard 24 when DUT PCB 14 is inserted into receiver assembly 20. In the arrangement shown, the position and number of electrical contacts 296 on DUT PCB 14 is substantially identical as that of electrical contacts 264 of motherboard 24. However, the arrangements are not so limited. Rather, it is contemplated that in some arrangements, DUT PCB 14 may include a smaller set of electrical contacts 296. For example, for some DUTs 16, only a subset of electrical contacts 264 of motherboard 24 may be needed for testing the DUT 16. In such case, DUT PCB 14 may include a smaller number of electrical contacts 296 that are needed to connect to the subset of electrical contacts 264 of motherboard 24 that are used for testing.

Sockets 12:

In one or more arrangements, one or more sockets 12 are attached to DUT PCB 14 to receive and facilitate connection with a DUT 16, such as a semiconductor chip, a reference chip, a shorting device, a reference standard, or the like. Sockets 12 are formed of any suitable size, shape, and design and are configured to mechanically and electrically connect with circuitry on upper surface 238 of motherboard 24 as well as mechanically and electrically connect and hold a DUT 16 therein. DUT PCB 14 has one socket 12 positioned on upper surface 238 of motherboard 24. In the arrangement shown, socket 12 includes a raised peripheral edge 320 which surrounds and provides a border to a field of electrical contacts 322 positioned approximately at the center of the socket 12. In this example arrangement, socket 12 is affixed to the upper surface 300 of DUT PCB 14 such that when DUT PCB 14 is placed in receiver assembly 20 on top of testing system 10, socket 12 is positioned within receiver assembly 20 and is accessible from above testing system 10.

In this example arrangement, socket 12 includes a plurality of electrical contacts 322 positioned at its center within a raised peripheral edge 320 of socket 12, which surrounds the electrical contacts 322. The electrical contacts 322 of socket 12 electrically connect to electrical traces or leads that extend through DUT PCB 14 and electrically connect to the electrical contacts 296 positioned on the lower surface 302 of DUT PCB 14. In this way, the DUT PCB 14 serves to electrically connect the socket 12, and any DUT 16 positioned within the socket 12, to the electrical testing components 230 on motherboards 24. As such, when DUT PCB 14 is placed within the socket 12 on top of testing system 10, the electrical contact points 322 of socket 12 electrically contact through DUT PCB 14 to the electrical testing components 230 on motherboard 24.

In a manufacturing environment, DUT 16 is often a sophisticated semiconductor chip that provides sophisticated functionality and capabilities in a tremendously compact size. However, in a testing environment, wherein socket 12 is being tested, DUT 16 is often a shorting device or a reference standard. Often, when DUT 16 is a shorting device, it is a solid metallic or plated metallic device that has a generally well-known resistance which is suitable for testing purposes. Often, DUT 16 is a reference standard that mimics a certain condition or provides an anticipated result that is useful for testing purposes.

DUT 16 often has a very high density of electrical contacts on its lower surface that electrically connect the DUT 16 to the device in which the DUT 16 is installed (such as a computer's motherboard, or the like). Accordingly, to test all of the contacts DUT 16 has on its lower surface, socket 12 has a corresponding number of electrical contacts 322 in its upper surface. Testing system 10 is configured to perform complex and sophisticated testing procedures on DUT 16 which require sophisticated and complex electrical testing components 230 (as are described herein). DUT PCB 14 serves to connect the dense electrical contacts on the bottom surface of DUT 16 (connected to the electrical contact points 322 in the upper surface of socket 12) with the electrical testing components 230 of the system 10 through a network of electrical traces embedded within the DUT PCB 14. As such, through its network of internal electrical leads (or traces) DUT PCB 14 expands the dense electrical leads in the bottom surface of DUT 16 outward and to the sides of DUT PCB 14 so as to provide room for the electrical testing components 230 needed to perform the electrical tests to ensure DUT 16 is a conforming device and within spec. As such, through its network or electrical traces, DUT PCB 14 serves to expand the surface area of the electrical contacts 322 in socket 12 outward so as to provide room for the needed electrical testing components 230 of system 10. While system 10 houses the electrical testing components 230 in a very dense arrangement, the surface area required for the electrical testing components 230 is substantially greater than the surface area of the electrical contacts 296 on the DUT PCB 14.

Capsules 26:

In the arrangement shown, as one example, electrical testing components 230 include a set of capsules 26. Capsules 26 are formed of any suitable size, shape, and design and are configured to facilitate the electrical connection between electrical contacts 264 of motherboard 24 and electrical contacts 296 of DUT PCB 14 while facilitating the easy installation and removal of DUT PCB 14 into and out from receiver assembly 20.

In the arrangement shown, as one example, capsules 26 include a plurality of compressible electrical contacts 330 in its upward facing surface that extend upward therefrom and/or in its downward facing surface that extend downward therefrom. Alternatively, the downward facing surface of capsules 26 include contact fields or sockets that are used to make electrical connections (instead of spring loaded or compressible electrical contacts 330). These compressible electrical contacts 330 are electrically connected to electrical contacts 264 of motherboard 24 at their lower end and are electrically connected to electrical contacts 296 of DUT PCB 14 at their upper end, as is further described herein. In this way, capsules 26 serve as a secure electrical interconnect between motherboard 24 and DUT PCB 14.

In the arrangement shown, as one example, capsules 26 have an elongated generally rectangular shape with a generally planar upper surface 336 and lower surface 338 extending between opposing sides 340 from a front end 342 to a rear end 344. In the arrangement shown, as one example, capsules 26 are formed of a pair of opposing halves 332 that connect together in generally flush engagement with one another along a centrally extending seam line between the two halves 332 when they are assembled. In the arrangement shown, as one example, halves 332 are held together by a plurality of fasteners 334, however any other manner of connection is hereby contemplated for use.

In the arrangement shown, as one example, compressible electrical contacts 330 are what is known in the industry as pogo pins. A Pogo pin is a device used in electronics to establish a (usually temporary) connection between two printed circuit boards. Named by analogy with the pogo stick toy, the pogo pin usually takes the form of a slender cylinder containing two sharp, spring-loaded pins. Pressed between two electronic circuits, the sharp points at each end of the pogo pin make secure contacts with the two circuits and thereby connect them together. In the arrangement shown, as one example, compressible electrical contacts 330 extend out of both the upper surface 336 as well as the lower surface 338 of capsule 26. In this way, the upper end of compressible electrical contacts 330 of capsules 26 are configured to electrically connect to the electrical contacts 296 of DUT PCB 14, and the lower end of compressible electrical contacts 330 of capsules 26 are configured to electrically connect to the electrical contacts 264 of motherboard 24 while the compressible and forgiving nature of compressible electrical contacts 330 accommodates any variation between components.

In one or more arrangements, capsules 26 are attached to upper surface 238 of motherboard 24 using fasteners 346 that extend through capsules 26 as well as through motherboard 24. The lower end of fasteners 346 thread into supports 52 of bottom half 46 of housing 18 and in doing so, as fasteners 346 are tightened, fasteners 346 pull capsules 26 into tight engagement with motherboard 24 and fasteners 346 pull motherboard 24 into tight engagement with supports 52.

In the arrangement shown, capsules 26 are installed across the upper surface 238 of motherboard 24 in approximate parallel spaced relation with each capsule 26 positioned above side supports 62 and electrical contacts 264 of motherboard 24. However, the embodiments are not so limited. Rather, it is contemplated that in some various arrangements capsules 26 may be attached to motherboard 24 using various methods and/or means including but not limited to, for example, adhesive bonding, chemical bonding, welding, and/or mechanical attachment means such as frictional fitting, screws, bolts, threading, interlocks, clips, pins, and/or other coupling devices.

Assembly and Operation:

To assemble the testing system 10, a DUT specific DUT PCB 14 and optionally DUT specific pedestal 96 are selected for the particular socket 12 and/or DUT 16 that is being manufactured and therefore needs to be tested.

The DUT PCB 14 and pedestal 96 will typically be different or custom for each different DUT 14 and/or socket 12. This is because each DUT 16 has a unique array of electrical contacts in its lower surface which require a specific socket 12 with electrical contacts 322 corresponding to the unique array of electrical contacts for the particular DUT 16. Therefore, a specific DUT PCB 14 is also required to facilitate electrical connection with electrical contacts 322 of socket 12 for each DUT 16. While the electrical contacts 298 in the upper surface 300 of the DUT PCB 14 are unique for each DUT 16 and/or socket 12, the electrical contacts 296 in the lower surface 302 of DUT PCB 14 remain consistent. As such, countless DUTs 16 and/or sockets 12 may be tested using the same testing system 10 by simply removing and replacing the DUT PCB 14. This allows for removal and replacement of the DUT PCB 14 to be done with ease, which is an objective the system 10 accomplishes.

Once selected, DUT PCB 14 and/or pedestal 96 are installed through window 100 of receiver assembly 20 in top 34 of housing 18. To facilitate installation, clamps 116 are moved to their outward positions to the sides of window 100 and locked into place. If clamps 116 are locked into place at the inward positions, each clamp is first unlocked by pressing downward on the upper actuator portion 216 of each lock mechanism 140 to release the clamps 116. Handles 138 of clamps 116 are then moved upward to place clamps 116 in the unclamped positions. Handles 138 are then moved outward to move clamps 116 to their outward positions. With clamps 116 in their outward positions, handles 138 are moved downward to the clamped position. Once in the clamped position, lock mechanisms 140 engage recesses 222 in housing 18 to lock clamps 116 into the outward positions.

If used, pedestal 96 is installed prior to DUT PCB 14 and is placed through window 100 and though opening 250 of motherboard 24 into opening 70 in bottom half 46 of housing 18 so edges of DUT PCB 14 rest on lip 92. Typically, although not always, pedestal 96 extends downward though opening 70 in bottom half 46 of housing 18 to a work surface on which system 10 is placed so pedestal 96 may transfer downward forces to such worksurface.

After pedestal 96 is installed, DUT PCB 14 installed into receiver assembly of system 10 by lowering DUT PCB 14 through window 100 and aligning holes 312 of DUT PCB 14 with the alignment pins 80 that extend upward from bottom half 46 of housing 18 and through holes 266 in motherboard 24. Once properly aligned with alignment pins 80, the lower surface 302 of DUT PCB 14 is lowered until electrical contacts 296 on the lower surface 302 contact compressible electrical contacts 330 that protrude upward from the upper surface 336 of capsules 26. In this position, the electrical contacts 296 in the lower surface 302 of DUT PCB 14 physically engage the compressible electrical contacts 330 of the capsules 26, which are electrically connected with electrical contacts 264 of motherboard 24.

Once DUT PCB 14 is lowered onto capsules 26, clamps 116 are moved to the inward and clamped positions to secure DUT PCB 14 in place. This is accomplished by unlocking each clamp 116 by pressing downward on the upper actuator portion 216 of each lock mechanism 140. Handles 138 of clamps 116 are then moved upward to place clamps 116 in the unclamped positions. Handles 138 are then moved inward to move clamps 116 to their inward positions. With clamps 116 in their inward positions, handles 138 are moved downward to the clamped position. As handles 138 are moved downward, compressible electrical contacts 330 of capsules 26 are compressed between electrical contacts 296 of DUT PCB 14 and electrical contacts 264 of motherboard 24 to provide a secure electrical connection. Once in the clamped position, lock mechanisms 140 engage recesses 222 in housing 18 to lock clamps 116 into the clamped inward positions. Once clamps 116 are locked into the clamped inward positions, DUT PCB 14 is secured within receiver assembly 20 of system 10 and electrically connected with motherboard 24.

If a socket 12 is not already installed onto DUT PCB 14, the socket 12 may be installed by precisely aligning the socket 12 with a set of electrical contacts 298 in the upper surface 300 of DUT PCB 14 such that the compressible electrical contacts 330 that extend outward from the lower surface of socket 12 engage the electrical contacts 298 in the upper surface 300 of DUT PCB 14. Once properly aligned, socket 12 is affixed to DUT PCB 14 using fasteners 326. As socket 12 is tightened against DUT PCB 14, the compressible electrical contacts 330 that extend outward from the lower surface of socket 12 engage the electrical contacts 298 in the upper surface 300 of DUT PCB 14, and slightly compress, and form a strong and durable electrical connection with DUT PCB 14. DUT PCB 14 facilitates the electrical connection between socket 12 on its upper surface 300, with capsules 26 and electrical testing components 230 on its lower surface 302. Alternatively, socket 12 may be installed onto DUT PCB 14 before DUT PCB 14 is installed into receiver assembly 20 of system 10.

Once socket 12 is installed onto DUT PCB 14, DUT 16 is installed into socket 12. DUT 16 is installed into socket 12 by precisely aligning DUT 16 with the socket 12 and lowering the DUT 16 into the socket 12 until the electrical contacts in the lower surface of the DUT 16 engage the compressible electrical contacts 330 of socket 12. In one arrangement, DUT 16 may be pressed down into socket 12 using a stepper or other component to ensure a strong and durable electrical connection between DUT 16 and socket 12.

Once the system 10 is fully assembled, and DUT 16 is in place within socket 12, DUT 16 and/or socket 12 may be tested by system 10 by transmitting electrical signals from the electrical testing components 230 through DUT PCB 14, through socket 12 and through DUT 16.

More specifically, the DUT PCB 14 sends and receives electrical signals through the electrical contacts 322 of socket 12. These signals then transmit through motherboard 24 and into the capsules 26. More specifically, the electrical signals pass through the compressible electrical contacts 330 of capsules 26 and into the contact fields of DUT PCB 14. These electrical signals travel through the DUT PCB 14 through a series of electrical traces within the layers of the DUT PCB 14 and into the socket 12. These electrical signals then pass through the socket 12 and into the DUT 16. These electrical signals travel through the DUT 16 and back to the DUT PCB 14 through the same or a similar but reverse path; and the process repeats. The electrical testing components 230 measure these signals and how the socket 12 and/or DUT 16 act/react and thereby determine the operational characteristics of socket 12 and/or DUT 16 and determine whether socket 12 and/or DUT 16 is conforming or nonconforming.

Once the test is complete, socket 12 and/or DUT 16 is removed and another socket 12 and/or DUT 16 is installed, and the process is repeated. Alternatively, the DUT PCB 14 is removed and replaced with a different DUT PCB 14 so as to facilitate testing another but different socket 12 and/or DUT 16. In this way, various sockets 12 and/or DUTs 16 may be tested using system 10 by simply removing and replacing DUT PCB 14 which can quickly and easily be done.

Low Clearance and Reduced Footprint:

One of the substantial benefits provided by one or more embodiments of the system 10 is that the upper surface 300 of DUT PCB 14 is accessible from any direction with very little clearance required to avoid upwardly protruding elements of the system. In addition, no additional elements are installed onto the upper surface 300 of DUT PCB 14 to lock the DUT PCB 14 into receiver assembly 20. The low clearance means that there is no significant obstruction and as such the system 10 can be used with practically any other equipment or machinery, such as pick and place machines, robots, handlers, environmental chambers, gantries, or the like or any other device, equipment or system. In the arrangement shown, as one example, only socket 12 is attached to the upper surface 300 of DUT PCB 14.

Another substantial benefit provided by one or more embodiments of the system 10 is that system 10 has a small footprint requiring very little space in comparison to previous testing systems, particularly with reference to vertical height of system 10. This allows for greater flexibility of the system 10 and more opportunities to efficiently use other equipment or machinery, such as pick and place machines, robots, handlers, environmental chambers, gantries, or any other device, equipment, or system, which may have limited maneuverability.

From the above discussion, it will be appreciated that an electronic testing system and method of use is presented that improves upon the state of the art. Specifically, one or more arrangements of an electronic testing system are presented: that quickly convert between configurations for testing different electrical interconnects and/or DUTs; that easily convert between configurations for testing different electrical interconnects and/or DUTs; that are easy to use; that provide accurate testing for electrical interconnects and/or DUTs; that can be used with a wide variety of electrical interconnects and/or DUTs; that are relatively inexpensive; that have a long useful life; that have a small footprint; that minimizes the amount of space required to test a variety of electrical interconnects and/or DUTs; that minimize the capital cost for testing equipment for testing a variety of electrical interconnects and/or DUTs; that provide for quick removal of and replacement of DUT PCBs having electrical interconnects thereon; that are high quality; that are durable; that can be used with a wide variety of other testing equipment; and/or that can be used with any socket and/or DUTs, among countless other advantages and improvements.

It will be appreciated by those skilled in the art that other various modifications could be made to the device without parting from the spirit and scope of this disclosure. All such modifications and changes fall within the scope of the claims and are intended to be covered thereby.

The invention claimed is:

1. A testing system, comprising:
a housing;
the housing forming a hollow interior;
a motherboard positioned within the hollow interior of the housing;
the motherboard having a first set of electrical contacts;
a receiver assembly operably connected to the housing;
the receiver assembly configured to receive and hold a device under test printed circuit board (DUT PCB);
the DUT PCB having an upper surface and a lower surface;
the DUT PCB having a second set of electrical contacts;
a socket;
the socket electrically connected to the DUT PCB;
the socket configured to receive a device under test (DUT);
wherein when the DUT PCB is held within the receiver assembly, the first set of electrical contacts of the motherboard are electrically connected to the second set of electrical contacts of the DUT PCB;
wherein the receiver assembly includes a pair of fastener assemblies;
wherein the pair of fastener assemblies each include a clamping plate assembly operably connected to a handle;
wherein the pair of fastener assemblies are laterally movable between an inward position and an outward position;
wherein when the pair of fastener assemblies are in the inward position, the pair of fastener assemblies are positioned over the receiver assembly and are configured to hold the DUT PCB within the receiver assembly;
wherein when the pair of fastener assemblies are in the outward position, the pair of fastener assemblies are positioned to the side of the receiver assembly, thereby permitting the DUT PCB to be inserted into or removed from the receiver assembly;
wherein when the handle is raised, the clamping plate assembly is raised to an unclamped position;
wherein when the handle is lowered, the clamping plate assembly is lowered to a clamped position;
wherein when in the clamped position, the clamping plate assembly places a downward force on the DUT PCB.

2. The system of claim 1, wherein the pair of fastener assemblies are clamps;
wherein the clamps are configured to move between the clamped position and the unclamped position;
wherein when in the clamped position, the clamps apply the downward force to the DUT PCB;
wherein when in the unclamped position, the clamps disengage from the DUT PCB.

3. The system of claim 1, wherein the pair of fastener assemblies are clamps;
wherein the clamps are configured to move between the clamped position and the unclamped position;
wherein when in the clamped position, the clamps apply the downward force to the DUT PCB;
wherein when in the unclamped position, the clamps disengage from the DUT PCB;
wherein the clamps include a locking mechanism configured to lock the clamps in the clamped position.

4. The system of claim 1, wherein the pair of fastener assemblies are clamps;
wherein the clamps are configured to move between the clamped position and the unclamped position;
wherein when in the clamped position, the clamps apply the downward force to the DUT PCB;
wherein when in the unclamped position, the clamps disengage from the DUT PCB;
wherein the clamps include a locking mechanism configured to lock the clamps in the clamped position;
wherein the locking mechanism includes a spring loaded latch.

5. The system of claim 1, wherein the pair of fastener assemblies are clamps;
wherein the clamps include a lever extending between an inner end and an outer end;
wherein the inner end of the lever is pivotally connected to the housing;
wherein the a clamping plate assembly is operably connected to the inner end of the lever;
wherein the -handle is operably connected to the outer end of the lever;
wherein when the handle is lowered, the clamping plate assembly is lowered and engages the DUT PCB;
wherein when the handle is raised, the clamping plate assembly disengages from the DUT PCB.

6. The system of claim 1, further comprising one or more capsules positioned on top of the first set of electrical contacts;
wherein the one or more capsules include a set of compressible interconnects;
wherein when the DUT PCB is held within the receiver assembly, the set of compressible interconnects electrically connect the second set of electrical contacts with the first set of electrical contacts.

7. The system of claim 1, further comprising one or more capsules positioned between the DUT PCB and the motherboard, wherein the one or more capsules facilitate electrical connection between the first set of electrical contacts of the motherboard and the second set of electrical contacts of the DUT PCB.

8. The system of claim 1, wherein the motherboard includes an opening that is positioned below the DUT PCB when the DUT PCB is held within the receiver assembly.

9. The system of claim 1, wherein the motherboard includes an opening that is positioned below the DUT PCB when the DUT PCB is held within the receiver assembly;
wherein the housing includes an opening positioned below the opening of the motherboard;
wherein the opening in the housing is configured to receive and hold a pedestal;

wherein the pedestal is configured to contact and support the lower surface of the DUT PCB.

10. The system of claim 1, wherein the motherboard is communicatively connected with an external computing device;

wherein the external computing device is configured to provide a testing application for configuration and control of testing performed by the motherboard.

11. The system of claim 1, further comprising a plurality of alignment pins connected to the housing; wherein the plurality of alignment pins are configured to engage the motherboard and the DUT PCB so as to cause the first set of electrical contacts to be aligned with the second set of electrical contacts.

12. A testing system for flexibly testing different devices, comprising:

a housing;

the housing forming a hollow interior;

a first circuit board positioned within the hollow interior;

the first circuit board having test circuitry for testing electrical connections of a device under test (DUT);

the first circuit board having a first set of electrical contacts electrically connected to the test circuitry;

a receiver assembly operably connected to the housing;

the receiver assembly configured to receive and hold a second circuit board;

the second circuit board having a socket configured to receive and hold the DUT;

the second circuit board having a second set of electrical contacts;

wherein when the DUT is held within the socket the DUT is electrically connected to the second set of electrical contacts;

wherein when the second circuit board is held within the receiver assembly, the second set of electrical contacts are electrically connected with the first set of electrical contacts, thereby electrically connecting the test circuitry with the DUT for testing, wherein the receiver assembly includes at least one clamp;

wherein the at least one clamp includes a clamping plate assembly operably connected to a handle;

wherein when the handle is raised, the clamping plate assembly is raised to an unclamped position;

wherein when the handle is lowered, the clamping plate assembly is lowered to a clamped position;

wherein when in the clamped position, the clamping plate assembly places a downward force on the second circuit board.

13. The system of claim 12, wherein the receiver assembly includes a pair of handles including the handle;

the pair of handles configured to move laterally between an inward position and an outward position;

wherein when the pair of handles are in the inward position, the receiver assembly is configured to prevent the second circuit board from being removed from the receiver assembly;

wherein when the pair of handles are in the outward position, the receiver assembly is configured to permit the second circuit board to be removed from the receiver assembly.

14. The system of claim 12, t wherein the at least one clamp includes a locking mechanism configured to lock the at least one clamp in the clamped position.

15. The system of claim 12, wherein the at least one clamp includes a locking mechanism configured to lock the clamps in the clamped position;

wherein the locking mechanism includes a spring loaded latch.

16. A testing system for flexibly testing different devices, comprising:

a housing;

the housing forming a hollow interior;

a first circuit board positioned within the hollow interior;

the first circuit board having test circuitry for testing electrical connections of a device under test (DUT);

the first circuit board having a first set of electrical contacts electrically connected to the test circuitry;

a receiver assembly operably connected to the housing;

the receiver assembly configured to receive and hold a second circuit board;

the second circuit board having a socket configured to receive and hold the DUT;

the second circuit board having a second set of electrical contacts;

wherein when the DUT is held within the socket the DUT is electrically connected to the second set of electrical contacts;

wherein when the second circuit board is held within the receiver assembly, the second set of electrical contacts are electrically connected with the first set of electrical contacts, thereby electrically connecting the test circuitry with the DUT for testing;

wherein the receiver assembly includes at least one clamp;

wherein the at least one clamp includes a lever extending between an inner end and an outer end;

wherein the at least one clamp includes a clamping plate assembly operably connected to the inner end of the lever;

wherein the at least one clamp includes a handle operably connected to the outer end of the lever;

wherein when the handle is raised, the lever raises the clamping plate assembly to an unclamped position;

wherein when the handle is lowered, the lever lowers the clamping plate assembly to a clamped position;

wherein when in the clamped position, the clamping plate assembly places a downward force on the second circuit board.

17. A testing system for flexibly testing different devices, comprising:

a housing;

the housing forming a hollow interior;

a first circuit board positioned within the hollow interior;

the first circuit board having test circuitry for testing electrical connections of a device under test (DUT);

the first circuit board having a first set of electrical contacts electrically connected to the test circuitry;

a receiver assembly operably connected to the housing;

the receiver assembly configured to receive and hold a second circuit board;

the second circuit board having a socket configured to receive and hold the DUT; the second circuit board having a second set of electrical contacts;

wherein when the DUT is held within the socket the DUT is electrically connected to the second set of electrical contacts;

wherein when the second circuit board is held within the receiver assembly, the second set of electrical contacts are electrically connected with the first set of electrical contacts, thereby electrically connecting the test circuitry with the DUT for testing;

wherein the receiver assembly includes a window formed in a top of the housing;

wherein the receiver assembly includes a pair of clamps positioned on opposing sides of the window;

wherein the pair of clamps are movable laterally between an inward position and an outward position;

wherein when the pair of clamps are in the inward position the clamps cover a portion of the window;

wherein when the pair of clamps are in the outward position, the window is uncovered.

18. The system of claim 12, further comprising one or more capsules positioned on top of the first set of electrical contacts;

wherein the one or more capsules include a set of compressible interconnects;

wherein when the second circuit board is held within the receiver assembly, the set of compressible interconnects electrically connect the second set of electrical contacts with the first set of electrical contacts.

19. The system of claim 12, wherein the first circuit board includes an opening that is positioned below the second circuit board when the second circuit board is held within the receiver assembly.

20. The system of claim 12, wherein the first circuit board includes an opening that is positioned below the second circuit board when the second circuit board is held within the receiver assembly;

wherein a bottom half of the housing includes an opening positioned below the opening of the first circuit board;

wherein the opening in the housing is configured to receive and hold a pedestal;

wherein the pedestal is configured to contact and support a lower surface of the second circuit board.

21. The system of claim 12, wherein the first circuit board is communicatively connected with an external computing device;

wherein the external computing device is configured to provide a testing application for configuration and control of testing performed by the first circuit board.

22. The system of claim 12, further comprising a plurality of alignment pins connected to the housing; wherein the plurality of alignment pins are configured to engage the first circuit board and the second circuit board so as to cause the first set of electrical contacts to be aligned with the second set of electrical contacts.

23. The system of claim 12, wherein the test circuitry is configured to test the socket.

24. A flat form factor and flexible PCB testing system, comprising:

a housing;

the housing forming a hollow interior;

a first circuit board positioned within the hollow interior;

the first circuit board having test circuitry for testing electrical connections of a device under test (DUT);

a receiver assembly operably connected to the housing;

the receiver assembly configured to receive and hold a second circuit board;

the second circuit board having a socket configured to receive and hold the DUT;

wherein when the second circuit board is held within the receiver assembly, the second circuit board electrically connects the test circuitry of the first circuit board with the DUT for testing, wherein the receiver assembly includes at least one clamp;

wherein the at least one clamp includes a clamping plate assembly operably connected to a handle;

wherein when the handle is raised, the clamping plate assembly is raised to an unclamped position;

wherein when the handle is lowered, the clamping plate assembly is lowered to a clamped position;

wherein when in the clamped position, the clamping plate assembly places a downward force on the second circuit board.

25. The system of claim 24, wherein the test circuitry has a layout extending in a set of planes that are parallel to one another.

26. The system of claim 24, wherein the test circuitry has a single PCB layout.

27. The system of claim 24, wherein the test circuitry has a lay flat configuration on the first circuit board.

28. The system of claim 24, wherein the housing has a generally planar rectangular shape extending horizontally between a front edge, a back edge, and opposing side edges; wherein the first circuit board extends in a generally horizontal manner within the housing, wherein the test circuitry includes a plurality of semiconductor chips that are attached to the first circuit board in a generally horizontal manner.

29. The system of claim 24, wherein the test circuitry includes a plurality of semiconductor chips that are attached to a surface of the first circuit board and extend in a generally horizontal manner within the housing.

30. The system of claim 24, wherein the test circuitry includes a plurality of semiconductor chips that are attached to a planar upper surface of the first circuit board and extend in a generally horizontal manner within the housing.

31. The system of claim 24, wherein the test circuitry includes a plurality of semiconductor chips that are attached to a planar lower surface of the first circuit board and extend in a generally horizontal manner within the housing.

32. The system of claim 24, wherein the test circuitry includes a plurality of semiconductor chips that are attached to a planar upper surface of the first circuit board, and a planar lower surface of the first circuit board, and extend in a generally horizontal manner within the housing.

33. A flexible PCB testing system, comprising:

a housing;

the housing forming a hollow interior;

a first circuit board positioned within the hollow interior;

the first circuit board having test circuitry for testing electrical connections of a device under test (DUT);

a receiver assembly operably connected to the housing;

the receiver assembly configured to receive and hold a second circuit board;

the second circuit board having a socket configured to receive and hold the DUT;

wherein when the second circuit board is held within the receiver assembly, the second circuit board electrically connects the test circuitry of the first circuit board with the DUT for testing;

wherein the test circuitry is configured to evaluate a set of performance parameters of the DUT; wherein the receiver assembly includes at least one clamp, wherein the at least one clamp includes a clamping plate assembly operably connected to a handle;

wherein when the handle is raised, the clamping plate assembly is raised to an unclamped position;

wherein when the handle is lowered, the clamping plate assembly is lowered to a clamped position;

wherein when in the clamped position, the clamping plate assembly places a downward force on the second circuit board.

34. The system of claim 33, wherein in evaluating the set of performance parameters, the test circuitry of the first circuit board is configured to perform contact resistance (CRES) testing.

35. The system of claim 33, wherein in evaluating the set of performance parameters, the test circuitry of the first circuit board is configured to perform curve tracing analysis of the DUT.

36. The system of claim 33, wherein in evaluating the set of performance parameters, the test circuitry of the first circuit board is configured to perform contact resistance (CRES) testing of the DUT and curve tracing analysis of the DUT.

* * * * *